United States Patent
Yang et al.

(10) Patent No.: US 11,996,820 B2
(45) Date of Patent: May 28, 2024

(54) FIFTH-GENERATION (5G)-FOCUSED PIEZOELECTRIC RESONATORS AND FILTERS

(71) Applicant: Board of Trustees of the University of Illinois, Urbana, IL (US)

(72) Inventors: Yansong Yang, Urbana, IL (US);
Ruochen Lu, Champaign, IL (US);
Liuqing Gao, Champaign, IL (US);
Songbin Gong, Champaign, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 528 days.

(21) Appl. No.: 17/248,402

(22) Filed: Jan. 22, 2021

(65) Prior Publication Data

US 2021/0234528 A1    Jul. 29, 2021

Related U.S. Application Data

(60) Provisional application No. 62/965,365, filed on Jan. 24, 2020.

(51) Int. Cl.
  *H03H 9/02*   (2006.01)
  *H03H 3/02*   (2006.01)
  (Continued)

(52) U.S. Cl.
  CPC .......... *H03H 9/02228* (2013.01); *H03H 3/02* (2013.01); *H03H 9/02031* (2013.01);
  (Continued)

(58) Field of Classification Search
  CPC .. H03H 9/02228; H03H 3/02; H03H 9/02031; H03H 9/132; H03H 9/173;
  (Continued)

(56) References Cited

U.S. PATENT DOCUMENTS 7,049,908 B2 * 5/2006 Takata ................. H03H 9/6483
                                                333/194
9,525,398 B1 * 12/2016 Olsson ............... H03H 9/02228
(Continued)

OTHER PUBLICATIONS

"IEEE Standard on Piezoelectricity," ANSI/IEEE Std 176-1987, 74 pages, 1988.
(Continued)

*Primary Examiner* — Rakesh B Patel
*Assistant Examiner* — Jorge L Salazar, Jr.
(74) *Attorney, Agent, or Firm* — Lowenstein Sandler LLP

(57) ABSTRACT

A piezoelectric thin film suspended above a carrier substrate is adapted to propagate an acoustic wave in a Lamb mode excited by a component of an electric field that is oriented in a longitudinal direction along a length of the piezoelectric thin film. A first signal electrode is located on the piezoelectric thin film and oriented in a transverse direction perpendicular to the longitudinal direction. A first ground electrode is located on the piezoelectric thin film and oriented in the transverse direction. The first ground electrode is separated from the first signal electrode by a gap in which the acoustic wave resonates. A first release window and a second release window are located at a first end and a second end of the piezoelectric thin film, respectively. Intermittent release windows are located beyond distal ends of the first signal electrode and the first ground electrode.

24 Claims, 41 Drawing Sheets

(51) Int. Cl.
  *H03H 9/13* (2006.01)
  *H03H 9/17* (2006.01)
  *H03H 9/54* (2006.01)
  *H03H 9/56* (2006.01)
(52) U.S. Cl.
  CPC ............ *H03H 9/132* (2013.01); *H03H 9/173* (2013.01); *H03H 9/176* (2013.01); *H03H 9/542* (2013.01); *H03H 9/562* (2013.01); *H03H 9/564* (2013.01); *H03H 9/568* (2013.01); *H03H 2003/021* (2013.01)
(58) Field of Classification Search
  CPC ........ H03H 9/176; H03H 9/542; H03H 9/562; H03H 9/564; H03H 9/568; H03H 2003/021; H03H 9/02015
  USPC .......................................... 333/133, 193–196
  See application file for complete search history.

(56) References Cited

U.S. PATENT DOCUMENTS

| | | | |
|---|---|---|---|
| 9,882,547 B2 * | 1/2018 | Kando | H03H 9/6433 |
| 2014/0009032 A1 * | 1/2014 | Takahashi | H03H 9/02559 29/25.35 |
| 2018/0358948 A1 * | 12/2018 | Gong | H03H 9/568 |

OTHER PUBLICATIONS

"5G New Radio Solutions: Revolutionary Applications Here Sooner Than You Think," Skyworks Solutions, Inc., San Irvine, CA, USA. [Online]. Available: www.skyworksinc.com. [Accessed: Nov. 5, 2019], 16 pages, 2018.
Aigner et al., "SAW Filters for 5G Bands", in 2018 IEEE Int. Electron Devices Meeting (IEDM) 18-332, p. 14.5.1-14.5.4, 2018.
Akiyama et al., "Enhancement of piezoelectric response in scandium aluminum nitride alloy thin films prepared by dual reactive cosputtering", Advanced Materials, vol. 21, No. 5, pp. 593-596, 2009.
Allen et al., "Hybrid Bandpass-Absorptive-Bandstop Magnetically Coupled Acoustic-Wave-Lumped-Element-Resonator Filters", IEEE Microwave and Wireless Components Letters, vol. 28. No. 7, pp. 582-584, Jul. 2018.
Anand et al., "Joint scheduling of URLLC and eMBB traffic in 5G wireless networks", in IEEE/ACM Transactions on Networking, vol. 28, No. 2, pp. 477-490, Apr. 2020.
Bousquet et al., "Single-mode high frequency LiNbO3 Film Bulk Acoustic Resonator", in IEEE International Ultrasonics Symposium, pp. 84-87, Oct. 6-9, 2019.
Burgemeister, E., "Thermal conductivity of natural diamond between 320 and 450 K", Physica B+C, vol. 93, No. 2, pp. 165-179, 1978.
Chen et al., "High-Q X Band Aluminum Nitride Combined Overtone Resonators", in 2019 IEEE Int. Freq. Control Symposium Proceedings, 3 pages, 2019.
Colombo et al., "Investigation of 20% scandium-doped aluminum nitride films for MEMS laterally vibrating resonators", in IEEE International Ultrasonics Symposium, 4 pages, 2017.
Frenne, "NR: The new 5G radio access technology", IEEE Communications Standard Magazine, vol. 1, No. 4, pp. 24-30, Dec. 2017.
Gong et al., "Design and analysis of lithium-niobate-based high electromechanical coupling RF-MEMS resonators for wideband filtering", Microwave Theory and Techniques, IEEE Transactions on, vol. 61, No. 1, pp. 403-414, Jan. 2013.
Gong et al., "Figure-of-merit enhancement for laterally vibrating lithium niobate mems resonators", IEEE Transactions on Electron Devices, vol. 60, No. 11, pp. 3888-3894, Nov. 2013.
Gong et al., "Monolithic Multi-Frequency Wideband RF Filters Using Two-Port Laterally Vibrating Lithium Niobate MEMS Resonators", Journal of Microelectromechanical Systems, vol. 23, No. 5, pp. 1188-1197, Oct. 2014.

Hara et al., "A study of the thin film bulk acoustic resonator filters in several ten GHz band", in Proceedings—IEEE Ultrasonics Symposium, pp. 851-854, 2009.
Hashimoto, K., "RF bulk acoustic wave filters for communications", Norwood, Ma: Artech House, 292 pages, 2009.
Hashimoto, K., "Surface acoustic wave devices in telecommunications: modelling and simulation", Springer Science & Business Media, 339 pages, 2013.
Ikata et al., "Development of low-loss band-pass filters using SAW resonators for portable telephones", in IEEE 1992 Ultrasonic Symposium Proceedings, pp. 111-115, 1992.
Iwamoto et al., "Transverse modes in IHP SAW resonator and their suppression method", in 2018 IEEE International Ultrasonics Symposium (IUS), pp. 1-4: 2018.
Kadota et al., "High-frequency lamb wave device composed of MEMS structure using LiNbO3 thin film and air gap", EEE Transactions of Ultrasonics, Ferroelectrics and Frequency Control, vol. 57, No. 11, pp. 2564-2571, Nov. 2010.
Kadota et al., "LiNbO3 thin film for A1 mode of Lamb wave resonators", Physica Status Solidi Applications and Material Science, vol. 208, No. 5, pp. 1068-1071, Mar. 15, 2011.
Kadota et al., "Suprious-Free, Near-Zero-TCF Hetero Acoustic Layer (HAL) SAW Resonators Using LiTaO3 Thin Plate on Quartz", in IEEE International Ultrasonics Symposium, 4 pages, 2018.
Kadota et al., "Wideband acoustic wave resonators composed of hetero acoustic layer structure", Japanese Journal of Applied Physics, vol. 57, No. 07LD12, 5 pages, 2018.
Kamitani et al., "The elastic constants of silicon carbide: A Brillouin-scattering study of 4H and 6H SiC single crystals", Journal of applied physics, vol. 82, No. 6, pp. 3152-3154, 1997.
Kimura et al., "3.5 GHz longitudinal leaky surface acoustic wave resonator using a multilayered waveguide structure for high acoustic energy confinement", Japanese Journal of Applied Physics, vol. 57, No. 07LD15, 5 pages, 2018.
Kimura et al., "A High Velocity and Wideband SAW on a Thin LiNbO3 Plate Bonded on a Si Substrate in the SHF Range", in IEEE International Ultrasonics Symposium, pp. 1239-1248, Oct. 6-9, 2019.
Kimura et al., "Comparative Study of Acoustic Wave Devices Using Thin Piezoelectric Plates in the 3-5-GHz Range", EEE Transactions on Microwave Theory and Techniques, vol. 67, No. 3, pp. 915-921, Mar. 3, 2019.
Kimura et al., "High Q SAW resonator using upper-electrodes on grooved-electrodes in LiTaO3", in Microwave Symposium Digest (MTT), 2010 IEEE MTT-S International, pp. 1740-1743, 2010.
Kuznetsova et al., "Investigation of acoustic waves in thin plates of lithium niobate and lithium tantalate", IEEE transactions on ultrasonics, ferroelectrics, and frequency control, vol. 48, No. 1, pp. 322-328, Jan. 2001.
Ladani et al., "A novel X-band bandpass filter using substrate integrated waveguide resonators" in 2010 IEEE Asia-Pacific Conference on Applied Electromagnetics, APACE 2010- Proceedings, pp. 1-5, 2010.
Lee et al., "Spectrum for 5G: Global status, challenges, and enabling technologies", IEEE Communications Magazine, vol. 56, No. 3, pp. 12-18, Mar. 2018.
Levy et al., "Fabrication of single-crystal lithium niobate films by crystal ion slicing", Applied Physics Letters, vol. 73, No. 16, pp. 2293-2295, Oct. 19, 1998.
Lu et al., "Accurate Extraction of Large Electromechanical Coupling in Piezoelectric MEMS Resonators", Journal of Microelectromechanical Systems, vol. 28, No. 2, pp. 209-218, Apr. 2019.
Lu et al., "Gigahertz Low-Loss and Wide-Band S0 Mode Lithium Niobate Acoustic Delay Lines", IEEE Transactions on Ultrasonics Ferroelectrics and Frequency Control, vol. 66, No. 8, pp. 1373-1386, Aug. 2019.
Lu et al., "RF Filters with Periodic Passbands for Sparse Fourier Transform-based Spectrum Sensing", Journal of Microelectromechanical Systems, vol. 27, No. 5, pp. 931-944, Oct. 2018.
Lu et al., "Wideband Bandpass Filters With SAW-Filter-Like Selectivity Using Chip SAW Resonators", IEEE Transactions on Microwave Theory and Techniques, vol. 62, No. 1, pp. 28-36, Jan. 2014.

(56) References Cited

OTHER PUBLICATIONS

Matsumura et al., "Multi-band RF filter integrating different modes of AlN resonator by CMOS compatible process", in 2009 IEEE International Ultrasonics Symposium, pp. 2141-2144, 2009.

McSkimin et al., "Elastic moduli of diamond as a function of pressure and temperature", Journal of Applied Physics, vol. 43, No. 7, pp. 2944-2948, Jan. 26, 1972.

Menedez et al., "Closed-Form Expressions for the Design of Ladder-Type FBAR Filters", IEEE Microwave and Wireless Components Letters, vol. 16, No. 12, pp. 657-659, Dec. 2006.

Miek et al., "Additive Manufacturing of Symmetrical X-Band Waveguide Filters for Wide-Band Applications based on Extracted Pole Filter Design", in 2019 IEEE MTT-S International Microwave Workshop Series on Advanced Materials and Processes for RF and THz Applications (IMWS-AMP), pp. 13-15, Jul. 16-18, 2019.

Miranda et al., "Design and development of ferroelectric tunable microwave components for ku- and k-band satellite communication systems", IEEE Trans. Microw. Theory Tech., 8 pages, 2000.

Nakao et al., "Smaller surface acoustic wave duplexer for US personal communication service having good temperature characteristics", Japanese Journal of Applied Physics, vol. 46, No. 7B, pp. 4760-4763, 2007.

Olsson et al., "A high electromechanical coupling coefficient SH0 Lamb wave lithium niobate micromechanical resonator and a method for fabrication", Sensors Actuators A: Physical, vol. 209, pp. 183-190, Jan. 2014.

Park et al., "A 10 GHz Single-Crystalline Scandium-Doped Aluminum Nitride Lamb-Wave Resonator", in Transducers, pp. 450-453, Jun. 23-27, 2019.

Parkvall et al., "5G Spectrum", Public Policy Position, pp. 1-18, Nov. 2016.

Plessky et al., "5 GHz laterally-excited bulk-wave resonators (XBARs) based on thin platelets of Lithium Niobate ( XBARs ) based on thin platelets of lithium niobate", Electronic Letters, vol. 55, No. 2, pp. 98-100, Nov. 23, 2018.

Popovski et al., "5G Wireless Network Slicing for eMBB, URLLC, and mMTC: A Communication-Theoretic View", IEEE Access, vol. 6, pp. 55765-55779, 2018.

Psychogiou et al., "Hybrid Acoustic-Wave-Lumped-Element Resonators (AWLRs) for High-Q Bandpass Filters With Quasi-Elliptic Frequency Response", IEEE Transactuibs on Microwave Theory Techniques, vol. 63, No. 7, pp. 2233-2244, Jul. 2015.

Qualcomm Technologies, "Spectrum for 4G and 5G", No. 4155039, pp. 1-15, Jul. 2017.

Rinaldi et al., "Super-High-Frequency Two-Port AlN Contour-Mode Resonators for RF Applications", IEEE Transactions on Ultrasonics, Ferroelectrics, and Frequency Control, vol. 57, No. 1, pp. 38-45, Jan. 2010.

Ruby et al., "Method of extracting unloaded q applied across different resonator technologies", in Proceedings—IEEE Ultrasonics Symposium, pp. 1815-1818, 2008.

Ruby, R., "A snapshot in time: The future in filters for cell phones", IEEE Microwave Magazine, vol. 16, No. 7, pp. 46-59, Aug. 2015.

Song et al., "Elimination of Spurious Modes in SH0 Lithium Niobate Laterally Vibrating Resonators", IEEE Electron Device Letters, vol. 36, No. 11, pp. 1198-1201, Nov. 2015.

Takai et al., "High-performance SAW resonator on new multilayered substrate using LiTaO3 crystal", IEEE transactions on ultrasonics, ferroelectrics, and frequency control, vol. 64, No. 9, pp. 1382-1389, Sep. 2017.

Takai et al., "I.H.P. Saw technology and its application to microacoustic components (Invited)", in IEEE International Ultrasonics Symposium, IUS, 8 pages, 2017.

Turner et al., "5 GHz Band n79 wideband microacoustic filter using thin lithium niobate membrane", Electronics Letters, vol. 55, No. 17, pp. 942-944, Aug. 22, 2019.

Jeda et al., "Development of an X-Band Filter Using Air-Gap-Type Film Bulk Acoustic Resonators", Japanese Journal of Applied Physics, vol. 47, No. 5, pp. 4007-4010, May 2008.

Us, C., "LTE Systems Overview: Overview of the LTE Standard Targets for LTE", LTE Encyclopedia, 5 pages, Oct. 8, 2018.

Wang et al., "High $kt^2$ Q multifrequency lithium niobate resonators", in 2013 IEEE 26th Int. Conf. on Micro Electro Mechanical Systems (MEMS), pp. 165-168, Jan. 20-24, 2013.

Yang et al., "1.7 GHZ Y-Cut Lithium Niobate MEMS Resonators with FoM of 336 and fQ of $9.15 \times 10^{12}$", in 2018 IEEE/MTT-S International Microwave Symposium-IMS, pp. 563-566, 2018.

Yang et al., "10-60-GHz Electromechanical Resonators Using Thin-Film Lithium Niobate", IEEE Transactions on Microwave Theory and Techniques, vol. 68, No. 12, pp. 5211-5220, Dec. 2020.

Yang et al., "4.5 GHz Lithium Niobate MEMS Filters with 10% Fractional Bandwidth for 5G Front-ends", Journal of Microelectromechanical Systems, vol. 28, No. 4, pp. 575-577, Aug. 2019.

Yang et al., "5 GHz lithium niobate MEMS resonators with high FoM of 153", in Micro Electro Mechanical Systems (MEMS), 2017 IEEE 30th International Conference, pp. 942-945, Jan. 22-26, 2017.

Yang et al., "A 1.65 GHz Lithium Niobate A1 Resonator with Electromechanical Coupling of 14% and Q of 3112", in 2019 IEEE International Conference on MEMS, pp. 875-878, Jan. 27-31, 2019.

Yang et al., "A C-band Lithium Niobate MEMS Filter with 10% Fractional Bandwidth for 5G Front-ends", in IEEE International Ultrasonics Symposium, pp. 1981-1984, Oct. 6-9, 2019.

Yang et al., "Advancing Lithium Niobate Based Thin Film Devices for 5G Front-Ends", in 2019 IEEE MTT-S International Microwave Symposium (IMS), pp. 881-884, 2019.

Yang et al., "An X-band Lithium Niobate Acoustic RITE Filter with FBW of 3.45% and IL of 2.7dB", in 2020 IEEE/MTT-S International Microwave Symposium (IMS), pp. 249-252, 2020.

Yang et al., "Scaling Acoustic Filters Towards 5G", in 2018 IEEE International Electron Devices Meeting (IEDM), pp. 1-4, 2018.

Yang et al., "Toward Ka Band Acoustics: Lithium Niobate Asymmetrical Mode Piezoelectric MEMS Resonators", in 2018 IEEE International Frequency Control Symposium, IFCS, pp. 1-5, 2018.

Yokoyama et al., "Highly piezoelectric co-doped AlN thin films for wideband FBAR applications", IEEE Transactions on Ultrasonics, Ferroelectrics, and Frequency Control, vol. 62, No. 6, pp. 1007-1015, Jun. 2015.

Zhang et al., "Transverse mode spurious resonance suppression in Lamb wave MEMS resonators: theory, modeling, and experiment", IEEE Transactions on electron devices, vol. 62, No. 9, pp. 3034-3041, Sep. 2015.

Zhang et al., "A high performance C-band FBAR filter", Asia-Pacific Microwave Conference Proceedings, APMC, pp. 923-926, 2013.

Zuo et al., "Hybrid Filter Design for 5G using IPD and Acoustic Technologies", in 2019 IEEE International Ultrasonics Symposium, pp. 1-4, Oct. 6-9, 2019.

Chatras et al., "Modeling and design of SAW resonators and filters for integration in a UMTS transmitter in Modeling and Measurement Methods for Acoustic Waves and for Acoustic Microdevices", IntechOpen, 33 pages, 2013.

Psychogiou et al., "SAW-based bandpass filters with flat in-band group delay and enhanced fractional bandwidth", in 2017 IEEE MTT-S International Microwave Workshop Series on Advanced Materials and Processes for RF and THz Applications (IMWS-AMP), pp. 1-3, Sep. 20-22, 2017.

Ruby et al., "Positioning FBAR technology in the frequency and timing domain", IEEE Transactions on Ultrasonics, Ferroelectrics, and Frequency Control, vol. 59, No. 3, pp. 334-345, Mar. 2012.

Shen et al., "452 MHz Bandwidth, High Rejection 5.6 Ghz UNII XBAW Coexistence Filters Using Doped AlN-on-Silicon", in IEEE International Electron Devices Meeting, pp. 1-4, 2019.

Weis et al., "Lithium niobate: summary of physical properties and crystal structure", Applied Physics A, vol. 37, No. 4, pp. 191-203, 1985.

Lu et al., "5-GHz Antisymmetric Mode Acoustic Delay Lines in Lithium Niobate Thin Film", IEEE Transactions on Microwave Theory and Techniques, vol. 68, No. 2, pp. 573-589, Feb. 2020.

Gao et al., "Boosting Qs of AlN resonators by redefining acoustic boundaries", in 2019 IEEE International Conference on MEMS, 2019, pp. 1-4.

(56) References Cited

OTHER PUBLICATIONS

Pastureaud et al., "High-frequency surface acoustic waves excited on thin-oriented LiNbO3 single-crystal layers transferred onto silicon", IEEE transactions on ultrasonics, ferroelectrics, and frequency control, vol. 54, No. 4, pp. 870-876, 2007.

Cassella et al., "Aluminum Nitride Cross-Sectional Lame Mode Resonators", Journal of Microelectromechanical Systems, vol. 25, No. 2, pp. 275-285, Apr. 2016.

* cited by examiner

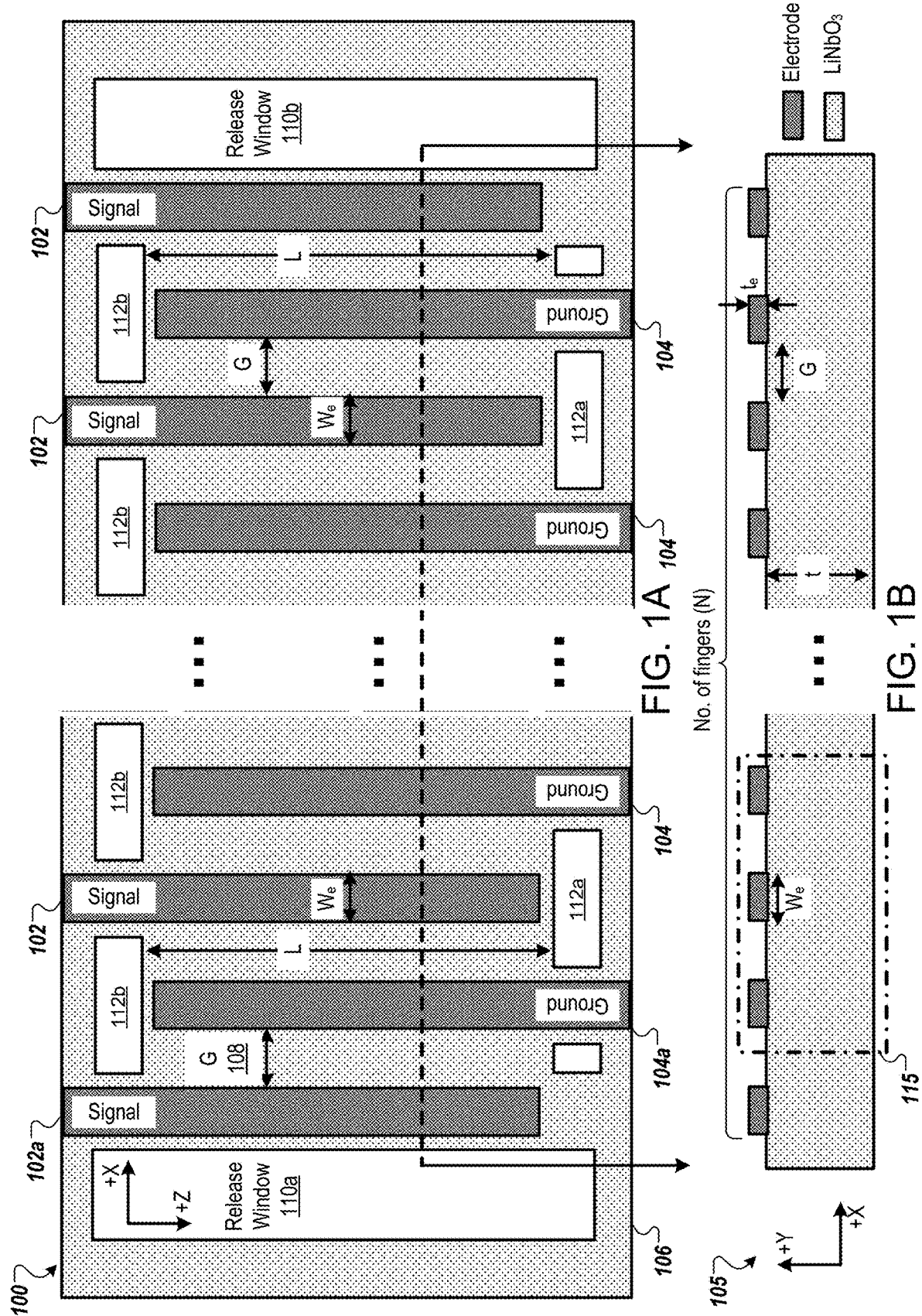

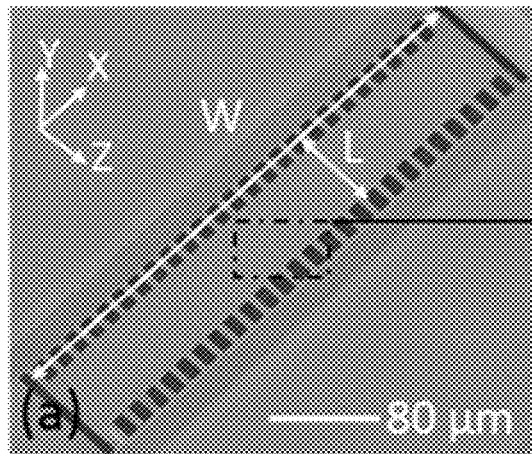 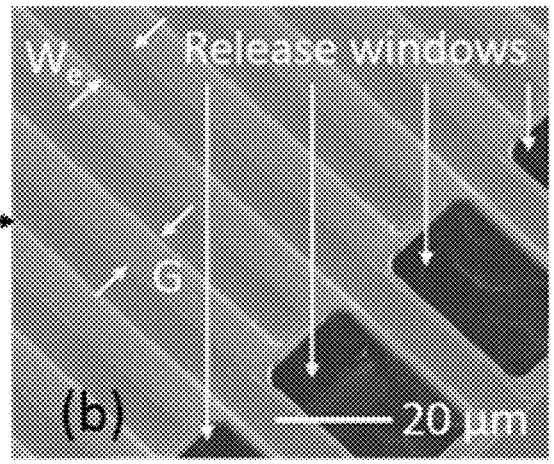
FIG. 7A  FIG. 7B
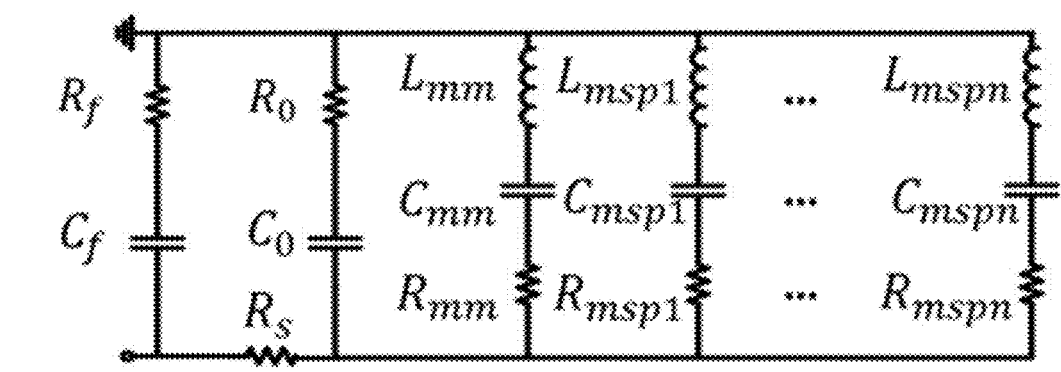
FIG. 8

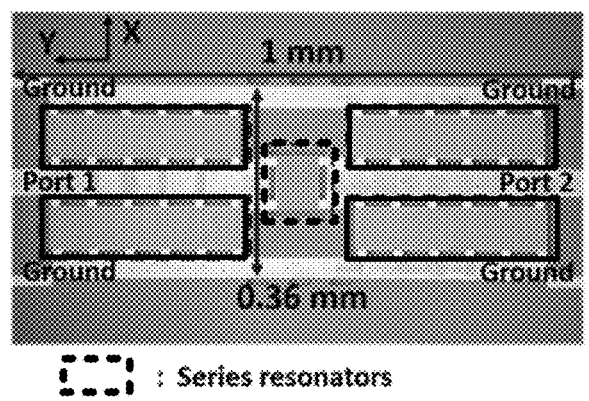
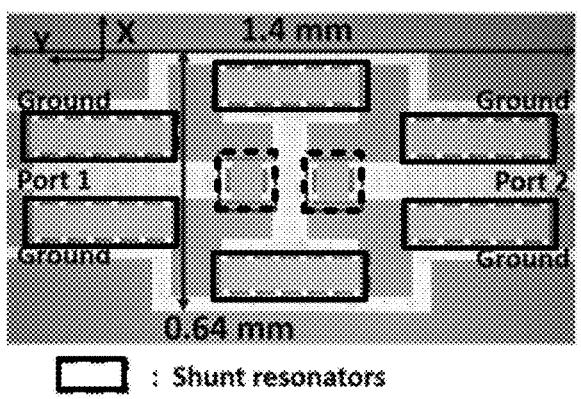
FIG. 15A                FIG. 15B
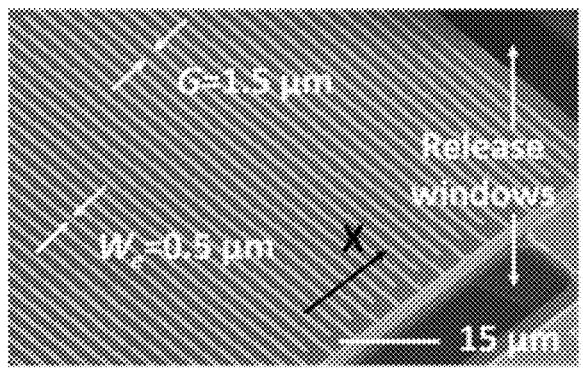
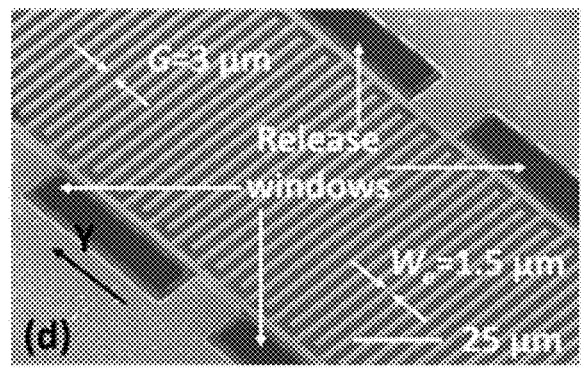
FIG. 15C                FIG. 15D

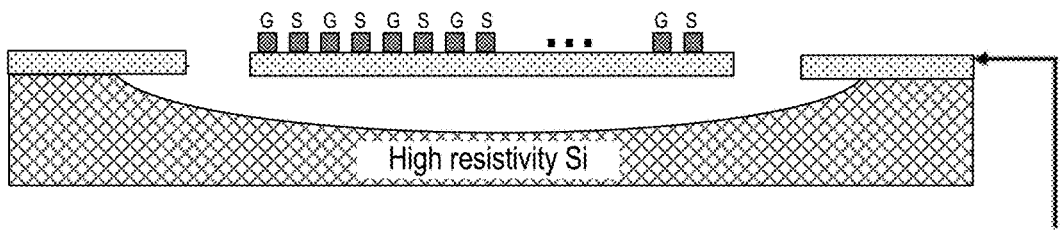
FIG. 18A
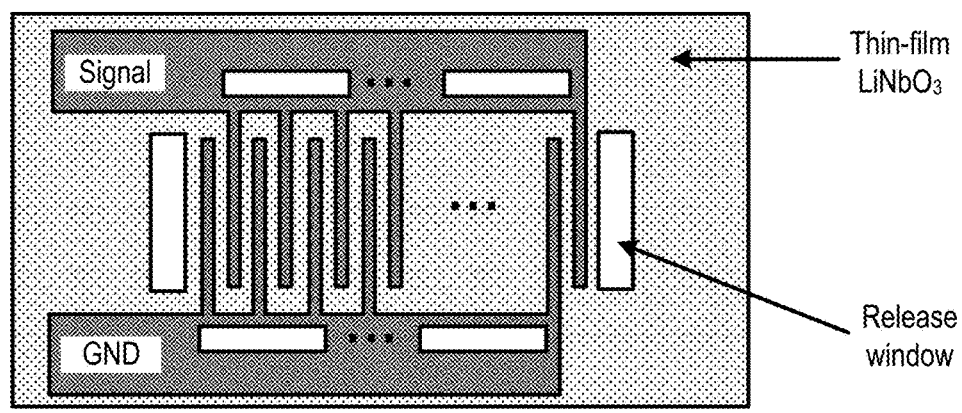
FIG. 18B
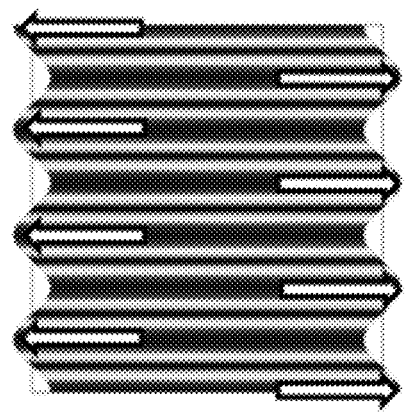
FIG. 18C

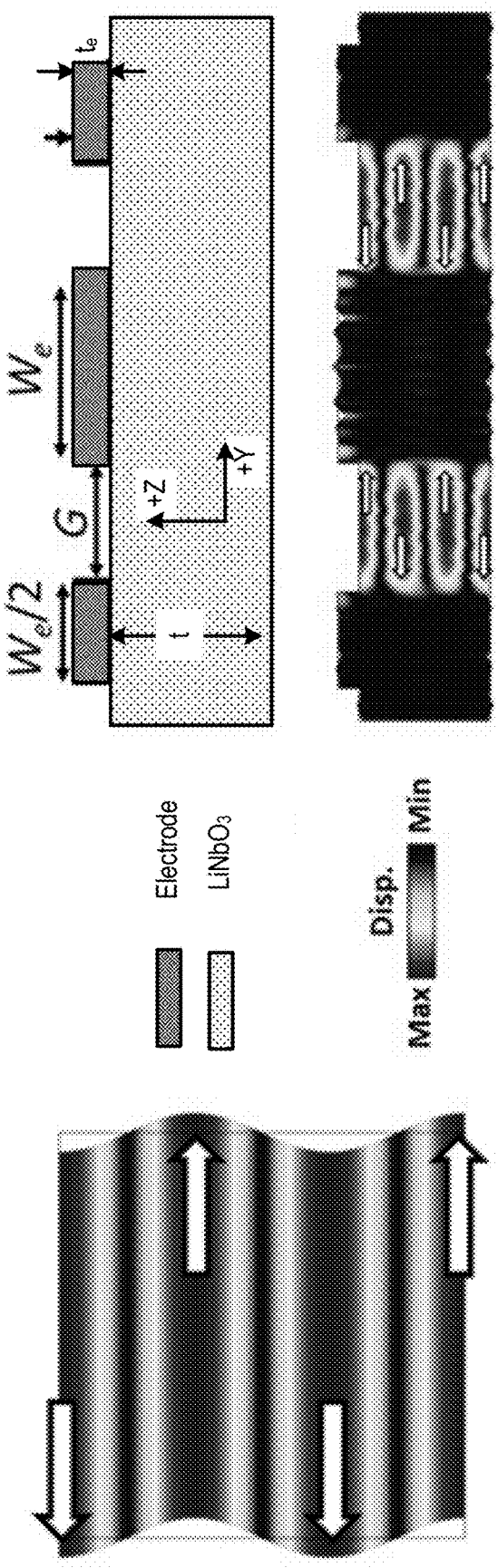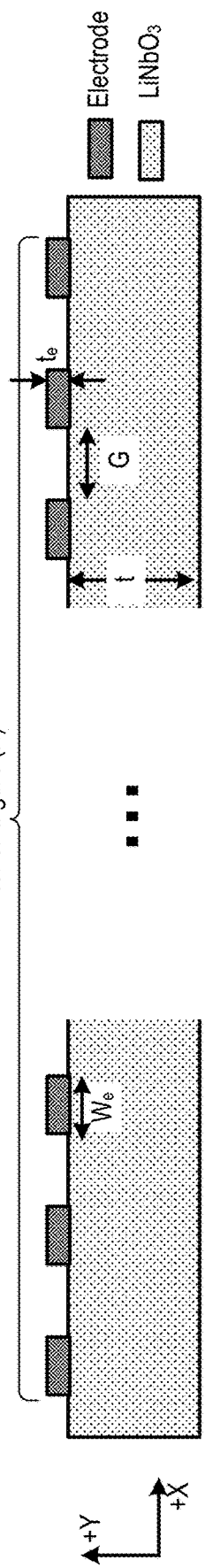
FIG. 23A
FIG. 23B
FIG. 23C

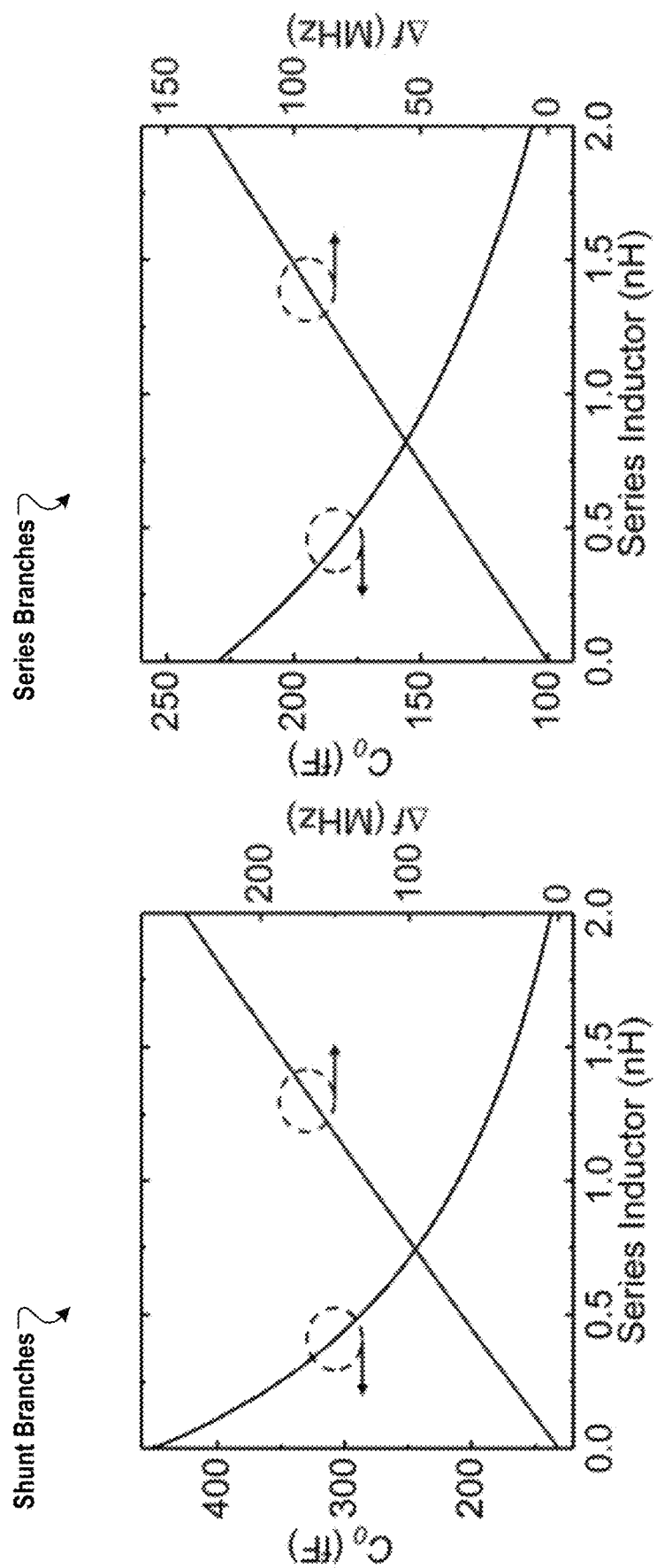

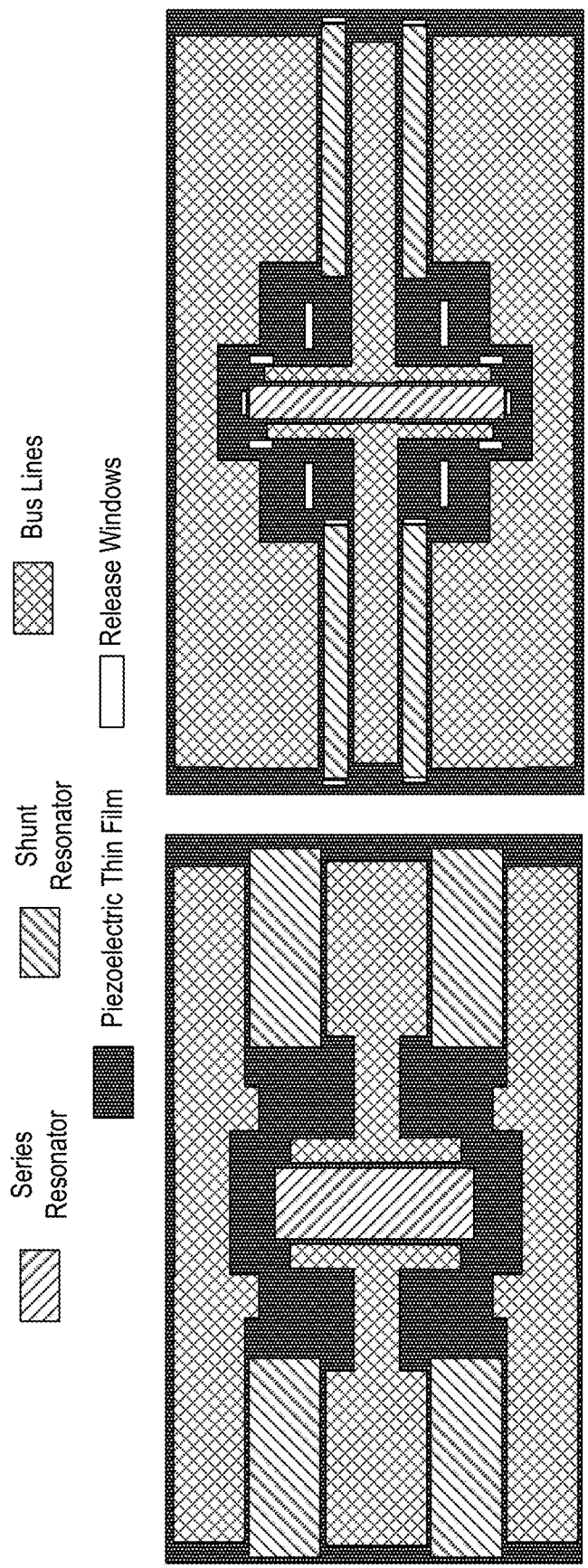

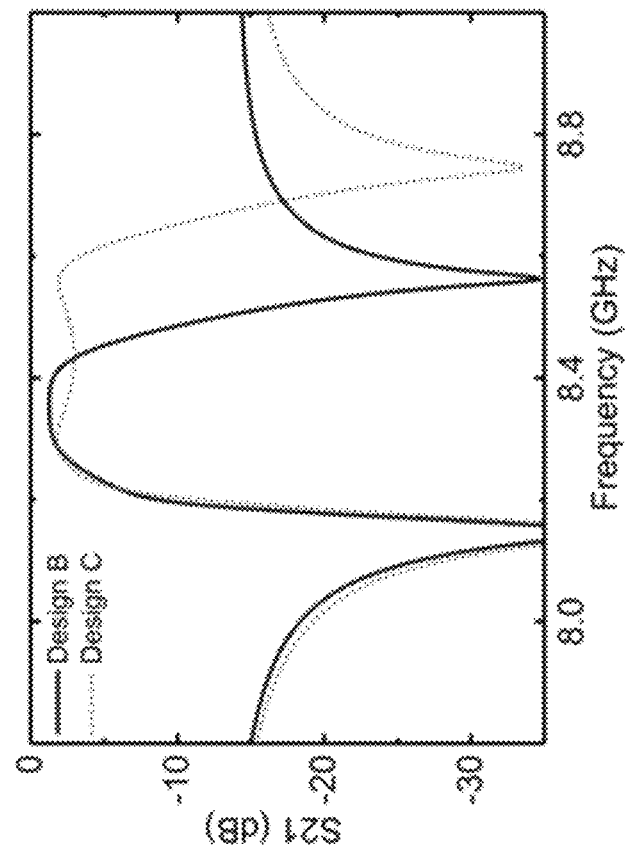
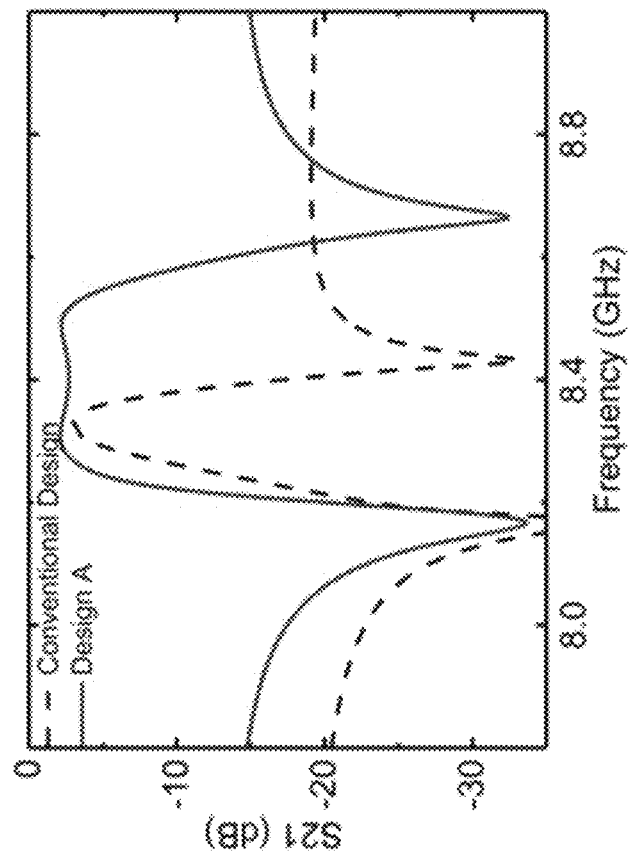
FIG. 30B
FIG. 30A

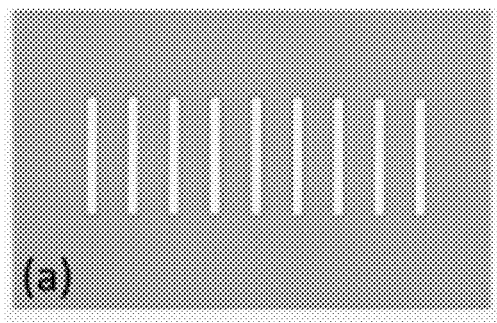
FIG. 32A
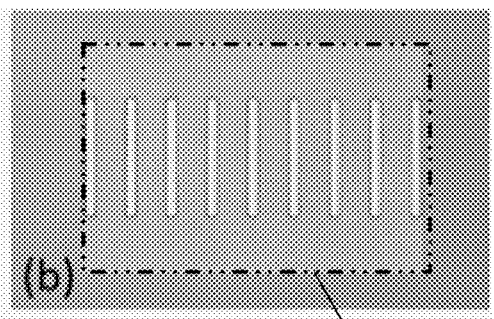
FIG. 32B — Thinned region
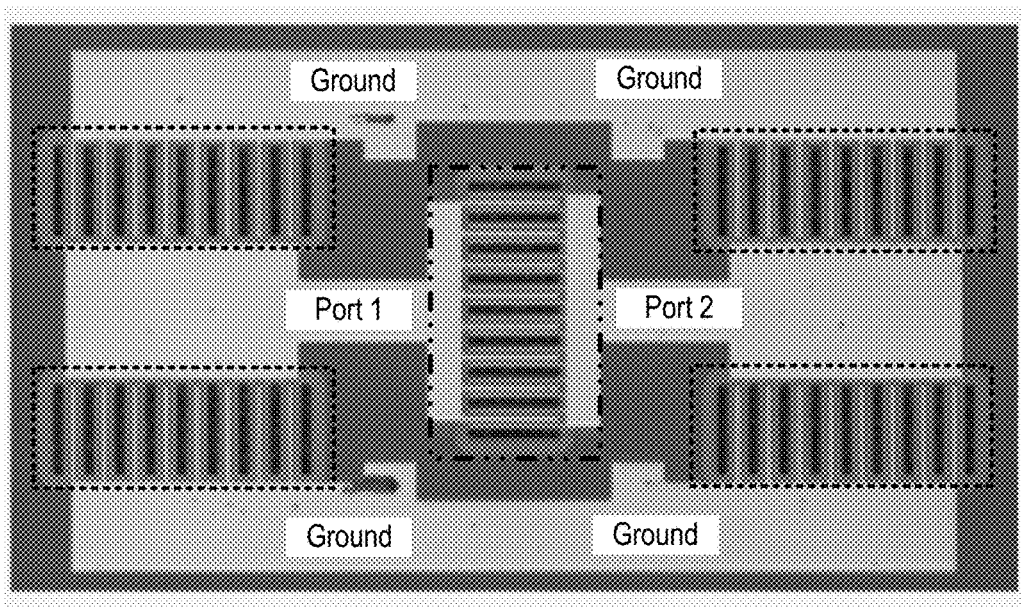
FIG. 32C
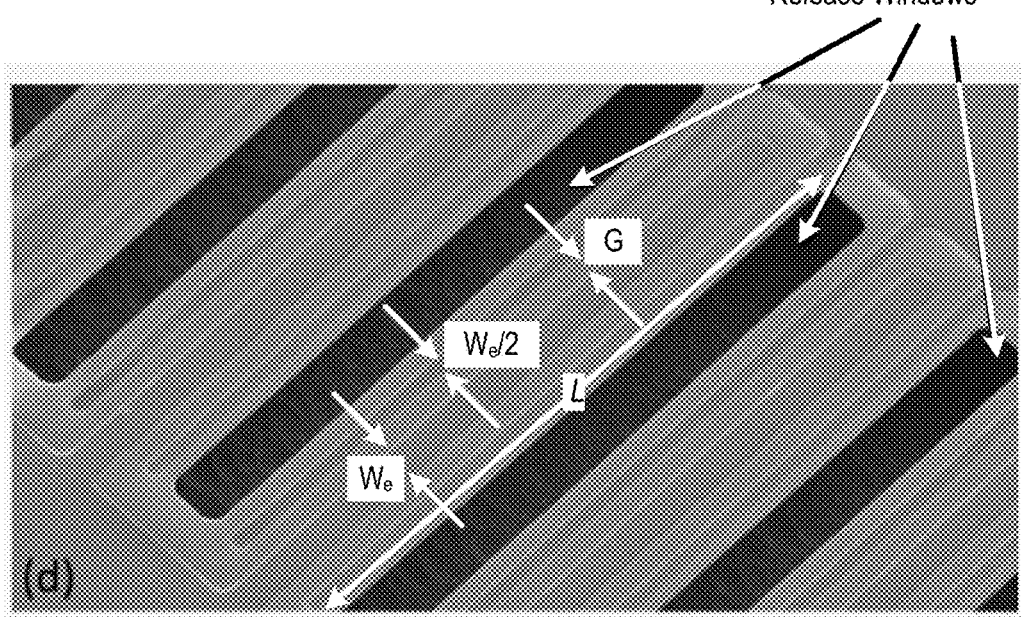
FIG. 32D

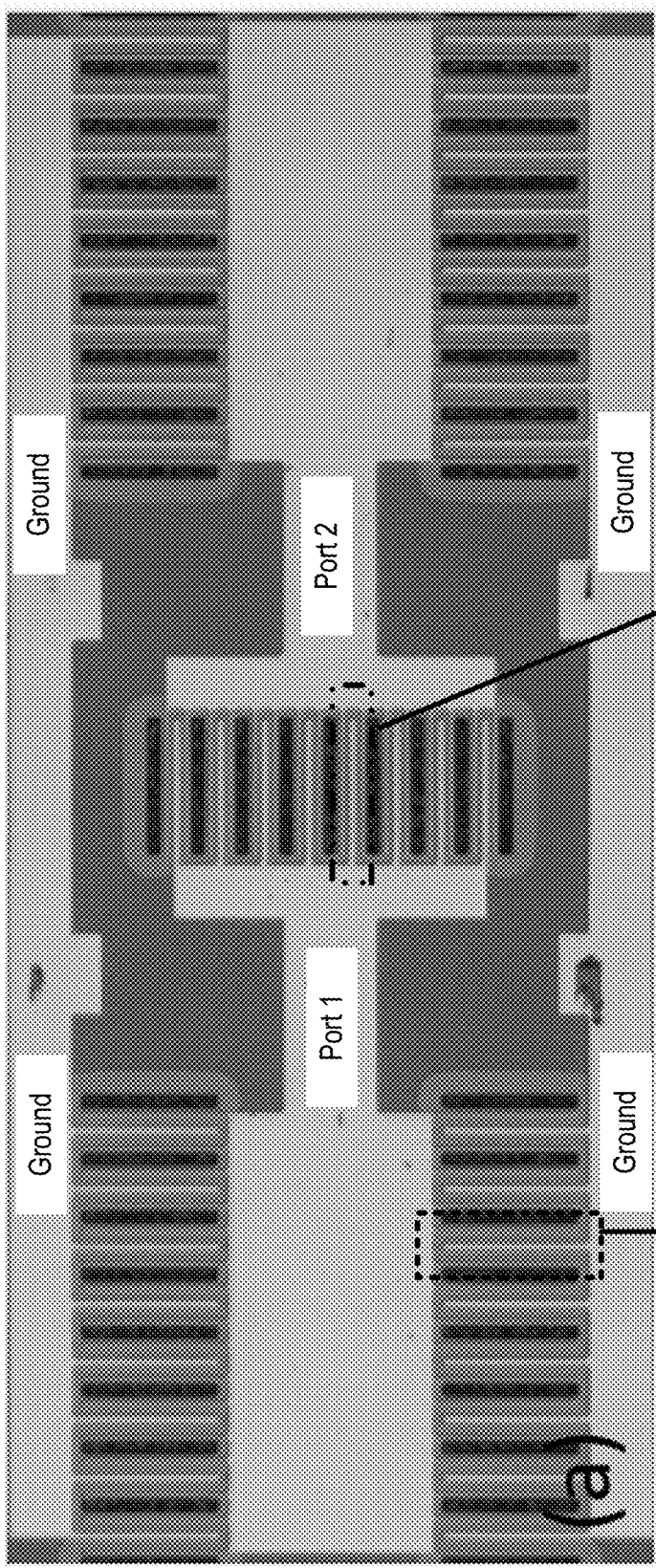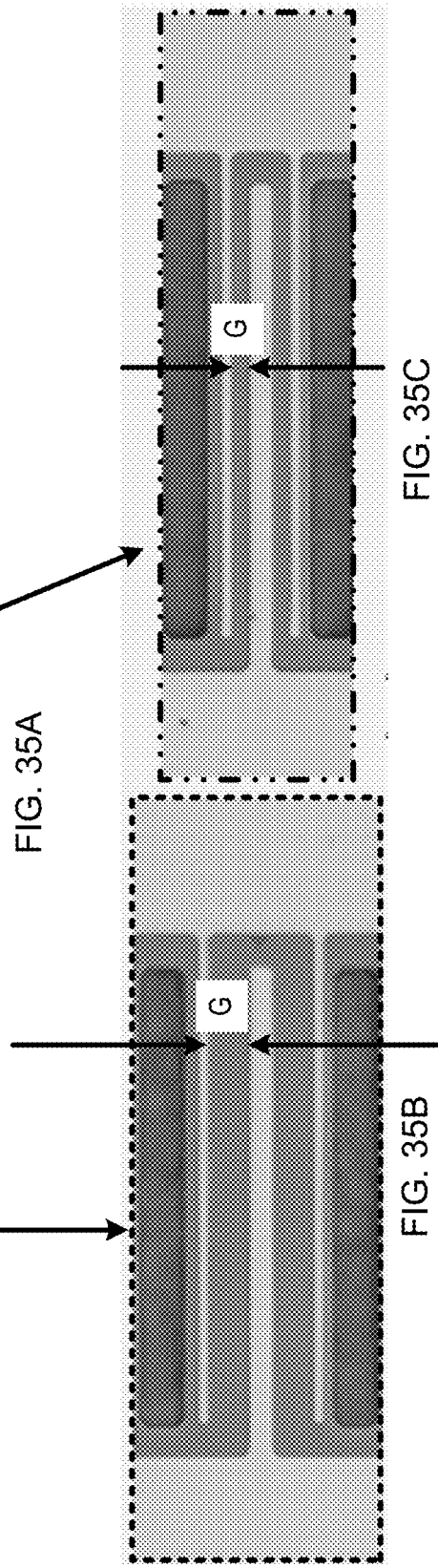
FIG. 35A  FIG. 35B  FIG. 35C

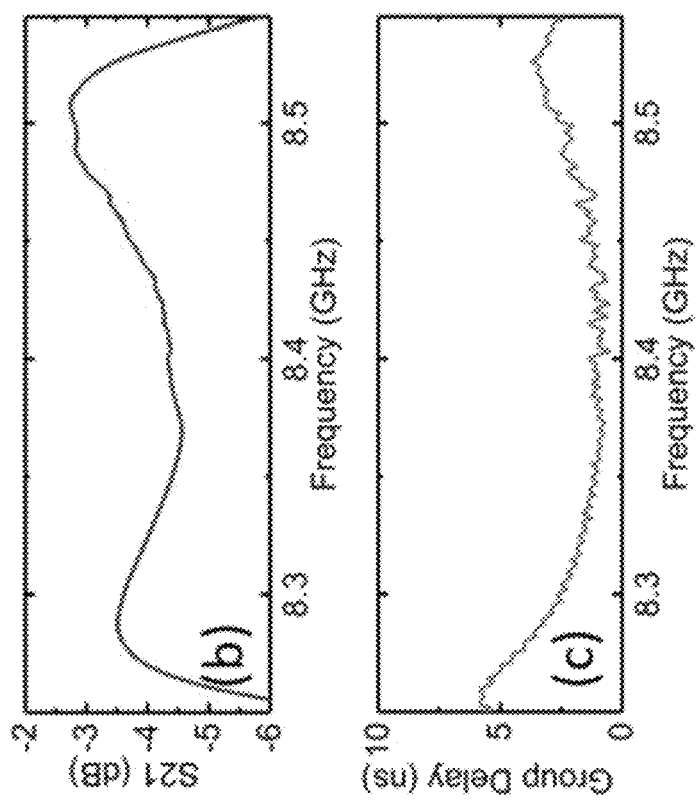
FIG. 36B
FIG. 36C
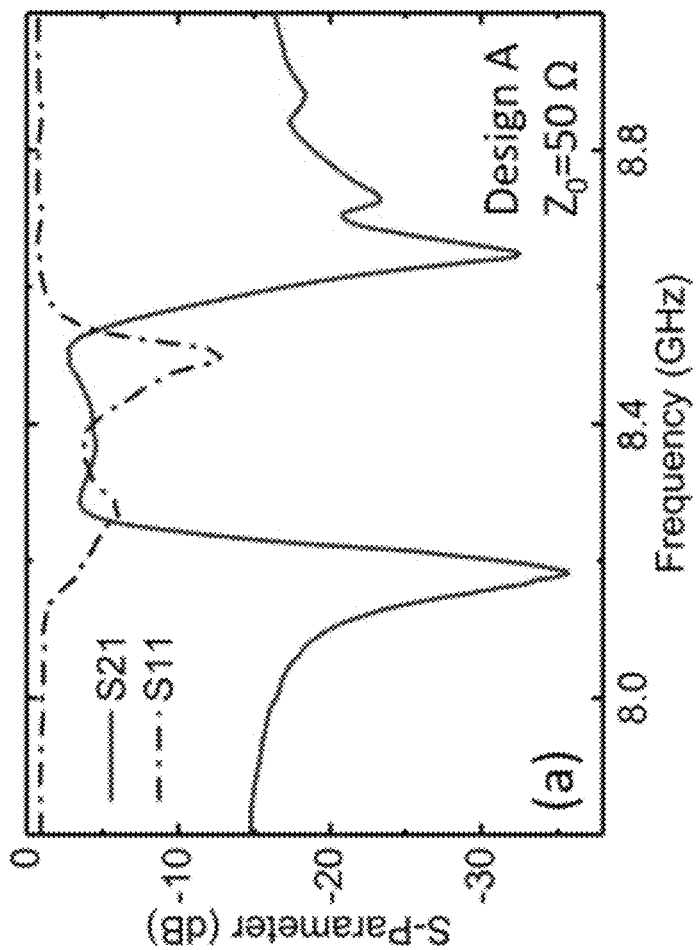
FIG. 36A

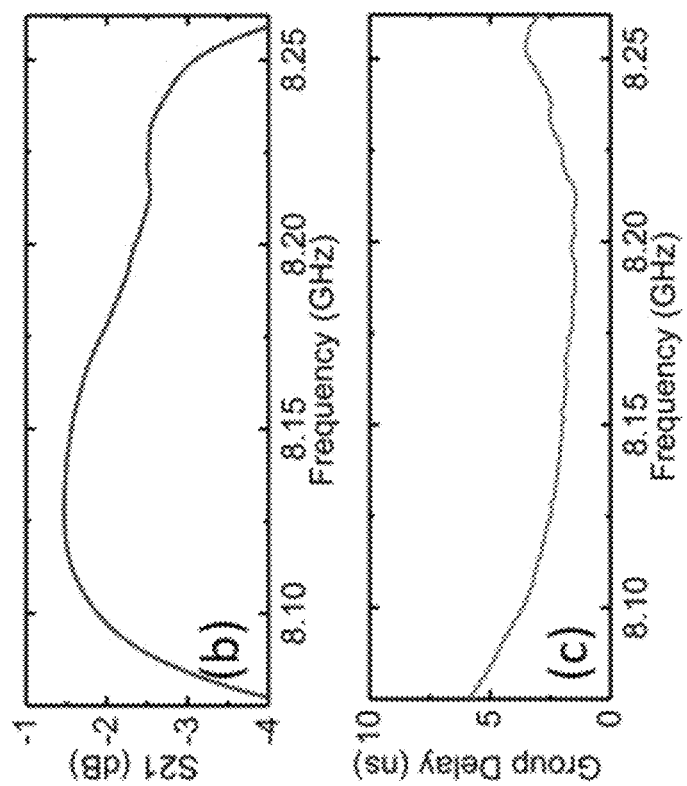
FIG. 37B
FIG. 37C
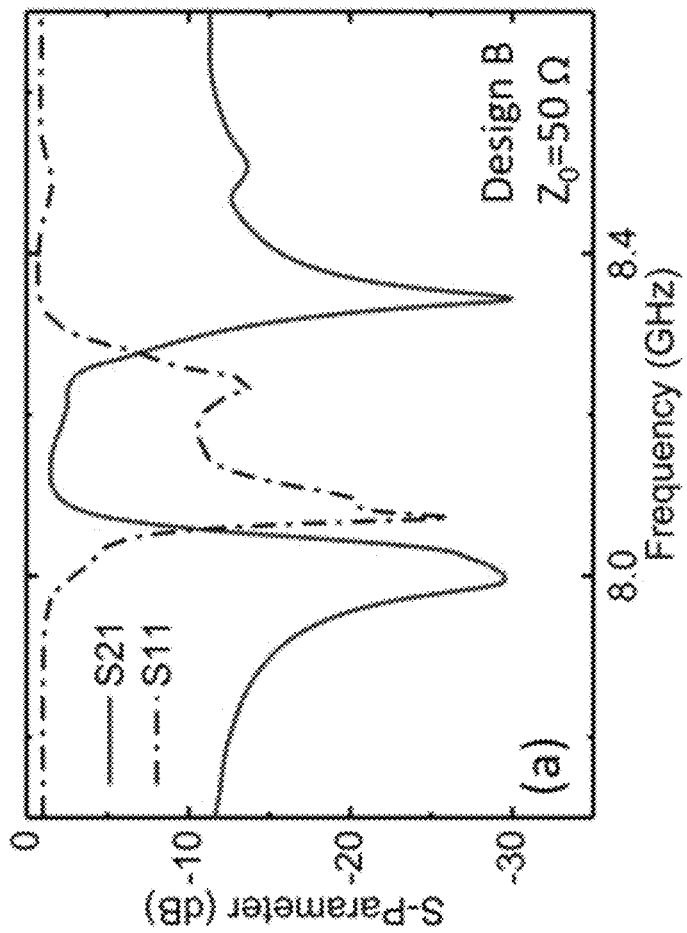
FIG. 37A

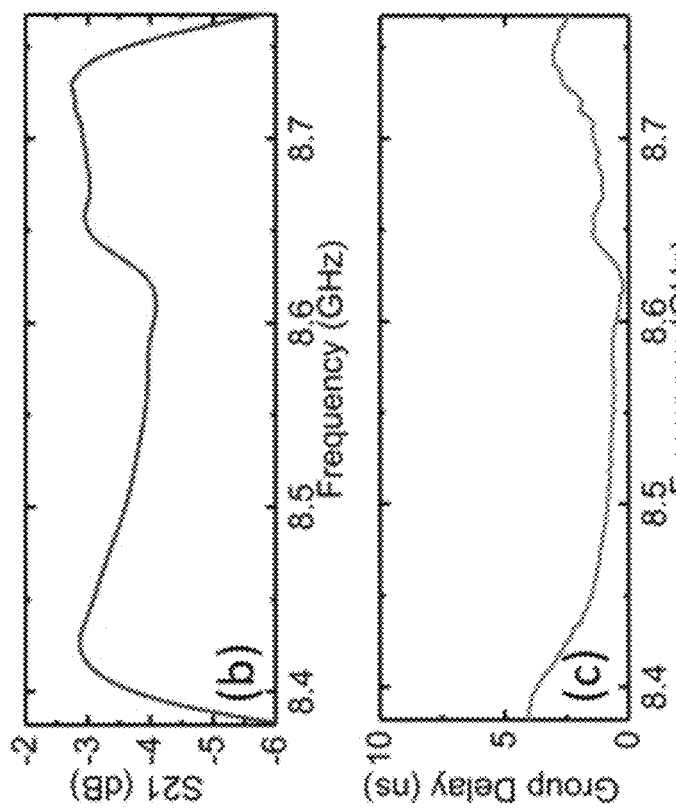
FIG. 38B
FIG. 38C
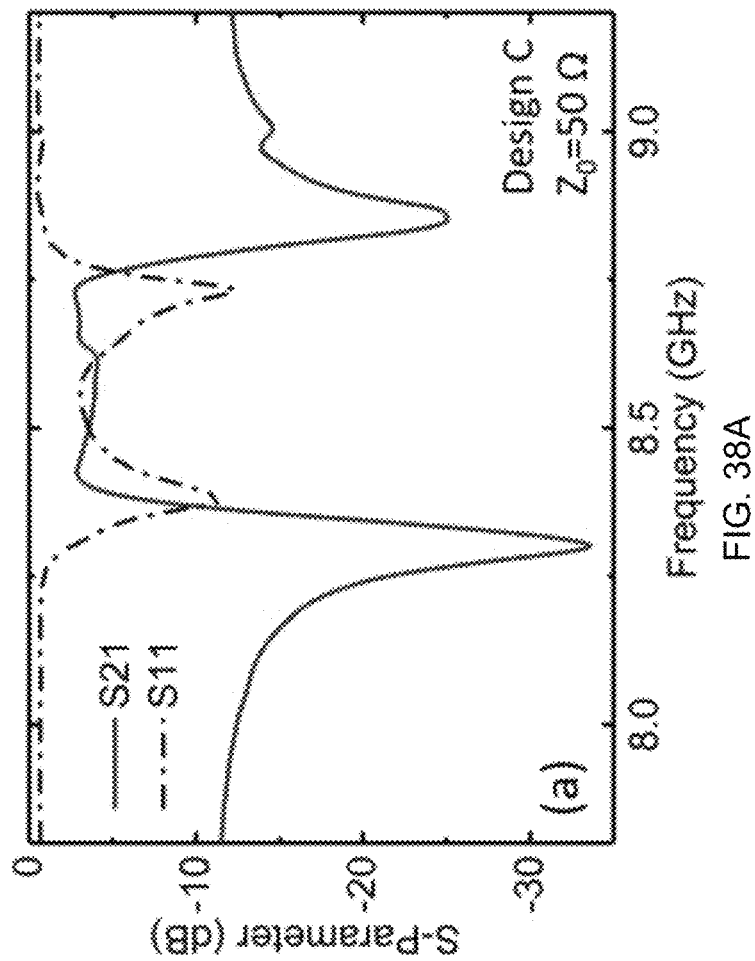
FIG. 38A

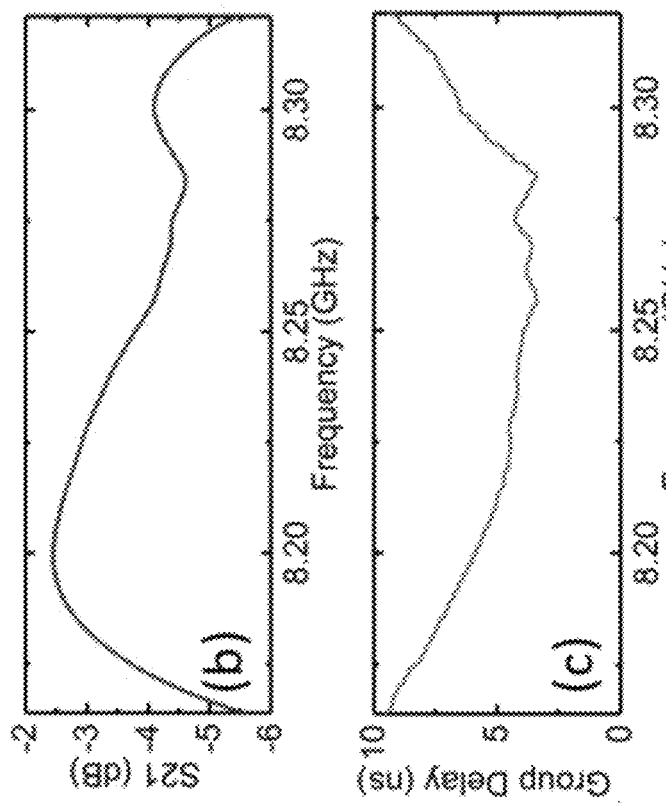
FIG. 39B
FIG. 39C
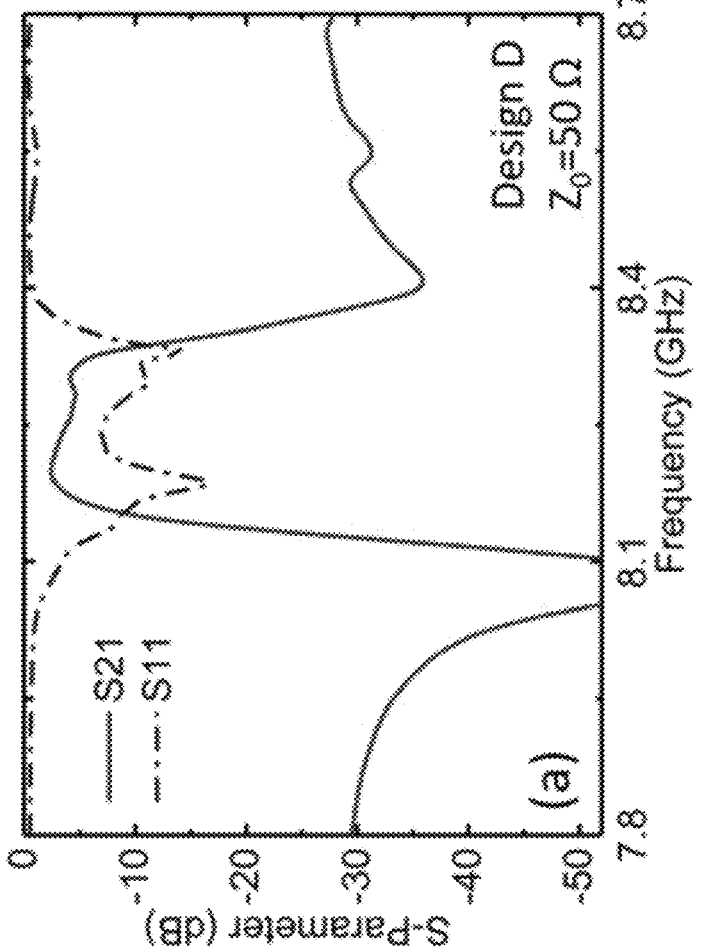
FIG. 39A

FIFTH-GENERATION (5G)-FOCUSED PIEZOELECTRIC RESONATORS AND FILTERS

RELATED APPLICATIONS

This application claims the benefit under 35 U.S.C. § 119(e) of U.S. Provisional Patent Application No. 62/965,365, filed Jan. 24, 2020, which is incorporated herein by this reference in its entirety.

FEDERALLY SPONSORED RESEARCH OR DEVELOPMENT

This invention was made with government support under grant numbers GG11856, 150042-02, HR0011-15-C-0008, and HR0011-17-C-0107 awarded by the Department of Defense (DARPA). The United States Government has certain rights in the invention.

TECHNICAL FIELD

Embodiments of the disclosure relate generally to acoustic filters, and more specifically, relate to resonators with interdigital transducers built on a piezoelectric thin film for 5G-related signal processing.

BACKGROUND

As the spectrum below 6 gigahertz (GHz) becomes overcrowded with applications, engineers seek to explore beyond 6 GHz for new spectral venues to advance wireless capabilities. Several bands ranging from 12 GHz to 27 GHz have been proposed, but may face challenges in scaling front-end components beyond their current operating frequencies. Some front-end components that are particularly difficult to scale in frequency are acoustic filters that have been successful in fourth generation wireless (4G) applications.

BRIEF DESCRIPTION OF THE DRAWINGS

A more particular description of the disclosure briefly described above will be rendered by reference to the appended drawings. Understanding that these drawings only provide information concerning typical embodiments and are not therefore to be considered limiting of its scope, the disclosure will be described and explained with additional specificity and detail through the use of the accompanying drawings.

FIG. 1A is a schematic diagram of a top view of an acoustic resonator with multiple pairs of interdigital transducers (IDTs) according to some embodiments.

FIG. 1B is a schematic diagram of a cross-section view of the acoustic resonator 100 with multiple pairs of interdigital transducers (IDTs) according to some embodiments.

FIG. 7A is a scanning electron microscope (SEM) image of a fabricated A1-mode acoustic resonator according to one embodiment.

FIG. 7B is a zoomed-in SEM image of the fabricated A1-mode acoustic resonator to show interdigital electrodes and release windows according to one embodiment.

FIG. 8 is a schematic diagram of a multi-resonance modified Butterworth-Van Dyke (MB VD) model with multiple motional branches capturing the primary mode and spurious modes according to some embodiments.

FIGS. 15A-15B are optical microscope images of a Design A and a Design B filter of FIG. 12A and FIG. 12B, respectively, according to an embodiment.

FIGS. 15C-15D are zoomed-in scanning electron microscope (SEM) images of a series resonator and a shunt resonator, respectively, according to an embodiment.

FIG. 18A is a cross-sectional view of a thin-film Z-cut $LiNbO_3$ resonator with multiple interdigital electrodes according to some embodiments.

FIG. 18B is a top view of the thin-film Z-cut $LiNbO_3$ resonator with multiple interdigital electrodes according to some embodiments.

FIG. 18C is a displacement mode shape of a seventh-order antisymmetric (A7) Lamb wave mode according to embodiments.

FIG. 23A is a displacement mode shape of a third-order asymmetric (A3) Lamb wave mode according to an embodiment.

FIG. 23B is a schematic diagram showing a cross-sectional view of a $LiNbO_3$ acoustic resonator with a single pair of IDTs and the corresponding simulated displacement mode shape according to some embodiments.

FIG. 23C is a schematic diagram illustrating a cross-sectional view of an A3 Z-cut $LiNbO_3$ acoustic resonator with multiple pairs of IDTs, according to some embodiments.

FIG. 28A is a graph illustrating the relationship among the static capacitance $C_0$, the frequency shift Δf of the filter, and the series inductance for the shunt branches according to an embodiment.

FIG. 28B is a graph illustrating the relationship among the static capacitance $C_0$, the frequency shift Δf of the filter, and the series inductance for the series branches according to an embodiment.

FIG. 29A is an illustration of a high-frequency structure simulator (HFSS) electromagnetic (EM) model of the filter layout for Design A according to one embodiment.

FIG. 29B is an illustration of an HFSS EM Model of the filter layout for Design B and C use the same filter layout with thinner thicknesses in the $LiNbO_3$ for series resonators. Designs B and C according to one embodiment.

FIG. 30A is a graph illustrating a hybrid simulation result (S12) of a Design A filter and a conventional filter design according to one embodiment.

FIG. 30B is a graph illustrating a hybrid simulation result (S12) of a Design B filter and a design C filter according to one embodiment.

FIGS. 32A-32D are optical microscope images of a Design A filter according to one embodiment.

FIG. 35A is an optical microscope image of the fabricated A3 LiNbO$_3$ filter without regional thinning according to an embodiment.

FIG. 35B is an optical microscope image of a shunt resonator according to some embodiments.

FIG. 35C is an optical microscope image of a series resonator according to some embodiments.

FIG. 36A is a graph illustrating a measured performance (S-parameter) of a Design A filter according to an embodiment.

FIG. 36B is a graph illustrating a zoomed-in passband (S21) of the Design A filter according to an embodiment.

FIG. 36C is a graph illustrating an in-band group delay of a Design A filter according to an embodiment.

FIG. 37A is a graph illustrating a measured performance (S-parameter) of a Design B filter according to an embodiment.

FIG. 37B is a graph illustrating a zoomed-in passband (S21) of the Design B filter according to an embodiment.

FIG. 37C is a graph illustrating an in-band group delay of a Design B filter according to an embodiment.

FIG. 38A is a graph illustrating a measured performance (S-parameter) of a Design C filter according to an embodiment.

FIG. 38B is a graph illustrating a zoomed-in passband (S21) of the Design C filter according to an embodiment.

FIG. 38C is a graph illustrating an in-band group delay of a Design C filter according to an embodiment.

FIG. 39A is a graph illustrating a measured performance (S-parameter) of a Design D filter according to an embodiment.

FIG. 39B is a graph illustrating a zoomed-in passband (S21) of the Design D filter according to an embodiment.

FIG. 39C is a graph illustrating an in-band group delay of a Design D filter according to an embodiment.

DETAILED DESCRIPTION

Figure 1C:
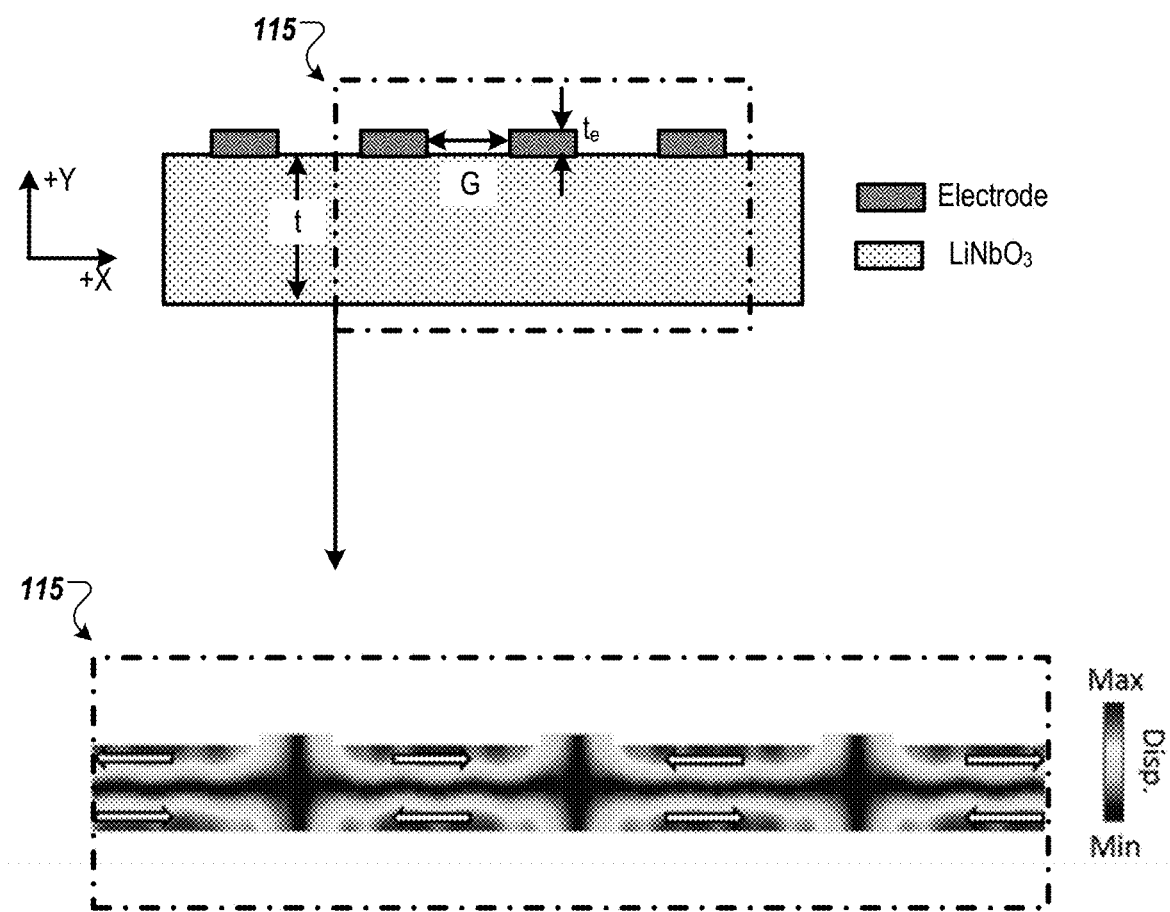
FIG. 1C is a zoomed-in view 115 of a displacement mode shape of the A1 Lamb-wave mode supported by the acoustic resonator according to some embodiments.

As fifth-generation (5G) wireless communication systems shape up to deliver paradigm-shifting applications in recent years, front-end technologies at higher frequencies as the enablers of 5G receive more research attention. One challenge in transitioning from the fourth-generation (4G) to 5G arises from the increase in fractional bandwidths (FBW). Most long-term evolution (LTE) bands, which have physical bandwidths ranging from 3 to 20 megahertz (MHz) at a center frequency from 0.4 to 3.7 GHz, have a FBW less than 4%. 5G systems, on the other hand, can end up demanding a FBW as high as 13% (e.g., 4.4-5 GHz). Such a large FBW challenge the capabilities of the incumbent mobile front-end filters, which remain essential for accessing the radio frequency (RF) spectrum and establishing 5G new radio (NR)'s coexistence with current and emerging applications. Currently, the commercial filtering solutions for 4G are based on surface acoustic wave (SAW) resonators and thin-film bulk acoustic resonators (FBARs). The FBW of these acoustic filters is fundamentally set by the electromechanical coupling ($k_t^2$) of the resonators in the filter. For instance, SAWs and FBARs are limited in their FBW (which is less than 5%) due to their electromechanical coupling (e.g., kt2 less than 10%), and may be insufficient to meet several emerging sub-6 GHz bands of 5G with more than 5% FBW in an acoustic-only approach.

Some acoustic or microelectromechanical system (MEMS) resonators operating in several Lamb wave modes, including a fundamental symmetric (S0) mode and a fundamental shear-horizontal (SH0), can be based on single-crystal X-cut lithium niobate (LiNbO$_3$) or lithium tantalate (LiTaO$_3$) thin films. They reportedly have high $k_t^2$ (greater than 20%) and low damping (high figure-of-merit (FoM)=$k_t^2$Q), which can make them a contender for 5G filters requiring large FBW. Despite their demonstrated high FoMs, the moderate phase velocities in S0 (6000 m/s) and SH0 (3500 m/s) modes can present a challenge to scale their frequencies and cover the entire sub-6 GHz spectrum.

In various embodiments, phase velocities contribute to determining resonant frequencies. For example, for a set of feature sizes, larger phase velocities can lead to higher resonant frequencies. To simultaneously harness the high $k_t^2$ in LiNbO$_3$ and scale beyond the frequency ranges of S0 and SH0, the first-order antisymmetric (A1) Lamb-wave modes with a very large phase velocity in single-crystal Z-cut and Y-cut piezoelectric thin films (e.g., LiNbO$_3$ or LiTaO$_3$) may be a solution for sub-6 GHz wideband filters. However, spurious modes in past demonstrations can remain a bottleneck in lowering electromechanical coupling ($k_t^2$) of the intended resonance and creating in-band ripples and out-of-band spurious responses. As a result of these unmitigated spurious modes, a $k_t^2$ of 6% may be achieved, which may be below the maximum value predicted by the theoretical analysis ($k_t^2 \approx 14\%$ in Y-cut piezoelectric thin film).

A 1.65 GHz A1 mode resonator with a high $k_t^2$ of 14%, a high quality factor (Q) of 3112, and a near spurious-free response can address the above mentioned issues. The 1.65 GHz resonance can be achieved by exploiting a high phase velocity of the A1 Lamb mode in a Y-cut lithium niobate thin film. While lithium niobate (LiNbO$_3$) is often referred to herein, lithium tantalate (LiTaO$_3$) can also be used for piezoelectric thin films disclosed herein and should be assumed as applicable to the disclosed embodiments, e.g., as a replacement for lithium niobate. Spurious mode suppression can be accomplished with electrode optimization. The performance of the resonator can outperform surface acoustic wave (SAW) resonators and thin-film bulk acoustic resonators (FBARs) regarding the figure of merit in the 1 GHz to 6 GHz frequency range. The A1 mode resonator can provide a new platform the 5G front-end filtering.

In some embodiments, an A1 resonator can include a piezoelectric thin film disposed on a carrier substrate. The piezoelectric thin film can be a Y-cut (or Z-cut) lithium niobate (LiNbO$_3$) or lithium tantalate (LiTaO$_3$) thin film adapted to propagate a first order antisymmetric (A1) mode (among other modes) excited by an electric field oriented in a longitudinal direction along a length of the piezoelectric thin film. A number of pairs of interdigital transducers (IDTs) can be disposed on top of the piezoelectric thin film. The piezoelectric thin film and the number of pairs of IDTs form a resonator, and the electric field can drive the resonator in the A1 mode.

FIG. 1A is a schematic diagram of a top view of an acoustic resonator 100 (e.g., an apparatus) with multiple pairs of interdigital transducers (IDTs) according to some embodiments. The IDTs include signal electrodes 102 alternated with ground electrodes 104. The acoustic resonator 100 includes a piezoelectric thin film 106 that is suspended above a carrier substrate (not illustrated). In some embodiments, the piezoelectric thin film 106 can be a Y-cut LiNbO$_3$ thin film or a Y-cut LiTaO$_3$ thin film that is adapted to propagate an acoustic wave in a Lamb mode, at least such as a first-order asymmetric (A1) mode. In other embodiments, the piezoelectric thin film 106 can be a Z-cut LiNbO$_3$ thin film or a Z-cut LiTaO$_3$ thin film that is adapted to propagate an acoustic wave in a Lamb mode, at least such as a first-order asymmetric (A1) mode, a third-order asymmetric (A3) mode, or a seventh-order asymmetric (A7) mode. In some embodiments, the asymmetric modes can be antisymmetric modes.

In these embodiments, the acoustic mode is excited by a component of an electric field that is oriented in a longitudinal direction along a length of the piezoelectric thin film, illustrated as the +X direction in FIG. 1A. It should be noted that Cartesian directions such as ±Y, and ±Z are arbitrary choices for purposes of explanation, as illustrated in the Figures, and do not strictly define directions such as "longitudinal," "transverse," or the like. The acoustic resonator 100 includes a first signal electrode 102a that is disposed on the piezoelectric thin film and oriented in a transverse direction (illustrated as the Z direction in FIG. 1A) that is perpendicular to the longitudinal direction. The acoustic resonator 100 further includes a first ground electrode 104a that is oriented in the transverse direction. The first ground electrode 104a is separated from the first signal electrode 102a by a gap (G) 108, which is a longitudinal distance in which the acoustic wave resonates. A width of the electrodes (e.g., transducer electrodes, such as the signal electrodes 102 and the ground electrodes 104) can be denoted as W e. The distance between electrodes can be denoted as L.

The piezoelectric thin film 106 includes a first release window 110a located at a first end of the piezoelectric thin film 106, and a second release window 110b located at a second end of the piezoelectric thin film 106. The piezoelectric thin film 106 further includes a set of intermediate release windows 112a located beyond ends of the signal electrodes 102, and a set of intermediate release windows 112b located beyond ends of the ground electrodes 104. In some embodiments, each set of intermediate release windows 112a and 112b can be patterned in a periodic and/or regular manner.

FIG. 1B is a schematic diagram of a cross-section view 105 of the acoustic resonator 100 with multiple pairs of interdigital transducers (IDTs) according to some embodiments. As depicted in FIG. 1B, t represents a thickness of the piezoelectric thin film 106, and $t_e$ represents a thickness of the transducer electrodes. To advance acoustic resonators (also referred to simply as "resonators"), such as the acoustic resonator 100, towards 5G communication systems, it can be desirable to suppress the significant spurious modes while enhancing the electromagnetic coupling ($k_t^2$) and figure of merit (FoM), for example, of the A1 mode in Y-cut LiNbO$_3$ or LiTaO$_3$. To this end, the origins of spurious modes can be identified, which can allow them to be mitigated by optimizing electrode design.

In some embodiments, an acoustic resonator that has an optimized electrode designed can have wide gaps (G) between transducer electrodes (e.g., the signal electrodes 102 and adjacent ground electrodes 104) in order to take advantage of the transduction quasi-exclusively for the intended mode (e.g., such as the A1 mode, the A3 mode, the A7 mode, among others). An acoustic resonator can be fabricated in order to validate the analysis and modeling. As an illustrative example, and acoustic resonator can be fabricated on a 1.2 microns (μm)-thick Y-cut piezoelectric thin film and measured to demonstrate a resonance at 1.65 GHz, a high $k_t^2$ of 14%, a high Q of 3112, and a near spurious-free response. In some embodiments, the width of the signal and ground electrodes are identical. In some embodiments, the longitudinal distance (e.g., the gap 108) is between approximately 1 micrometers (μm) and 30 μm. A ratio of the electrode width to the longitudinal distance can be between 0.25 and 7.5.

FIG. 1C is a zoomed-in view 115 of a displacement mode shape of the A1 Lamb-wave mode supported by the acoustic resonator 100 according to some embodiments. The zoomed-in view 115 is denoted by a dashed rectangle in FIG. 1B. Arrows in FIG. 1C denote displacement directions of the A1 mode according to some embodiments. To efficiently excite the A1 mode in a Y-cut LiNbO$_3$ thin film, the transducer configuration should be considered. According to the piezoelectric coupling matrix of Y-cut LiNbO$_3$, the longitudinal electric fields can excite the A1 mode with a high coupling factor. Thus, IDTs patterned exclusively on top of the LiNbO$_3$ thin film can be used to introduce a longitudinal electric field (E-field). Using only top electrodes as transducers may introduce fewer fabrication complications and can allow for low-cost manufacturing. In addition to the IDT configuration, the performance of the acoustic resonator may also depend on the direction of acoustic wave propagation.

The electromechanical coupling (e.g., $k_t^2$) of A1-mode acoustic resonators can vary with the device orientation. For example, in the Y-cut LiNbO$_3$ plane, the maximum value of $k_t^2$ may be attained along either the +X or −X-axis. It is worth noting that Y-cut refers to a cut in which the Y-axis of the material is perpendicular to the plane. Therefore, the acoustic resonators in the present discussion (e.g., relating at least to FIGS. 1-10) are oriented along the +X axis. Once the configuration and orientation are determined, multiple pairs of IDTs can be used to produce a sufficiently large static capacitance ($C_0$) while driving the acoustic resonator into the A1 vibrational mode as shown in FIG. 1C. Despite being effective in attaining an A1-mode resonance, in some cases such a design can be prone to unwanted spurious modes that can occur near the intended A1 mode as shown in FIG. 2.

Figure 2:
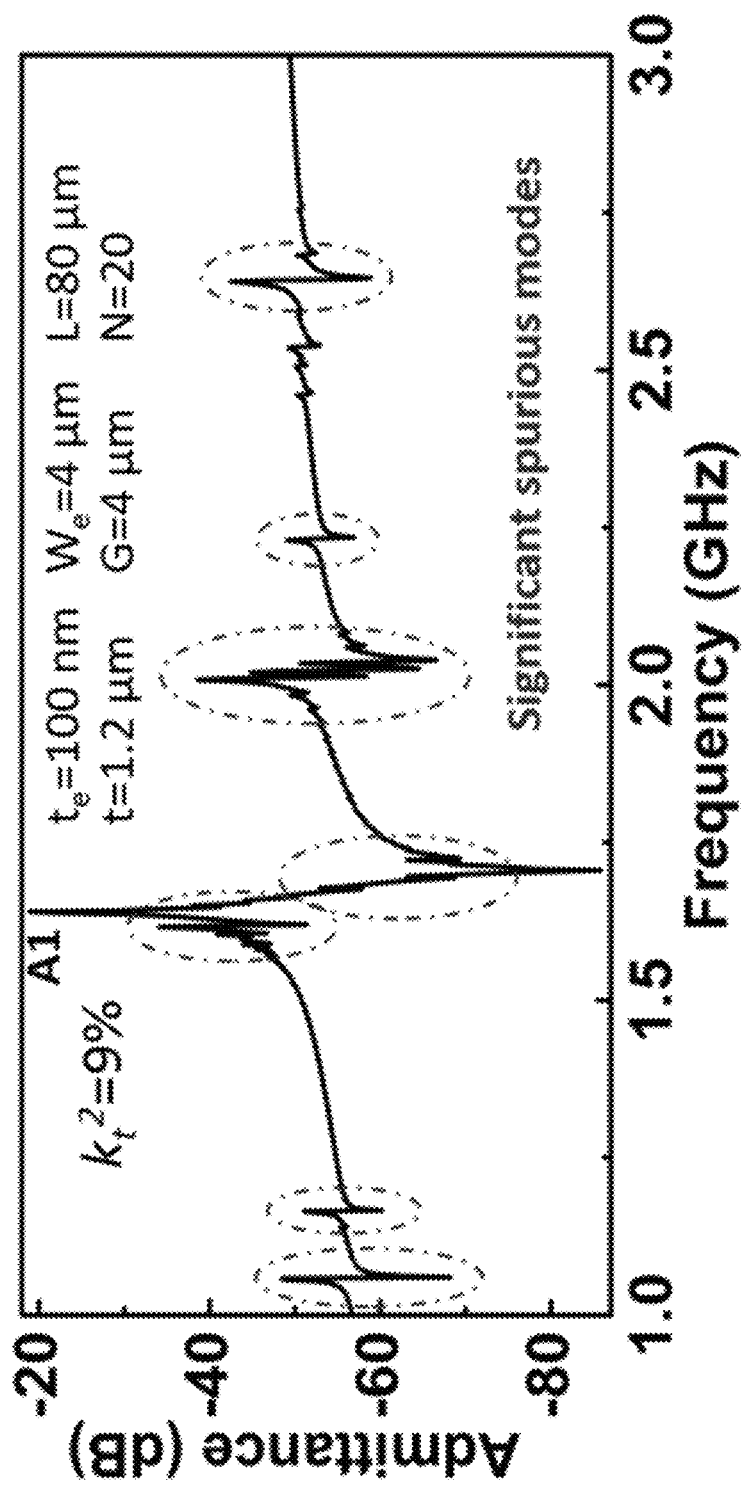
FIG. 2 is a graph illustrating a finite element analysis (FEA)-simulated response of an A1-mode acoustic resonator based on the structure of FIGS. 1A-1B according to some embodiments.

FIG. 2 is a graph illustrating a finite element analysis (FEA)-simulated response of an A1-mode acoustic resonator based on the structure of FIGS. 1A-1B according to some embodiments. Design parameters are listed in the inset and significant spurious modes that are to be suppressed are pointed out the dashed circles. In the depicted embodiment, the electrodes have a thickness of approximately 100 nm and a width of approximately 4 µm, while the piezoelectric thin film (e.g., LiNbO$_3$ or LiTaO$_3$) has a thickness of approximately 1.2 µm. A spacing (e.g., a gap, or a longitudinal distance) between electrodes is approximately 4 µm. A length of the electrodes is approximately 80 µm, and there are 20 electrodes. In other embodiments, however, each of these parameters can be varied, and the actual values given are to be used only as an illustrative example.

Figure 3A:
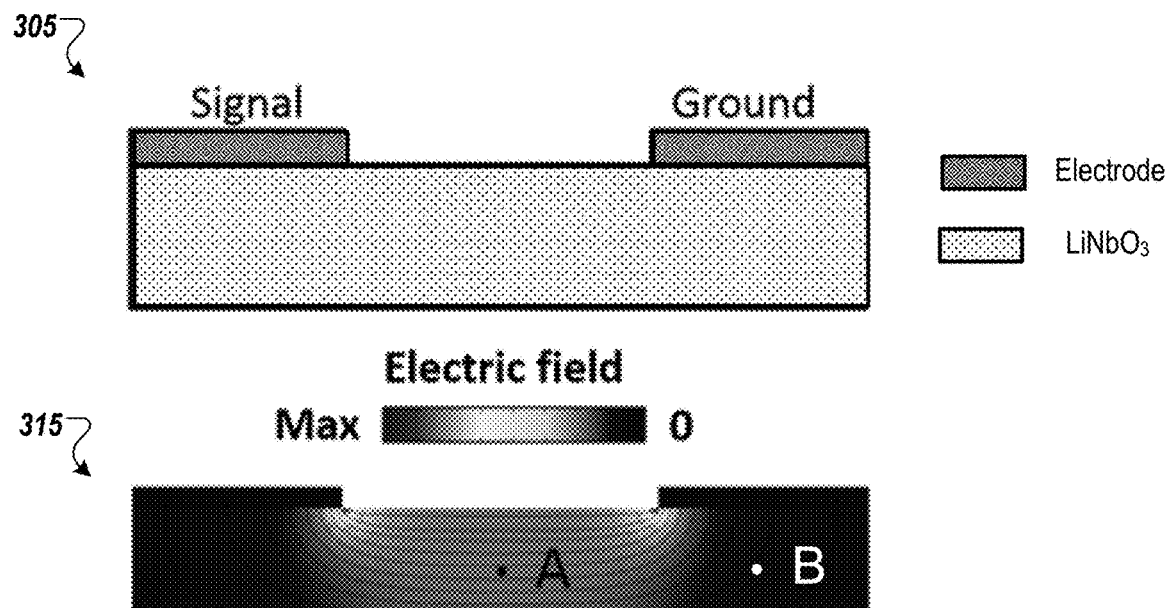
FIG. 3A is a cross-sectional view of an acoustic resonator including one signal electrode and one ground electrode, along with an illustrated FEA-simulated distribution of the electric field according to some embodiments.

FIG. 3A is cross-sectional view of an acoustic resonator 305 including one signal electrode and one ground electrode, along with an illustrated FEA-simulated distribution 315 of the electric field according to some embodiments. To suppress unwanted spurious modes, as depicted in FIG. 2, the origins of the unwanted spurious modes should be understood by examining the electric field induced by top IDTs. For simplicity, a 2-electrode structure as seen in FIG. 3A is used. The FEA-simulated distribution 315 of the electric field shows that both the longitudinal and vertical components of the E-field may be present in both un-metalized (Point A) (e.g., a section of the acoustic resonator without top electrodes) and metalized (Point B) (e.g., a section of the acoustic resonator with top electrodes) sections of the piezoelectric thin film.

Figure 3B:
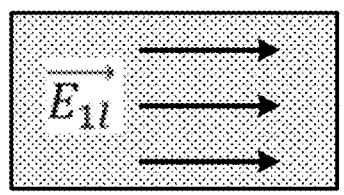
FIGS. 3B-3C is a schematic illustration of longitudinal and vertical electric field (E-field) directions in an un-metalized region of a piezoelectric thin film (such as a $LiNbO_3$ thin-film or a $LiTaO_3$ thin film) acoustic resonator according to embodiments.
Figure 3C:
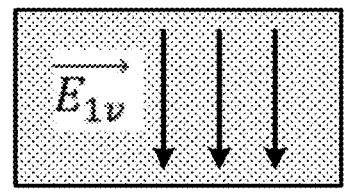
Figure 3D:
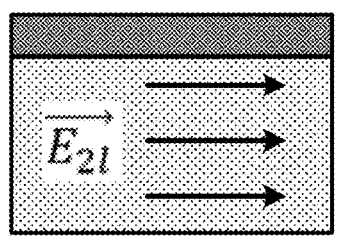
FIGS. 3D-3E is a schematic illustration of longitudinal and vertical electric field (E-field) directions in a metalized region of a piezoelectric thin film, such as $LiNbO_3$ or $LiTaO_3$ thin-film acoustic resonator according to embodiments.
Figure 3E:
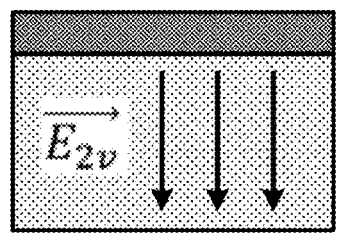

FIGS. 3B-3C schematic illustration of longitudinal and vertical electric field (E-field) directions in an un-metalized region of a LiNbO$_3$ thin-film acoustic resonator according to embodiments. FIGS. 3D-3E schematic illustration of longitudinal and vertical electric field (E-field) directions in a metalized region of a LiNbO$_3$ thin-film acoustic resonator according to embodiments. To qualitatively understand the coupling between these E-field components and the spurious modes, longitudinal and vertical electric fields can be separately applied to a Y-cut LiNbO$_3$ thin-film section with periodic boundaries.

Figures 4A, 4B:
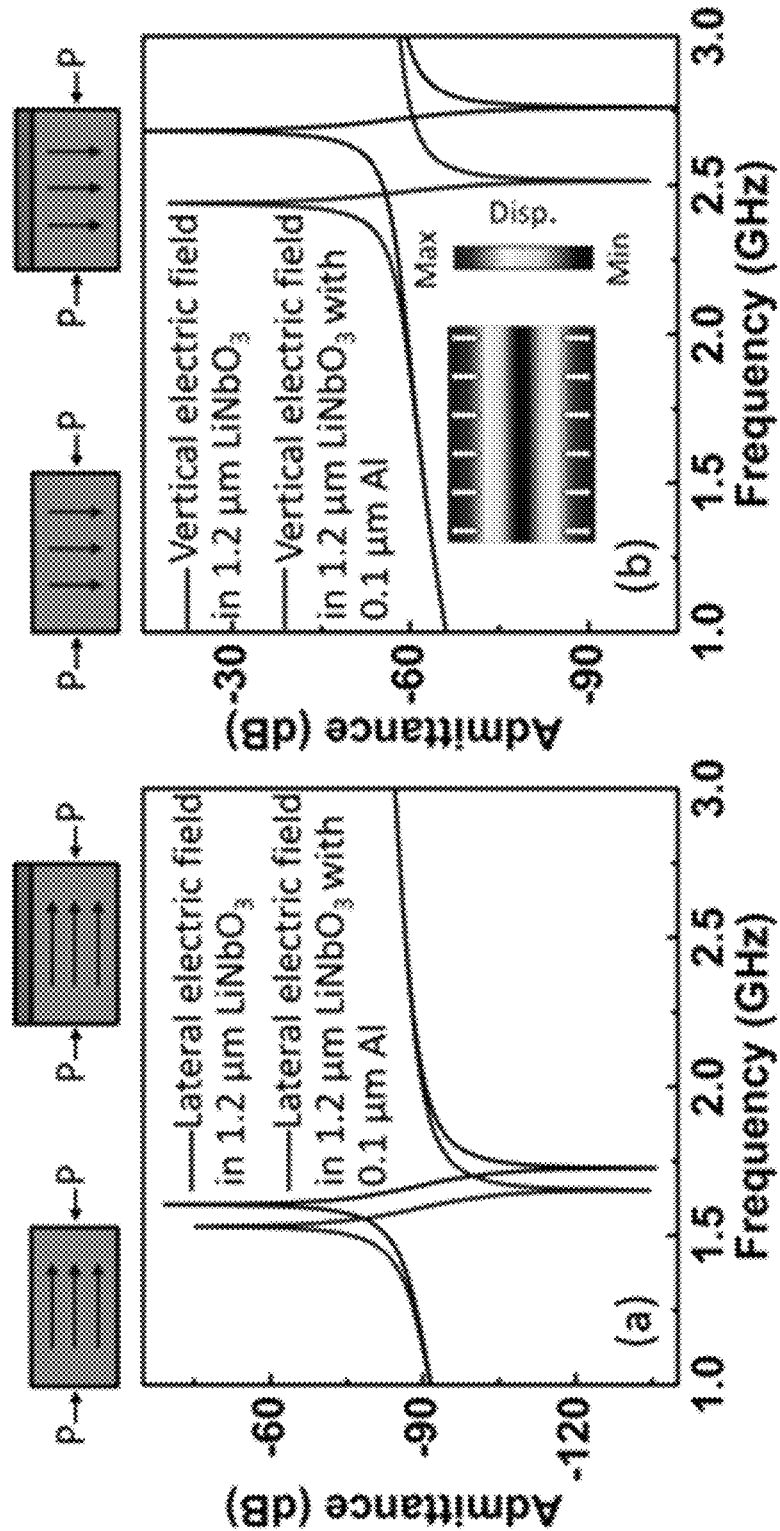
FIG. 4A is a schematic illustration showing simulated structures with periodic boundaries and a graph illustrating FEA-simulated results of the A1 modes that are excited by the longitudinal E-fields in the sections of 1.2 micron (μm) $LiNbO_3$ thin film without and with 0.1 μm aluminum (Al) electrodes according to some embodiments.
FIG. 4B a schematic illustration showing simulated structures with periodic boundaries and a graph of FEA-simulated results of a first-order symmetric (S1) mode excited by the longitudinal E-fields in the sections of 1.2 μm $LiNbO_3$ thin film without and with 0.1 μm Al electrodes according to some embodiments.

FIG. 4A is a schematic illustration showing simulated structures with periodic boundaries and a graph illustrating FEA-simulated results of the A1 modes that are excited by the longitudinal E-fields in the sections of approximately 1.2 micron (µm) LiNbO$_3$ thin film without and with approximately 0.1 µm aluminum (Al) electrodes according to some embodiments. As shown in FIG. 4A, several unwanted modes can be excited by the E-field components other than the longitudinal E-field in the un-metalized region.

FIG. 4B a schematic illustration showing simulated structures with periodic boundaries and a graph of FEA-simulated results of a first-order symmetric (S1) mode excited by the longitudinal E-fields in the sections of approximately 1.2 µm LiNbO$_3$ thin film without and with approximately 0.1 µm A1 electrodes according to some embodiments. The displacement mode shape of the S1 mode is included in the inset of FIG. 4B. The spurious modes can be either A1 overtones or longitudinal S1 modes. In order to mitigate these unwanted modes, $E_{1v}$, $E_{2l}$, and $E_{2v}$ can be minimized, as described with reference to FIG. 5.

Figure 5:
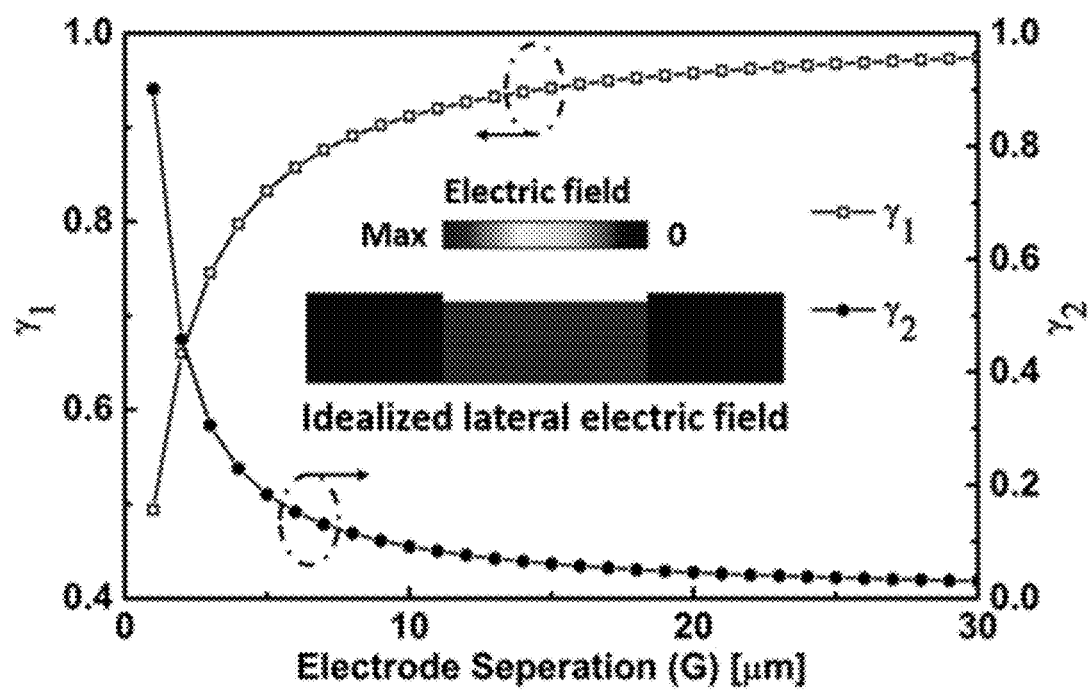
FIG. 5 is a graph illustrating E-field strength ratios, $\gamma_1$ and $\gamma_2$, as functions of the electrode separation (e.g., the gap, G) according to some embodiments.

FIG. 5 is a graph illustrating E-field strength ratios, $\gamma_1$ and $\gamma_2$, as functions of the electrode separation (e.g., the gap, G) according to some embodiments. In order to minimize $E_{1v}$, $E_{2l}$, and $E_{2v}$, the electrode separation (e.g., G in FIGS. 1A-1B) can be increased in the transducer design. To quantify the effect of the electrode separation, the E-field strength at point A (seen in FIG. 3A, e.g., the center of the resonator body) can be compared to the strength of an idealized longitudinal E-field ($E_{idea}$) that is uniformly applied by a pair of infinitesimally thin vertical electrodes (as shown in the inset of FIG. 5):

$$\gamma_1 = \frac{|E_{1l}|}{|E_{idea}|} \quad (1)$$

In this comparison, both the top IDTs and vertical electrodes can be driven by the same potential difference. Therefore, $\gamma_1$ indicates the degree of how longitudinal the E-field is, and an optimal design should have $\gamma_1$ close to 1. The total strength of the other E-field components responsible for inducing spurious modes, in particular $E_{1v}$ at Point A, $E_{2l}$, and $E_{2v}$ at Point B, can also be compared to the strength of $E_{1l}$ as follows:

$$\gamma_2 = \frac{|E_{1v}| + |E_{2l}| + |E_{2v}|}{|E_{1l}|} \quad (2)$$

The optimal transducer design should maximize $\gamma_1$ and minimize $\gamma_2$. To this end, $\gamma_1$ and $\gamma_2$ as functions of the electrode separation are simulated and shown in FIG. 5. As an illustrative example, the width of the top electrodes is fixed at 4 µm and the electrode separation is varied from approximately 1 to 30 µm in the simulations. FIG. 5 shows that increasing the electrode separation can increase $\gamma_1$ and decrease $\gamma_2$ simultaneously, suggesting that a wide electrode separation could lead to spurious modes suppression.

Figure 6A:
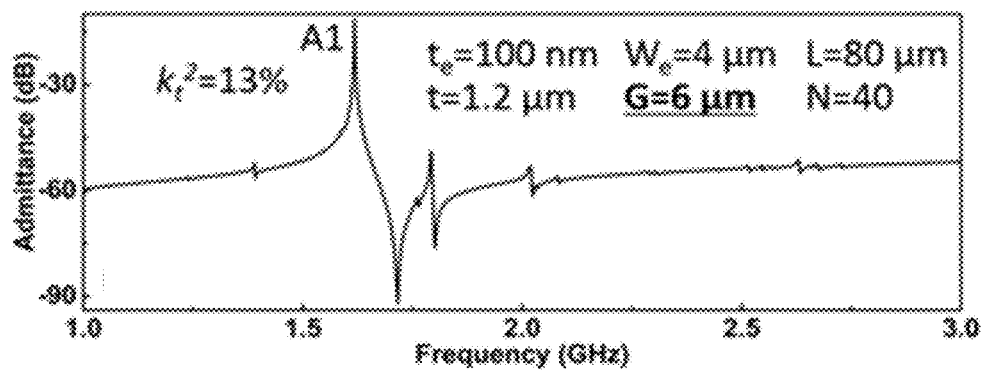
FIGS. 6A-6C are graphs illustrating FEA-simulated results of devices with different electrode separations according to some embodiments.
Figure 6B:
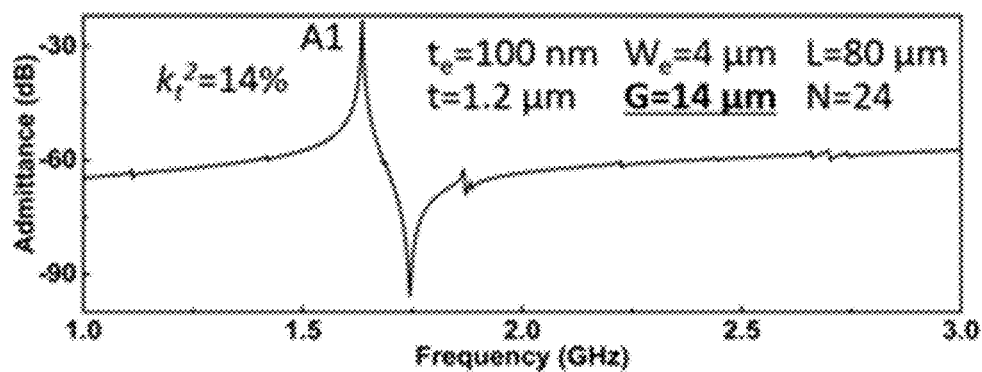
Figure 6C:
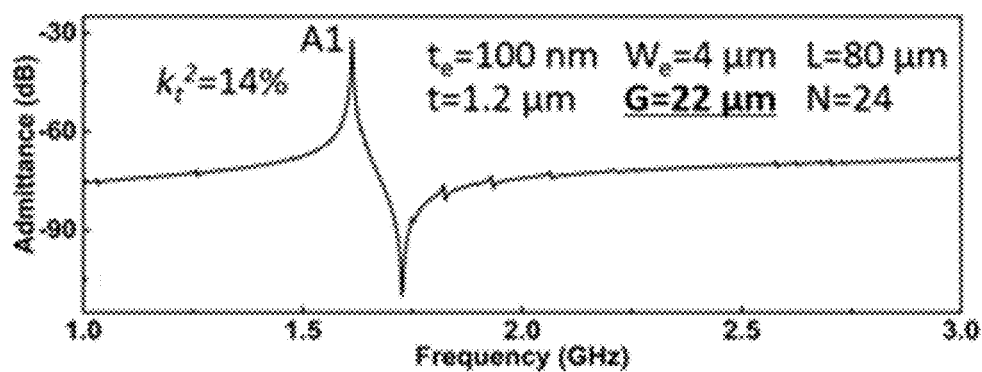

FIGS. 6A-6C are graphs illustrating FEA-simulated results of devices with different electrode separations according to some embodiments. FIGS. 6A-6C show simulated admittances for electrode separations of G=6 µm, 14 µm, and 22 µm respectively, according to some embodiments. Other design parameters are listed in the insets. To further validate the effect of the electrode separation on spurious modes, acoustic resonators with different electrode separations can be simulated using 2D Comsol. As shown in FIG. 2 and FIGS. 6A-6C, increasing the electrode separation from 4 µm (as in FIG. 2) to 14 µm (as in FIG. 6B) can effectively suppress the most significant spurious modes. However, further increasing the electrode separation to 22 µm (as shown in FIG. 6C) does not significantly improve the spurious mode suppression while instead reducing the static capacitance ($C_0$). Considering the trade-off between spurious mode mitigation and attaining an adequate $C_0$, an electrode 14 µm (or similar values) may be chosen as the electrode separation for electrode that is 4 µm in width.

FIG. 7A is a scanning electron microscope (SEM) image of a fabricated A1-mode acoustic resonator according to one embodiment. FIG. 7B is a zoomed-in SEM image of the fabricated A1-mode acoustic resonator to show interdigital electrodes and release windows according to one embodiment. To validate the IDT design optimization and modeling results, three different designs (A, B, and C) with various electrode separations (G=4, 6, and 14 µm) and electrode numbers may be fabricated on a 1.2 µm transferred Y-cut LiNbO$_3$ or LiTaO$_3$ thin film. The design parameters are listed in Table 1 below, and the SEMs of the fabricated devices are shown in FIGS. 7A-7B.

TABLE 1

| Design | W (μm) | N | G (μm) | $W_e$ (μm) | L (μm) | t (μm) | $t_e$ (nm) | $f_0$ (GHz) | $k_t^2$ | $Q_{3db}$ | FoM |
|---|---|---|---|---|---|---|---|---|---|---|---|
| A | 416 | 52 | 4 | 4 | 80 | 1.2 | 100 | 1.65 | 12.4% | 783 | 96 |
| B | 400 | 40 | 6 | 4 | 80 | 1.2 | 100 | 1.65 | 13% | 821 | 107 |
| C | 422 | 24 | 14 | 4 | 80 | 1.2 | 100 | 1.65 | 14% | 3112 | 435 |

While Table 1 refers to Designs A, B, and C consistent with the same reference in FIGS. 9A-9C and Table 2 (see below), these designs differ from and are not related to the Designs A, B, and C referred to with reference to Table 8 discussed in the latter part of this application, e.g., with reference to FIGS. 27A-27B and after.

FIG. 8 is a schematic diagram of a multi-resonance modified Butterworth-Van Dyke (MBVD) model with multiple motional branches capturing the primary mode and spurious modes according to some embodiments. The MBVD model can be used to interpret the measurement results so that the effects of spurious modes on the extraction of some parameters can be properly accounted for. In the multi-resonance MBVD, each resonance, including the intended mode (A1) and significant spurious modes, can be accounted for by a motional branch. As shown in FIG. 8, $R_{mm}$, $L_{mm}$, and $C_{mm}$ represent the motional branch of the primary mode while $R_{mspn}$, $L_{mspn}$, and $C_{mspn}$ represent the motional branches of different spurious modes. An additional resistor ($R_s$) can be added to account for the surface resistances of electrodes and bus lines. To factor in parasitic effects, $C_f$ and $R_f$ can also be included to denote the feedthrough capacitance and loss in the substrate, respectively. The fabricated acoustic resonators can be characterized at room temperature with a network analyzer (such as a performance network analyzer (PNA), or in specific cases, a Keysight N5249A PNA).

Figure 9A:
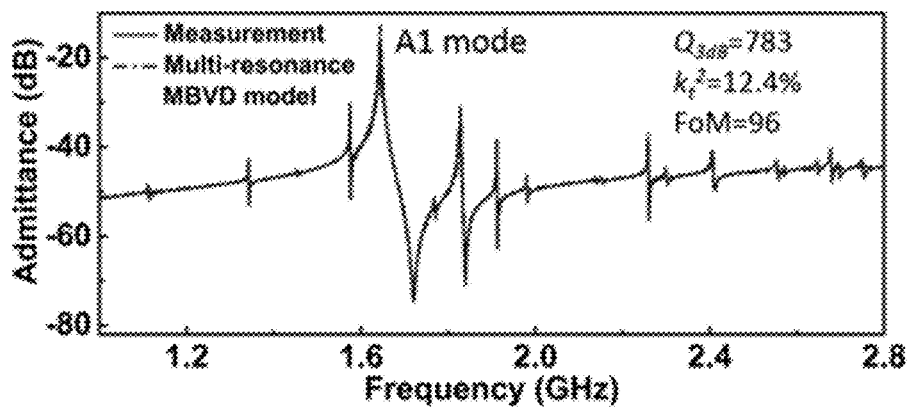
FIGS. 9A-9C are graphs illustrating measured admittances of acoustic resonator Designs A, B, and C according to embodiments.
Figure 9B:
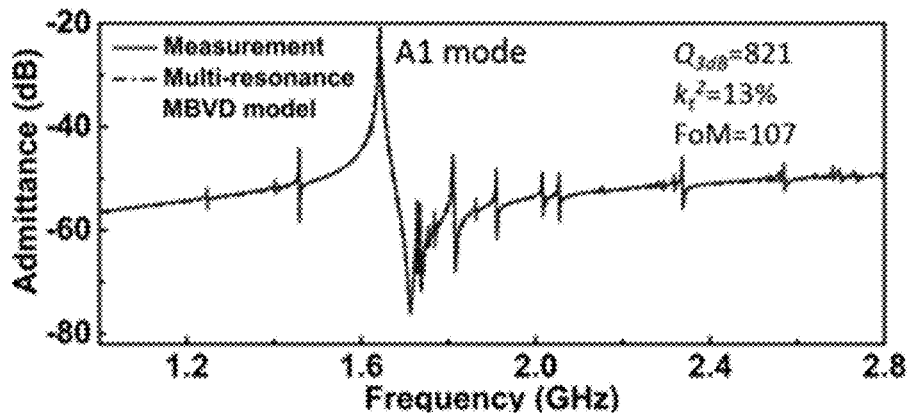
Figure 9C:
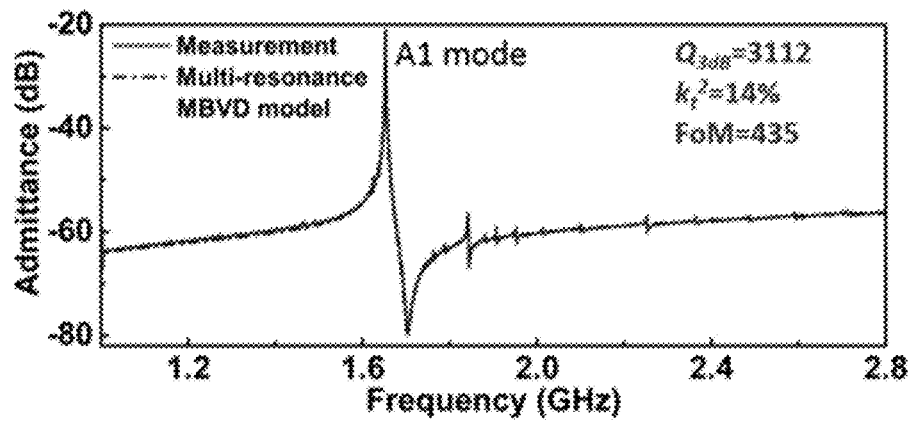

FIGS. 9A-9C are graphs illustrating measured admittances of acoustic resonator Designs A, B, and C according to embodiments. The measured admittance responses with multi-resonance MBVD modeled responses of the three different designs are shown in FIGS. 9A-9C, respectively. Some of the measured values of these A1-mode acoustic resonator designs are listed in Table 1. The extracted parameters of the multi-resonance MBVD model are listed in Table 2. Since the spurious modes are suppressed with Design C, the extracted parameters of the spurious motional branches are not included here. The measured admittance responses shown in FIGS. 9A-9C are consistent with the multi-resonance MBVD model simulated responses. Both the number and strength of spurious modes decrease significantly as the electrode separation increases from 4 μm (FIG. 9A) to 14 μm (FIG. 9B). Moreover, both $k_t^2$ and Q may be enhanced as a result of the spurious mode suppression. As detailed in FIG. 9C, the optimal resonator design for the fabricated acoustic resonators have a resonant frequency at 1.65 GHz, a high $k_t^2$ of 14%, a high 3 dB-Q of 3112, and a near spurious-free response.

TABLE 2

| Design | $C_0$ (fF) | $R_s$ (Ω) | $R_0$ (Ω) | $R_{mm}$ (Ω) | $C_{mm}$ (fF) | $L_{mm}$ (μH) | $C_f$ (fF) | $R_f$ (Ω) |
|---|---|---|---|---|---|---|---|---|
| A | 340 | 2 | 8 | 2 | 37.1 | 0.25 | 40 | 65 |
| B | 166 | 4 | 16 | 3.5 | 19.7 | 0.48 | 40 | 65 |
| C | 51 | 6 | 54 | 5 | 5.79 | 1.61 | 40 | 65 |

Figures 10A, 10B:
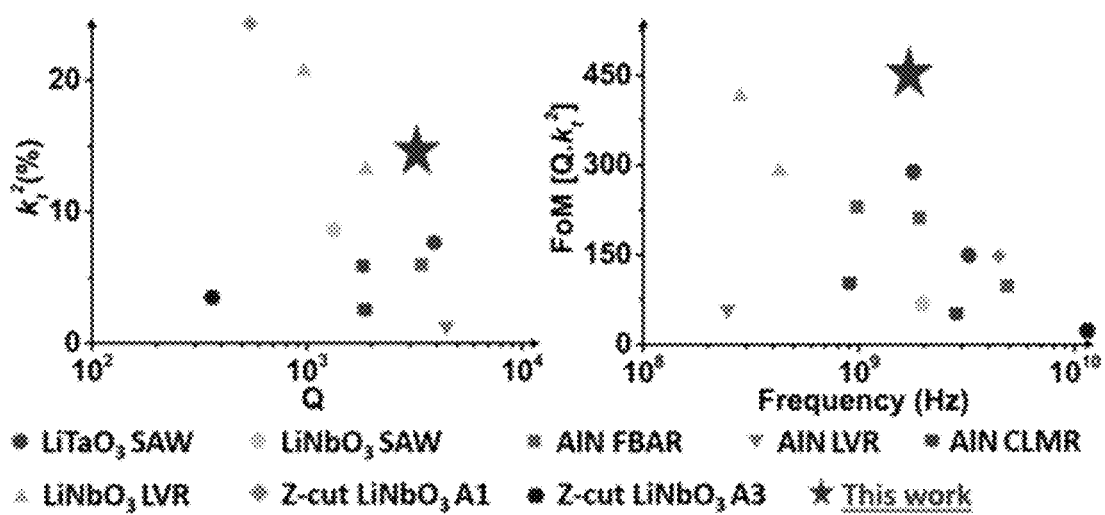
FIGS. 10A-10B are graphs illustrating a comparisons of acoustic piezoelectric MEMS resonators above 200 MHz, specifically regarding electromechanical coupling ($k_t^2$), quality factor (Q), figure of merit (FoM), and the operating frequency according to embodiments.

FIGS. 10A-10B are graphs illustrating a comparisons of acoustic piezoelectric MEMS resonators above 200 MHz, specifically regarding electromechanical coupling ($k_t^2$), quality factor (Q), figure of merit (FoM), and the operating frequency according to embodiments. As described, an A1-mode LiNbO$_3$ MEMS resonator can have a FoM as high as 435, an f·Q product of 5.1×10$^{12}$ Hz, and near spurious-free response at 1.65 GHz. A 1.65 GHz acoustic resonator can be implemented by micromachining a 1.2 μm-thick transferred Y-cut LiNbO$_3$ or LiTaO$_3$ thin film into a suspended resonator cavity with electrodes on top. Electrode optimization can suppress spurious modes and achieve high FoMs simultaneously. The A1-mode acoustic resonators in Y-cut piezoelectric thin film can have potential for enabling higher performance and broader bandwidth filters for 5G RF front-ends.

In response to a significant increase of mobile data due to video streaming, virtual reality, and Internet-of-Things (IoT), and the like, the wireless industry has moved towards 5G to overcome the limitations of existing wireless networks. To balance the needs for wide-area coverage and high data rates, 5G new radio (NR) has been proposed in the C-band (4-8 GHz) with a significant increase in fractional bandwidths (FBWs) that can be as high as 13%. Such a large FBW challenges the capabilities of the current RF front-end acoustic filters, the FBW of which remain less than (<) 5%. The constraints on FBWs arise from an electromechanical coupling ($k_t^2$) that can be achieved for a given Lamb mode in a given material. For instance, acoustic filters based on lithium tantalate (LiTaO$_3$) or lithium niobate (LiNbO$_3$) surface acoustic wave (SAW) resonators and aluminum nitride (AlN) bulk acoustic wave (FBAW) resonators typically have $k_t^2$<12%. Thus, it may be challenging to support the 5G NR requiring more than 5% FBW without resorting to lumped-element-based bandwidth-widening techniques.

To overcome the bottleneck of limited $k_t^2$, first-order asymmetric Lamb wave (A1) devices based on Z-cut and Y-cut LiNbO$_3$ and LiTaO$_3$ thin films should be considered. A1-mode resonators in Z-cut can have a Q of 527 and $k_t^2$ of 29% at 5 GHz, which can be sufficient to meet the bandwidth (BW) requirements of 5G bands in the sub-6 GHz range. However, the presence of spurious modes remain a bottleneck that can be addressed by high-performance A1-mode filters.

To address the above mentioned issues, C-band LiNbO$_3$ (or LiTaO$_3$) ladder filters based on the A1 mode (e.g., A1-mode acoustic resonators, such as described above, based on a piezoelectric thin film) can be used. To this end, spurious mode suppression and resonator frequency offset can be analyzed to provide acoustic filter designs. To validate the filter designs, as an illustrative example, acoustic resonators and filters can be fabricated on a 500 nm-thick Z-cut LiNbO$_3$ (or LiTaO$_3$) thin film. The fabricated acoustic resonators demonstrate a $k_t^2$ of 28% and a Q of 420. The fabricated acoustic filters have large FBWs (greater than 8.5%), low insertion loss (IL less than 2.7 dB), flat in-band group delays, and spurious-free responses.

In some embodiments, a class of microelectromechanical system (MEMS) C-band filters for 5G front-ends can be introduced. The filter can include acoustic resonators based on the first-order antisymmetric (A1) Lamb wave mode in thin film lithium niobate, similar to the acoustic filters described herein. In some embodiments, a filter design can have a center frequency at 4.5 GHz with a sharp roll-off, flat in-band group delay, and spurious-free response over a wide frequency range. In some embodiments, a filter design has a 3 dB fractional bandwidth (FBW) of 10%, an insertion loss (IL) of 1.7 dB, an out-of-band (OoB) rejection of −13 dB, and a compact footprint of 0.36 mm$^2$. In other embodiments, a filter design can have a 3 dB FBW of 8.5%, an IL of 2.7 dB, an OOB rejection of −25 dB, and a compact footprint of 0.9 mm$^2$, for example.

In some embodiments, the acoustic resonators used to build the acoustic filters can each include a piezoelectric thin film which may be disposed on a carrier substrate. In one embodiment, piezoelectric thin film is a Z-cut lithium niobate (LiNbO$_3$) or lithium tantalate (LiTaO$_3$) thin film adapted to propagate a first order antisymmetric (A1) mode excited by an electric field. In one embodiment, the piezoelectric thin film is composed of Z-cut LiNbO$_3$, which was the focus of study, but other cuts of LiNbO$_3$ or LiTaO$_3$ are envisioned, including an X-cut or a Y-cut of these piezoelectric materials. The Y-cut can, for example, be a more specific-angled Y-cut, to include 128° Y or 36° Y.

A set of pairs of interdigital transducers (IDTs) can be disposed on top of or suspended above the piezoelectric thin film. The piezoelectric thin film and the plurality of pairs of IDTs can form a resonator. An electric field can drive the resonator in the A1 mode. The first shunt resonator and the second shunt resonator can be designed to resonate at a first frequency, and the series resonator can be designed to resonate at a second frequency, different than the first frequency. In some embodiments, the ladder filter (e.g., an acoustic filter based on a ladder topology) can further include a second series resonator coupled in series between the second shunt resonator and the series resonator, as described in further detail with respect to FIGS. 11-17.

Figure 11A:
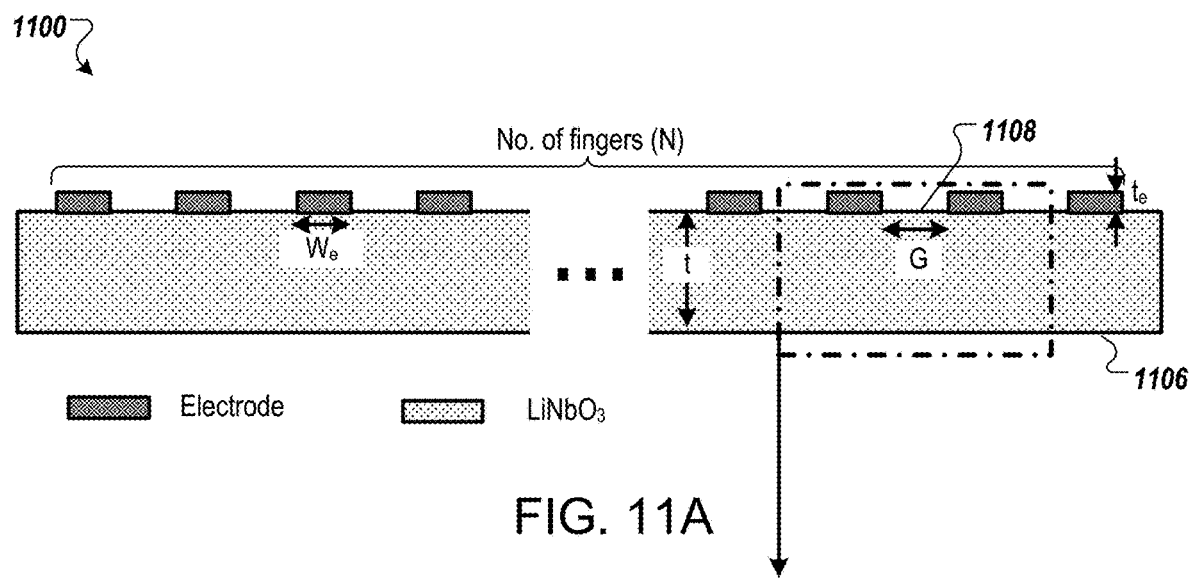
FIG. 11A is a schematic diagram of a cross sectional view of a Z-cut $LiNbO_3$ A1-mode acoustic resonator according to embodiments.

FIG. 11A is a schematic diagram of a cross sectional view of a Z-cut LiNbO$_3$ A1-mode acoustic resonator 1100 according to embodiments. In some embodiments, the acoustic resonator 1100 can be similar to the acoustic resonator 100 of FIG. 1. The IDTs include signal electrodes alternated with ground electrodes. The acoustic resonator 1100 includes a piezoelectric thin film 1106 that is suspended above a carrier substrate (not illustrated). In some embodiments, the piezoelectric thin film 1106 can be a Z-cut LiNbO$_3$ thin film or a Z-cut LiTaO$_3$ thin film that is adapted to propagate an acoustic wave in a Lamb mode, at least such as a first-order asymmetric (A1) mode. In other embodiments, the piezoelectric thin film 1106 can be a Y-cut LiNbO$_3$ thin film or a Y-cut LiTaO$_3$ thin film that is adapted to propagate an acoustic wave in a Lamb mode, at least such as a first-order asymmetric (A1) mode, a third-order asymmetric (A3) mode, or a seventh-order asymmetric (A7) mode. In some embodiments, the asymmetric modes can be antisymmetric modes.

In some embodiments, the acoustic mode is excited by a component of an electric field that is oriented in a longitudinal direction along a length of the piezoelectric thin film. The acoustic resonator 1100 includes a first signal electrode that is disposed on the piezoelectric thin film and oriented in a transverse direction that is perpendicular to the longitudinal direction. The acoustic resonator 1100 further includes a first ground electrode that is oriented in the transverse direction. The first ground electrode is separated from the first signal electrode by a gap (G) 1108, which is a longitudinal distance in which the acoustic wave resonates. As shown in FIG. 11A, a width of the electrodes (e.g., transducer electrodes, such as the signal electrodes and the ground electrodes) can be denoted as W e. The distance between electrodes can be denoted as L. A thickness of the piezoelectric thin film 1106 can be denoted as t, and a thickness of the electrodes (e.g., the signal electrodes and the ground electrodes) can be denoted as $t_e$.

The piezoelectric thin film 1106 can include a first release window located at a first end of the piezoelectric thin film 1106, and a second release window located at a second end of the piezoelectric thin film 1106. The piezoelectric thin film 1106 can further include a set of intermediate release windows located beyond ends of the signal electrodes and ground electrodes. In some embodiments, the intermediate release windows can be patterned in a periodic and/or regular manner.

Figure 11B:
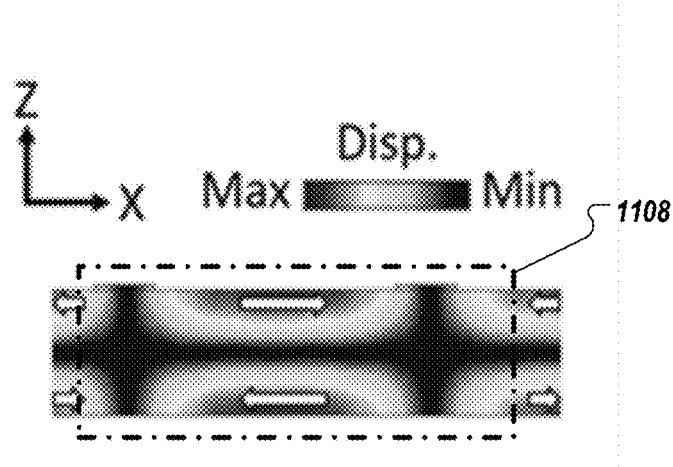
FIG. 11B is illustrates a displacement mode shape of a Z-cut $LiNbO_3$ A1-mode resonator according to some embodiments.

FIG. 11B is illustrates a displacement mode shape of a Z-cut LiNbO$_3$ A1-mode resonator according to some embodiments. Arrows denote the displacement directions. As seen in FIG. 11A and FIG. 11B, the A1 mode can be efficiently excited in a Z-cut LiNbO$_3$ thin film with top-only interdigital transducers (IDTs). However, the electric field excited by top-only IDTs within the piezoelectric thin film can have components that couple to the unwanted spurious modes near the A1 mode. To mitigate the spurious modes, the E-field distribution can be optimized by using an optimal electrode gap, for example, as described in reference to FIGS. 1-10.

Figure 12A:
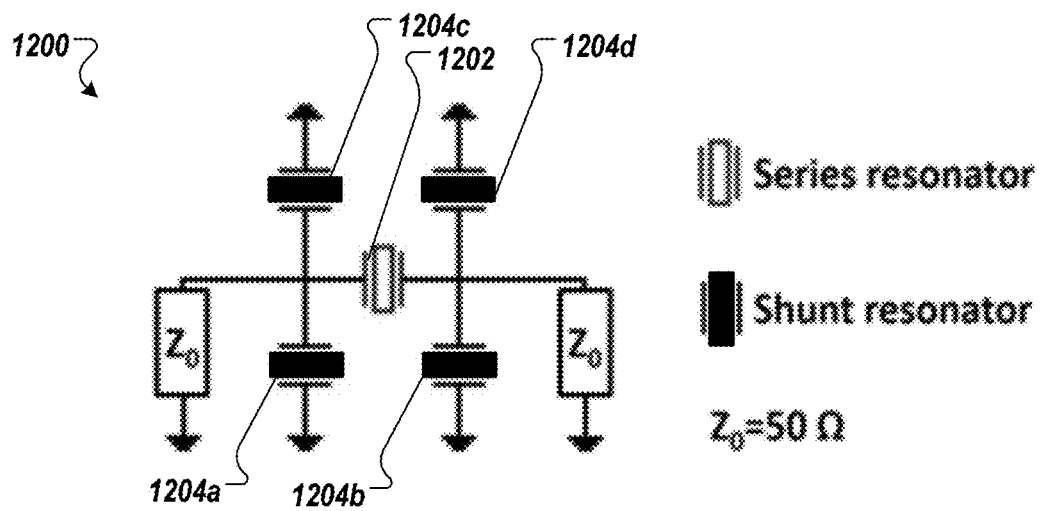
FIG. 12A is a schematic of a circuit diagram of a first ladder design for an acoustic filter according to some embodiments.

FIG. 12A is a schematic of a circuit diagram of a first ladder design for an acoustic filter 1200 according to some embodiments. The acoustic filter 1200 is based on shunt and series resonators (e.g., acoustic resonators) that are designed identically, except with different filter orders (e.g., parameters). Each of the series and shunt resonators can be optimized, as described above. With the optimized resonators, a simple ladder topology including of series and shunt resonators may be adopted for the filter demonstration. The series and shunt resonators can be the same or similar to the acoustic resonators 100 of FIG. 1A-1B or the acoustic resonator 1100 of FIG. 11A.

In at least one embodiment, the acoustic filter 1200 includes a first series resonator 1202 coupled with a ground potential. Shunt resonators 1204 are coupled in parallel with the series resonator 1202 and with the ground potential. For example, a first shunt resonator 1204a is coupled in parallel with the series resonator 1202 and with the ground potential, and a second shunt resonator 1204b is coupled in parallel with the series resonator 1202 and the ground potential. Further, a third shunt resonator 1204c is coupled in parallel with the series resonator 1202 and the ground potential, and a fourth shunt resonator 1204d is coupled in parallel with the series resonator 1202 and the ground potential. Impedance elements (Zo) are coupled between the resonators 1202 and 1204 and the ground potential.

Figure 12B:
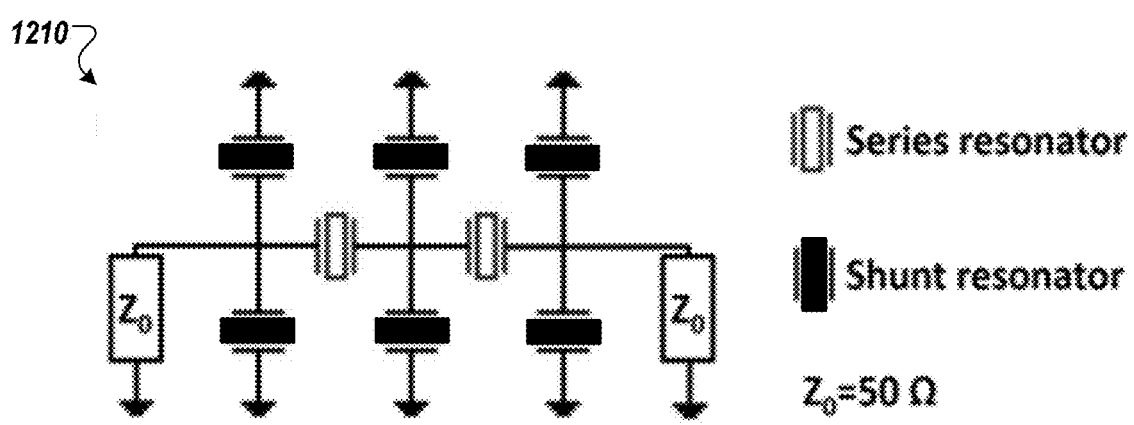
FIG. 12B is a schematic of a circuit diagram of a second ladder design for an acoustic filter according to some embodiments.

FIG. 12B is a schematic of a circuit diagram of a second ladder design for an acoustic filter 1210 according to some embodiments. In some cases, the acoustic filter 1210 can be considered as an extended embodiment of the acoustic filter 1200. In particular, the acoustic filter 1210 is similar to the acoustic 1200, with an additional series resonator, and two additional shunt resonators coupled in parallel with the ground potential.

The two acoustic filter designs 1200 (Design A) and 1210 (Design B) are expected to show a trade-off between insertion loss and out-of-band rejection. In order make a footprint of the acoustic filters compact and symmetric, each shunt resonator can be implemented with two identical resonators in parallel. The resonant frequencies of series and shunt resonators can be designed with a frequency offset between them, which approximately gives the bandwidth of the filter. To achieve the large bandwidth allowed by the $k_t^2$ of the standalone resonators, the frequency offset should approach the spectral separation between the series resonances and the anti-resonances. A single resonator has an admittance response for both maximum and minimum values. The series resonant frequency, $f_s$, corresponds to a frequency at which there is a maximum admittance, and the anti-resonant frequency, f p, corresponds to a frequency at which there is a minimum admittance. Further, a spectral separation between f s and f p is largely determined by the elecromechanical coupling, $k_t^2$.

Figure 13A:
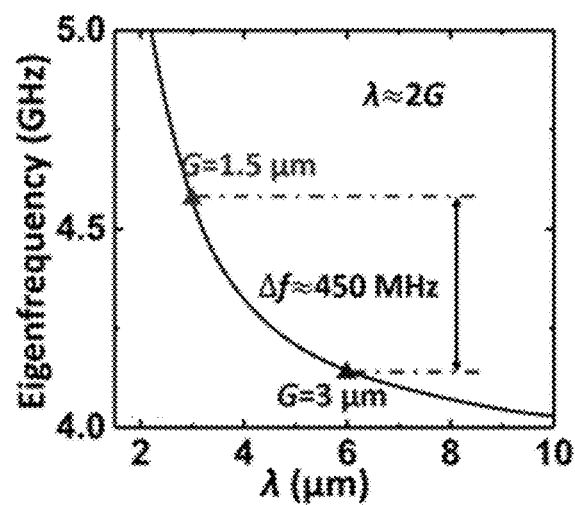
FIG. 13A is a graph illustrating a dispersion curve of an A1 mode in a 500 nanometer (nm)-thick Z-cut $LiNbO_3$ thin film according to some embodiments.

FIG. 13A is a graph illustrating a dispersion curve of an A1 mode in a 500 nm-thick Z-cut LiNbO₃ thin film according to some embodiments. The required resonant frequency offset can be attained by varying the electrode separation (G) as suggested by the dispersion of A1. Such a technique can permit a monolithic implementation of multi-frequency resonators required by the ladder topology as well as a lithography-based frequency trimming. In particular, monolithic refers to constructing the filter on a single piece of piezoelectric thin film, in such a way that only a portion or portions of the piezoelectric thin film are thinned, for example, in the portions over which the series resonators are located.

Based on the above analysis, the series and shunt resonators for C-band acoustic filters targeting a 10% FBW can be designed with the parameters listed in Table 3.

TABLE 3

| | Parameter | | | | | | |
|---|---|---|---|---|---|---|---|
| | t (nm) | $W_e$ (μm) | G (μm) | L (μm) | $t_e$ (nm) | N | $C_0$ (fF) |
| Series resonator | 500 | 0.5 | 1.5 | 80 | 50 | 50 | 380 |
| Shunt resonator | 500 | 1.5 | 3 | 80 | 50 | 80 | 320 |

A thickness (t) of the piezoelectric thin film can be set to 500 nm to predominately set the filter center frequency to 4.5 GHz. The electrode separation (e.g., gaps (G)) can be set to between approximately 1.5 and 3 μm for series and shunt resonators respectively to suppress most significant spurious modes while providing the required frequency offset of 450 MHz for achieving the 10% FBW as shown in FIG. 13A. As can be seen in FIGS. 12A-12B, the shunt resonators are neighboring the series resonator(s) and as shown by Table 3, the gap (e.g., the longitudinal distance) for the series resonator can be dimensioned to be less than the gap for the shunt resonator. As can be seen by the labels in FIGS. 15C and 15D, a longitudinal distance (e.g., gap) of the series resonator is approximately half of a longitudinal distance of the shunt resonator. In some embodiments, as depicted, the longitudinal distance of the series resonator can be another value (other than half) that is less than the longitudinal distance of the shunt resonator.

Figure 13B:
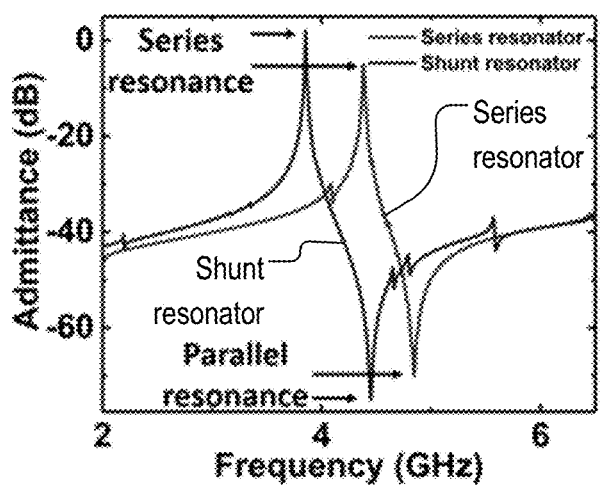
FIG. 13B is a graph illustrating simulated admittance responses of series and shunt resonators according to some embodiments.

FIG. 13B is a graph illustrating simulated admittance responses of series and shunt resonators according to some embodiments. In addition to selecting optimal values for G, an optimal ratio of W e to G may also be required to mitigate spurious modes without simultaneously inducing a large electrical loss from an excessively small W e. In some embodiments, the ratio of the electrode width to the gap (e.g., the longitudinal distance between adjacent electrodes) can be between 0.25 and 7.5. To balance the loss and spurious considerations, W e may be set to be 0.5 μm and 1.5 μm respectively for the series and shunt resonators. Further, to attain an adequate static capacitance, $C_0$, for matching to 50Ω and sufficient out-of-band rejections, the numbers of electrodes may be increased to 50 and 80 respectively for series and shunt resonators, and the lengths of the resonators may be set to approximately 80 μm. As seen in FIG. 13B, the COMSOL simulated admittance responses of the designed series and shunt resonators confirm an intended frequency offset of 450 MHz as well as damped responses of the spurious modes.

Figure 14A:
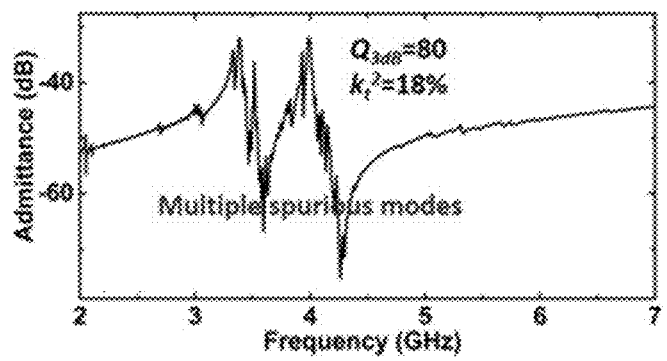
FIG. 14A is a graph illustrating a measured admittance of an un-optimized A1-mode acoustic resonator, showing multiple significant spurious modes according to some embodiments.
Figure 14B:
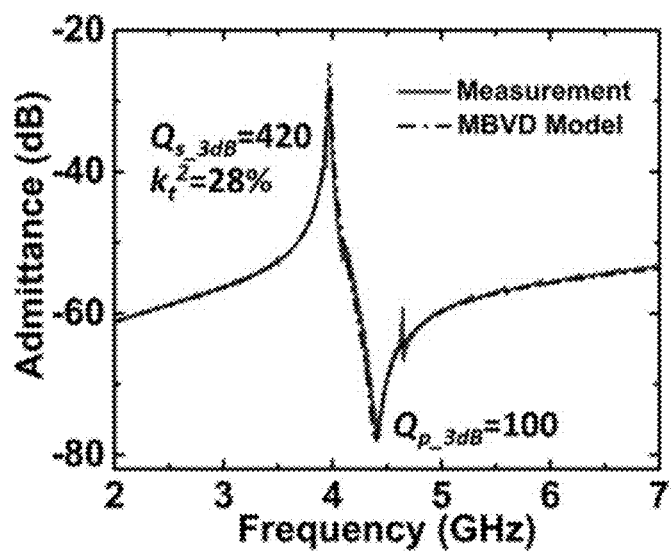
FIG. 14B is a graph illustrating a measured admittance of an optimized A1-mode acoustic resonator with spurious modes that are damped and a simultaneously enhanced $k_t^2$ and Q according to some embodiments.

FIG. 14A is a graph illustrating a measured admittance of an un-optimized A1-mode acoustic resonator, showing multiple significant spurious modes according to some embodiments. FIG. 14B is a graph illustrating a measured admittance of an optimized A1-mode acoustic resonator with spurious modes that are damped and a simultaneously enhanced $k_t^2$ and Q according to some embodiments. To demonstrate the resonator designs, the optimized resonators and filters can be fabricated on a 500 nm transferred Z-cut LiNbO₃ thin film. The effectiveness of the design on spurious mode mitigation is highlighted by a comparison between the measured admittance responses of an un-optimized and an optimized A1-mode resonator, shown by FIG. 14A and FIG. 14B respectively. The optimized design (FIG. 14B) shows notable suppression of spurious modes with both $k_t^2$ and Q enhanced.

Figure 14C:
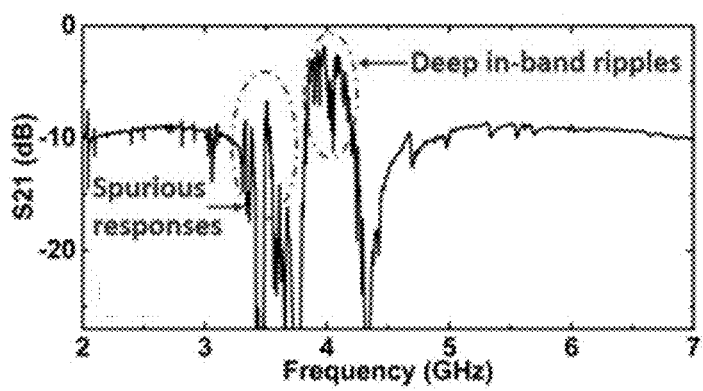
FIG. 14C is a graph illustrating a measured performance of an acoustic filter with un-optimized resonators, as described with respect to FIG. 14A, according to some embodiments.

FIG. 14C is a graph illustrating a measured performance of an acoustic filter with un-optimized resonators, as described with respect to FIG. 14A, according to some embodiments. The measured response of a fabricated filter without applying spurious suppression is shown in order to indicate that unattended spurious modes can lead to deep in-band ripples and out-of-band responses and thus poor filter performance.

FIGS. 15A-15B are optical microscope images of a Design A and a Design B filter of FIG. 12A and FIG. 12B, respectively, according to an embodiment. Since the A1 mode has a negligible difference in propagation characteristics along the X and Y axes, the series resonators (indicated by a dashed line) and shunt resonators (indicated by a solid line) are oriented along X- and Y-axes respectively to attain a more compact footprint without degrading performance. The overall footprints for the Design A and the Design B acoustic filters are 0.36×1 mm² and 0.64×1.4 mm², respectively.

FIGS. 15C-15D are zoomed-in scanning electron microscope (SEM) images of a series resonator and a shunt resonator, respectively, according to an embodiment. The electrode separation and width of the series and shunt resonators are labeled in the zoom-in SEM images FIGS. 15C and 15D.

Figure 16A:
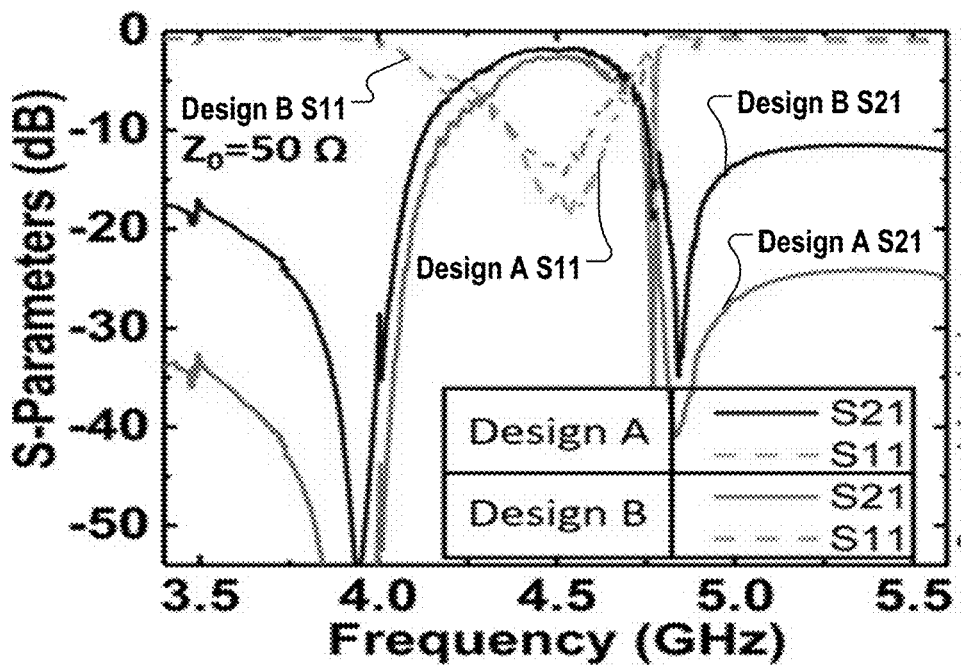
FIG. 16A is a graph illustrating a measured performance of the fabricated Design A acoustic filter (of FIG. 15A) and the fabricated Design B acoustic filter (of FIG. 15B) according to an embodiment.

FIG. 16A is a graph illustrating a measured performance of the fabricated Design A acoustic filter (of FIG. 15A) and the fabricated Design B acoustic filter (of FIG. 15B) according to an embodiment. In the present case, the measurements were done with a 50Ω system impedance. Design A shows an IL of 1.7 dB, a 3-dB FBW of 10%, and an out-of-band rejection of −13 dB, while the Design B shows an IL of 2.7 dB, a 3-dB FBW of 8.5%, and an out-of-band rejection of −25 dB. The measured return loss at the center frequency is below −10 dB, which shows a good match to 50Ω without using additional helper circuits. For Designs A and B, the 4 dB-FBWs, defined as the fractional frequency range over which IL is below 4 dB, are 8.7% and 6% respectively.

Figure 16B:
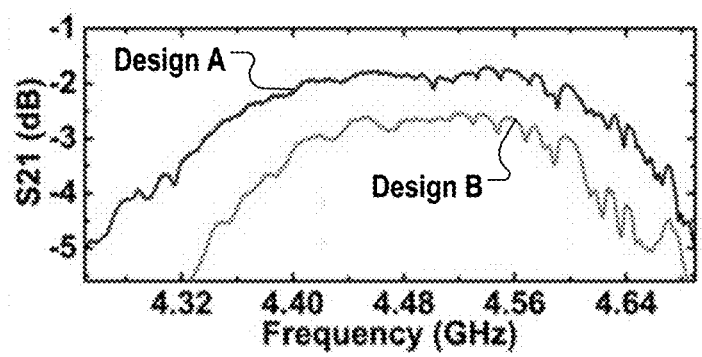
FIG. 16B is a graph illustrating a zoomed-in response of intended passbands according to some embodiments.

FIG. 16B is a graph illustrating a zoomed-in response of intended passbands according to embodiments. The magnitude of in-band IL ripples is around 0.5 dB, which is smaller than the measured results shown in FIG. 14B due to the spurious mode suppression. Additionally, a flat in-band group delay can also be achieved.

Figure 16C:
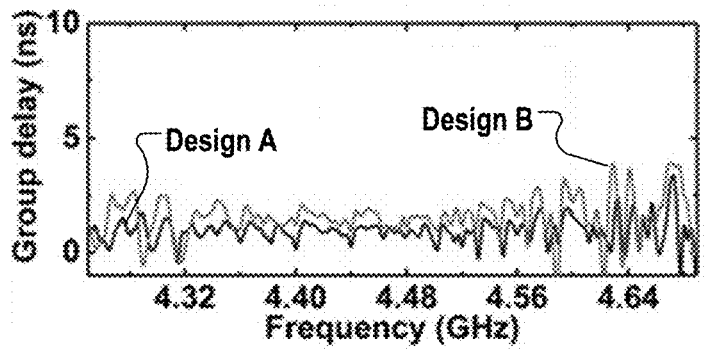
FIG. 16C is a graph illustrating a measured in-band group delay according to an embodiment.

FIG. 16C is a graph illustrating a measured in-band group delay according to an embodiment. The group delay variations over the entire passband are around 3 ns, which is sufficiently small to avoid RF signal distortion. It should be noted that all responses of FIGS. 16A-16C are measured with 50Ω terminations. Some of the measured parameters of the fabricated filters are shown in Table 4 below.

TABLE 4

| | Parameter | | | | |
|---|---|---|---|---|---|
| | $f_0$ | FBW | IL | OoB rejection | In-band ripples | Group delay |
| Design A | 4.5 GHz | 10% | 1.7 | <−13 dB | <0.5 dB | <3 ns |
| Design B | 4.5 GHz | 8.5% | 2.7 | <−25 dB | <0.7 dB | <4 ns |

Figure 17A:
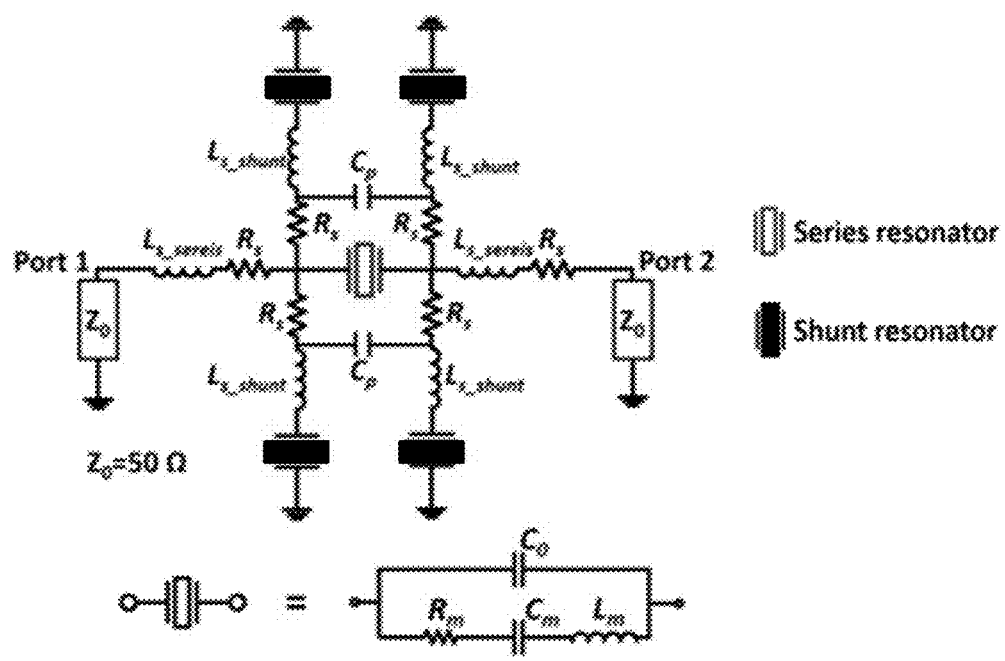
FIG. 17A is a schematic diagram of an equivalent circuit model that accounts for electromagnetic (EM) effects according to some embodiments.

FIG. 17A is a schematic diagram of an equivalent circuit model that accounts for electromagnetic (EM) effects according to some embodiments. To analyze the performance and identify the methods for further improvements, an equivalent circuit model can be constructed to interpret the measurement result. The electromagnetic (EM) effects can be accounted for by including the surface resistance ($R_s$) and inductance ($L_{s\_series}$ and $L_{s\_shunt}$) associated with electrodes and leading lines. A parasitic capacitance C p can be added as the feedthrough capacitance to account for parasitic effects. Performance of each fabricated series or shunt resonator in the filter can also be taken into consideration for constructing the equivalent circuit model. Based on the measured Qs of the fabricated standalone acoustic resonators, which can range from 150 to 420, it can be assumed that the Qs of the series and shunt resonators in the measured filters are on average around 200.

Figure 17B:
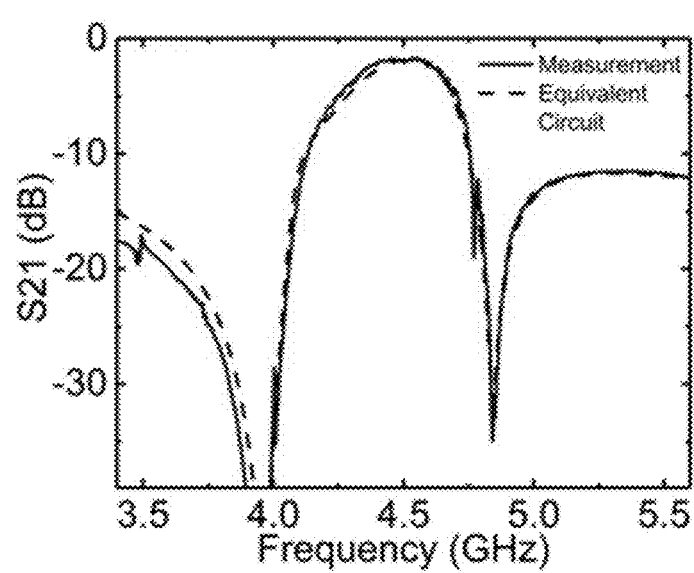
FIG. 17B is a graph that shows a comparison between measured and simulated responses based on the equivalent circuit model of FIG. 17A according to some embodiments.

FIG. 17B is a graph that shows a comparison between measured and simulated responses based on the equivalent circuit model of FIG. 17A according to some embodiments. The simulated response based on the equivalent circuit model shows good agreement with the measured response. Some of the parameters are listed in Table 5. Based on the above analysis, an optimized fabrication process that can further increase the yield of high-performance resonators can be used to obtain even higher performance filters. In addition, the designs with smaller $R_s$, $L_{s\_series}$, $L_{s\_shunt}$, and C p can also be beneficial.

TABLE 5

| | Parameter | | | | | |
|---|---|---|---|---|---|---|
| | Q | $R_s$ | $L_{s\text{-}series}$ | $L_{s\text{-}shunt}$ | $C_p$ | IL |
| Value | 200 | 4 Ω | 0.2 nH | 0.3 nH | 15 fF | 1.7 dB |

As the sub-6G spectrum becomes increasingly crowded with applications, the frequencies beyond 6 GHz for new spectral venues can be used to advance wireless capabilities. Several bands ranging from 12 GHz to 27 GHz can share similar challenges in scaling conventional front-end components beyond their current operating frequencies. Front-end components that are particularly difficult to scale in frequency include acoustic filters that have been commercially successful for 4G. Frequency scaling without compromising performance can be difficult due to various technical bottlenecks in material integration, device fabrication, and filter design for acoustic filters.

Scaling approaches can be classified into two categories. The first type resorts to the reduction in feature size (e.g., electrode width or longitudinal mode or film thickness for thickness mode devices) in order to increase the center frequency. However, excessive thickness or feature size reduction can lead to poor film quality for the acoustic material and/or higher electrode resistance, and consequently may result in higher insertion loss (IL), degraded power handling, and more severe non-linearity. The second type of approach is referred to as overmoding and adopts higher orders of acoustic resonant modes while maintaining the sizes of the resonant cavity and other device features in the process of scaling. These approaches suffer from a loss of electromechanical coupling which scales inversely with the square of the frequency ($k_t^2 \sim 1/f^2$ in scaling) and hence such acoustic filters may suffer from a trade-off of FBW for a higher center frequency. In particular, scaling 4G acoustic filters based on surface-acoustic-wave (SAW) and film-bulk-acoustic-resonators (FBAR) towards frequencies as high as 20 GHz and beyond by overmoding may be more penalizing than rewarding. Their electromechanical coupling of respectively 10% and 6.5% may be reduced too significantly to be applicable towards anything other than extreme narrowband applications.

Some asymmetric Lamb wave micro-acoustic resonators based on LiNbO$_3$ can have a significantly larger $k_t^2$ of 30%, and thus can allow for better a better trade-off between $k_t^2$ and frequency scaling. Some higher-order asymmetric resonators can work up to 30 GHz with Qs of 400 and filter up to 10 GHz with IL of 3 dB. The fractional bandwidth (FBW) of a 10 GHz acoustic filter is approximately 0.7% due to the aforementioned design trade.

To overcome the $k_t^2$ loss in scaling and recover the FBW loss, acoustic and electromagnetic (EM) structures can be used in tandem and combined to enhance the FBW while still harnessing the small-size and high Q in the acoustics domain. The principle involves using the acoustic resonant frequency of an acoustic resonator in conjunction with an inductive element for constructing a ladder filter. The inductor can simultaneously recover some of the $k_t^2$ loss, enhance the FBW, and introduce an additional anti-resonance without harshly compromising the IL and roll-off of the filter. Its effect has been similarly explored using the framework of coupled modes for lower-frequency hybrid filters that combine acoustic resonator with inadequate $k_t^2$ and lumped elements. However, lower frequencies, the benefits of this approach may come at the expense of larger sizes as substantial inductances are typically needed.

To address the above issues, a hybrid filter can be designed that combines chip-scale reactive elements with a seventh-order asymmetric (A7) mode LiNbO$_3$ resonator at 19 GHz. As a result, an acoustic filter can have a 2.4% FBW while using only acoustic resonators with a 0.7% $k_t^2$ and occupying a small physical footprint of 1.4 mm$^2$.

In some embodiments, an acoustic filter can include a first impedance element and a second impedance element. A first parallel resonance circuit can be coupled to the first impedance element and a second parallel resonance circuit can be coupled to the first parallel resonance circuit. A first series resonance circuit can be coupled between the second parallel resonance circuit and the first parallel resonance circuit. A third parallel resonance circuit can be coupled to the second parallel resonance circuit. A fourth parallel resonance circuit can be coupled to the second impedance element. A second series resonance circuit can be coupled between the fourth parallel resonance circuit and the third parallel resonance circuit. Each parallel resonance circuit and each series resonance circuit can include a piezoelectric thin film disposed on or suspended above a carrier substrate. The piezoelectric thin film can be a Z-cut lithium niobate ($LiNbO_3$) thin film adapted to propagate a seventh order antisymmetric (A7) mode excited by an electric field. A plurality of pairs of interdigital transducers (IDTs) m can be disposed on the piezoelectric thin film. The piezoelectric thin film and the plurality of pairs of IDTs can form an acoustic resonator. The electric field can drive the resonator in the A7 mode. A shunt inductor can be coupled in parallel to the resonator. The shunt inductor can increase a spectral separation between a first anti-resonant frequency of the resonator and a second anti-resonant frequency of the resonator.

FIG. 18A is a cross-sectional view of a thin-film Z-cut $LiNbO_3$ resonator with multiple interdigital electrodes according to some embodiments.

FIG. 18B is a top view of the thin-film Z-cut $LiNbO_3$ resonator with multiple interdigital electrodes according to some embodiments. The resonator of FIG. 18B can represent both shunt and series resonators. The resonator can include a first release window located at a first location of the acoustic resonator and a second release window located at a second location of the acoustic resonator, the second location being separated from the first location a longitudinal distance in a longitudinal direction along a length of the acoustic resonator. The resonator further includes a set of signal electrodes coupled to a signal bus line oriented in the longitudinal direction, with the set of signal electrodes being oriented in a transverse direction perpendicular to the longitudinal direction as well as a set of ground electrodes coupled to a ground bus line oriented in the longitudinal direction and the plurality of ground electrode being oriented in the transverse direction.

The signal bus line includes a first intermittent release window located beyond a distal end of a number of the set of ground electrodes as well as a ground bus line including a second intermittent release window located beyond a distal end of a number of the set of signal electrodes.

FIG. 18C is a displacement mode shape of a seventh-order antisymmetric (A7) Lamb wave mode according to embodiments. The resonant frequency of the asymmetric Lamb wave mode can be simultaneously governed by the mode order (m), film thickness (t) (of the piezoelectric thin film), the separation between adjacent interdigital electrodes (l), and the acoustic phase velocities in the vertical ($v_t$) and longitudinal ($v_L$) directions which can be expressed by:

$$f_{r,m} = \sqrt{\left(m\frac{v_t}{2t}\right)^2 + \left(\frac{v_L}{2l}\right)^2} \quad (3)$$

In some embodiments, a t of 650 nm and l of 3 μm can be used in the following description relating to FIGS. 19-22, as an illustrative example in order to consider the power handling and fabrication capability. In order for the resonator to operate in the K-band (e.g., a radio frequency band ranging from approximately 18 GHz to 27 GHz), the A7 mode can be selected. The ratio of the electromechanical coupling $k_t^2$ of a higher-ordered asymmetric mode to that of an A1-mode is inversely proportional to the square of the mode number, m. A simple ladder acoustic filter can have an FBW that narrows at a rate that is inversely proportional to the square of the center frequency. As a result, a ladder filter constructed with A7-mode acoustic resonators can have an FBW of approximately 0.35%.

Figure 19A:
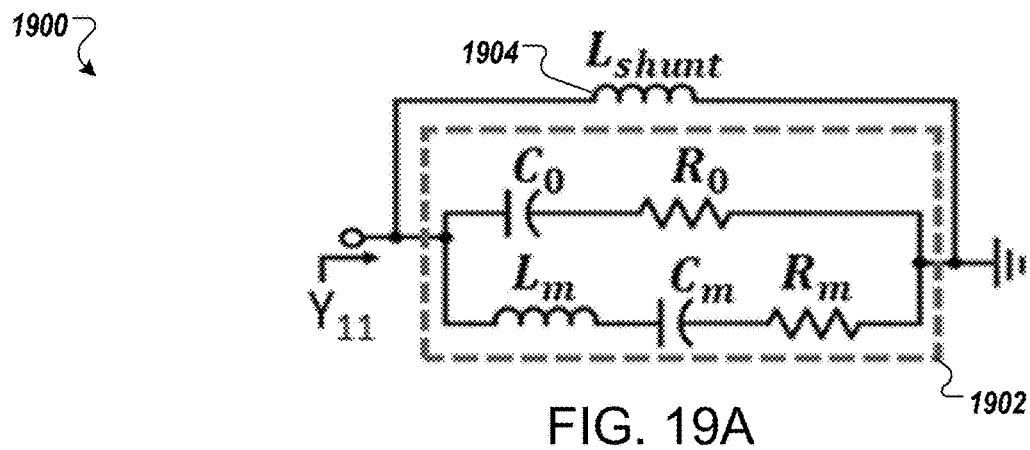
FIG. 19A is a schematic diagram of an equivalent circuit model of a resonator with a shunt inductor ($L_{shunt}$) coupled in parallel with the resonator according to some embodiments.

FIG. 19A is a schematic diagram of an equivalent circuit model 1900 of a resonator 1902 with a shunt inductor ($L_{shunt}$) 1904 coupled in parallel with the resonator 1902 according to some embodiments. Connecting a shunt inductor, such as the shunt inductor 1904, to an acoustic resonator, such as the acoustic resonator 1902, can enlarge the spectral separation between the series and parallel resonant frequencies of the circuit. This has an equivalent effect to the effect of increasing the $k_t^2$ of the resonator but without the benefit of a larger impedance ratio ($Z_{as}/Z_s$). Such an effect can be modelled by representing the acoustic resonator with a Modified Butterworth-Van Dyke (MBVD) model in a circuit including the acoustic resonator 1902 and the shunt inductor 1904 as shown in FIG. 19A. In FIG. 19A, $L_{shunt}$ denotes the inductance of the shunt inductor, $C_0$ denotes the static capacitance, $R_0$ represents the loss in the piezoelectric thin film (e.g., the $LiNbO_3$ film), and $R_m$, $C_m$, and $L_m$ electrically represent the motional branch and mechanical resonance.

Figure 19B:
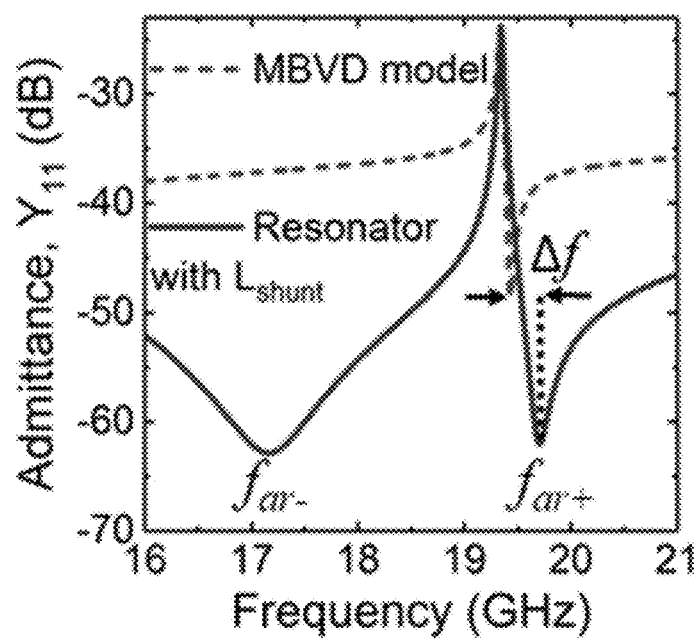
FIG. 19B is a graph illustrating admittances of an acoustic resonator with and without a shunt inductor, according to some embodiments.

FIG. 19B is a graph illustrating admittances of an acoustic resonator with and without a shunt inductor, according to some embodiments. The admittance of the circuit (e.g., the acoustic resonator coupled with the shunt inductor) is represented by the solid line, and the admittance of the acoustic resonator without the shunt inductor is represented by the dotted line in FIG. 19B. The anti-resonant frequency ($f_{ar+}$) (e.g., an anti-resonant frequency) of the circuit can be shifted by $L_{shunt}$ to a higher frequency than the anti-resonant frequency of the acoustic resonator ($f_{ar}$), which may produce a larger BW that can be similarly achieved with a higher $k_t^2$ acoustic resonator. The inclusion of $L_{shunt}$ also induces an additional anti-resonant frequency at a lower frequency ($f_{ar-}$) that may result from a second solution where $L_{shunt}$ and $L_m$ collaboratively tune out $C_m$ and $C_0$.

The resonant frequency ($f_r$) and anti-resonant frequency ($f_{ar+}$) of the circuit can be theoretically calculated. Due to the low loss tangent of $LiNbO_3$, the influence of substrate loss on $f_r$ and $f_{ar+}$ may be negligible, and the input admittance ($Y_{11}$) looking into the port shown in FIG. 19B can be expressed by:

$$Y_{11} = \frac{\frac{L_m}{C_0} - \frac{1}{\omega^2 C_0 C_m} - \omega^2 L_m L_{shunt} + L_{shunt} \cdot \left[\frac{1}{C_m} + \frac{1}{C_0}\right]}{j\omega L_{shunt} \cdot \left[\frac{L_m}{C_0} - \frac{1}{\omega^2 C_0 C_m}\right]} \quad (4)$$

where $f_r$ is the frequency at which the denominator equates zero, and $f_{ar+}$ are the frequencies at which the numerator equates zero.

Figure 19C:
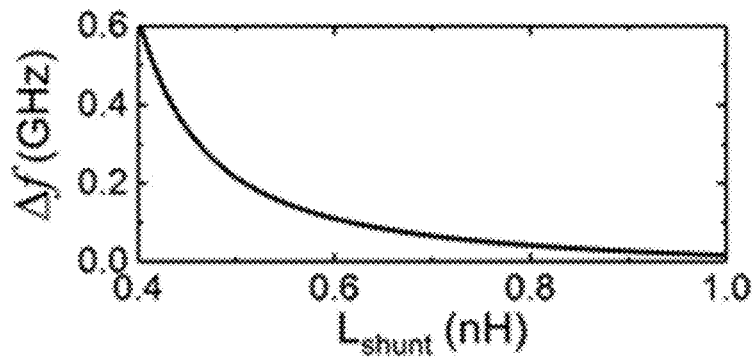
FIG. 19C is a graph illustrating a spectral offset of the anti-resonance frequency (Δf) as a function of the shunt inductance ($L_{shunt}$), according to embodiments.

FIG. 19C is a graph illustrating a spectral offset of the anti-resonant frequency frequency (Δf) as a function of the shunt inductance ($L_{shunt}$), according to embodiments. The closed-form expressions of $f_r$ and $f_{ar+}$ are:

$$f_r = \frac{1}{2\pi\sqrt{L_m C_m}} \quad (5)$$

-continued $$f_{ar\pm} = \frac{1}{2\pi}\sqrt{\frac{b \pm \sqrt{b^2 - 4L_m L_{shunt} C_0 C_m}}{2L_m L_{shunt} C_0 C_m}} \quad (6)$$

$$b = L_m C_m + L_{shunt}(C_m + C_0) \quad (7)$$

where Δf is defined as the spectral separation between the $f_{ar+}$ and $f_{ar-}$. FIG. 19C shows the spectral offset of the anti-resonant frequency as a function of the shunt inductance for a resonator at 19.15 GHz with $k_t^2$ of 0.7%, and $C_0$ of 114 femtofarads (fF). Such a curve can be used to determine the $L_{shunt}$ value during the filter design for a target Δf.

To take advantage of the benefit of a virtually increased $k_t^2$ of a resonator by the addition of a shunt inductor for constructing a filter with wider FBW, the offset between the resonant frequency of series and parallel resonators can be increased by Δf. This can create a challenge in the implementation of the design, since adjusting the longitudinal dimensions of the interdigital electrodes only gives a limited amount of offset. However, trimming the film thickness may be more favorable, which as seen in Eq. 3, dominantly affects the resonant frequency. This is a first demonstration of a monolithic technique to create an increased resonant frequency offset. In particular, monolithic refers to constructing the filter on a single piece of piezoelectric thin film, in such a way that only a portion or portions of the piezoelectric thin film are thinned.

Figure 20A:
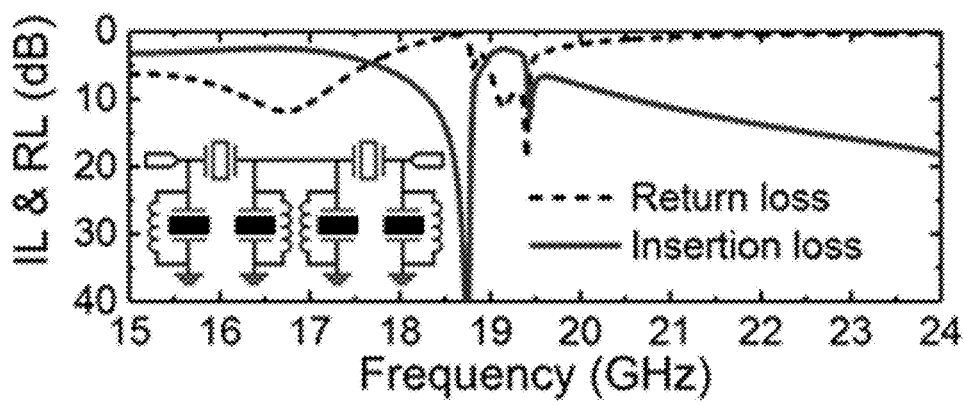
FIG. 20A is a graph illustrating a simulated insertion loss (IL) and return loss (RL) of a filter composed of parallel resonators with shunt inductors ($L_{shunt}^P$) and stand-alone series resonators as seen in the inset according to some embodiments.

FIG. 20A is a graph illustrating a simulated insertion loss (IL) and return loss (RL) of a filter composed of parallel resonators with shunt inductors ($L_{shunt}^P$) and stand-alone series resonators as seen in the inset according to some embodiments. A filter can be constructed with only shunt inductors ($L_{shunt}^P$) connected to the parallel resonators, and as can be seen in FIG. 20A, the stop-band filter performance is deteriorated. To improve the stop-band filter performance, shunt inductors ($L_{shunt}^S$) may be connected to series resonators to decrease the admittance through the series branch in the stop-band, as shown in FIG. 20B.

Figure 20B:
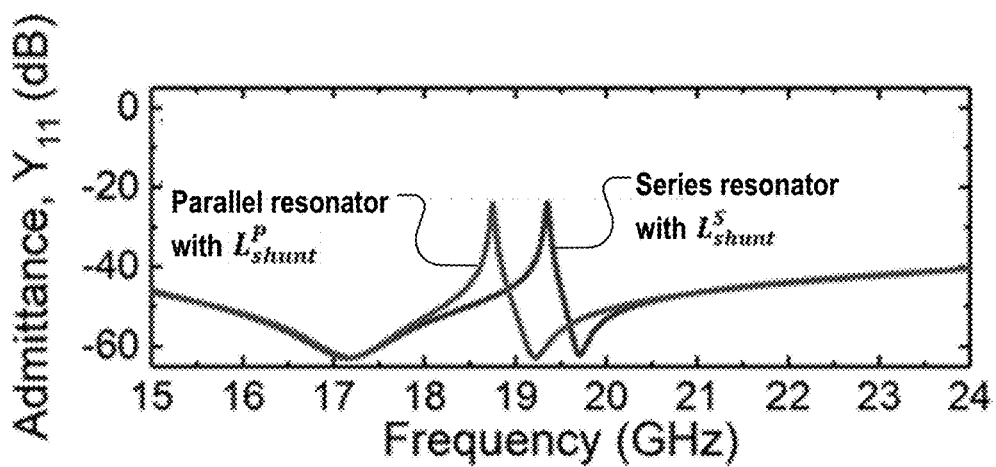
FIG. 20B is a graph illustrating admittances of parallel resonators and series resonators, both with shunt inductors coupled in parallel according to some embodiments.

FIG. 20B is a graph illustrating admittances of parallel resonators and series resonators, both with shunt inductors coupled in parallel according to some embodiments. As a result of coupling shunt inductors to each of the resonators, most of the input power can be reflected in stop-band due to impedance mismatching.

Figure 20C:
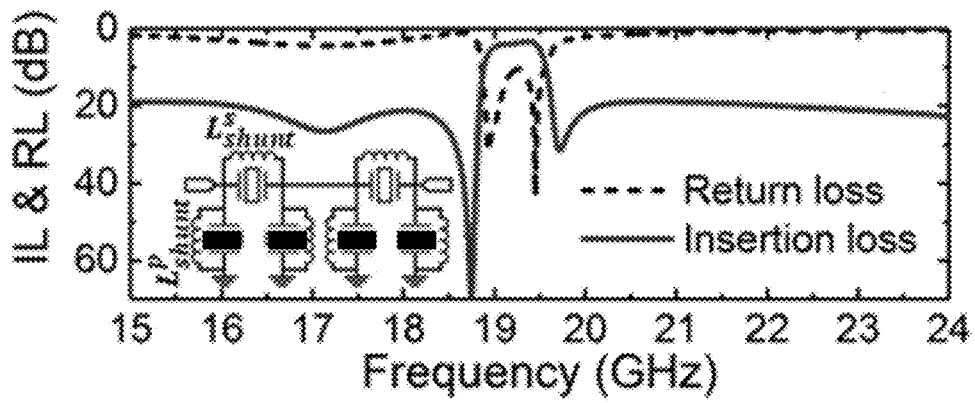
FIG. 20C is a graph illustrating a spectral offset of the anti-resonance frequency (Δf) versus $L_{shunt}$ according to some embodiments.

FIG. 20C is a graph illustrating a spectral offset of the anti-resonant frequency frequency (Δf) versus $L_{shunt}$ according to some embodiments. In some embodiments, parameters relating to the shunt inductor coupled to the parallel resonators and the shunt inductor coupled to the series resonators are different. For example, a length of the parallel shunt inductor can be dimensioned to be greater than a length of the series shunt inductor. Further, a diameter of the parallel shunt inductor can be the same as a diameter of the series shunt inductor. In other embodiments, however, the diameter of the parallel shunt inductor can be dimensioned to be different (e.g., less than or greater than) a diameter of the series shunt inductor.

As illustrated, the stop-band performance is improved by the inclusion of shunt resonators in parallel with the series resonators. A few design parameters in the circuit models relating to FIGS. 20A-20C are listed in Table 6 below.

TABLE 6

| | Frequency (GHz) | Resonator Q | $C_0$ (fF) | $k_t^2$ | $R_m$ (Ω) | $C_m$ (fF) | $L_m$ (nH) | $L_{shunt}$ (nH) | Inductor Q |
|---|---|---|---|---|---|---|---|---|---|
| Parallel Resonator | 18.75 | 500 | 125 | 0.7% | 23.93 | 0.709 | 101.5 | 0.77 | 30 |
| Series Resonator | 19.15 | 500 | 114 | 0.7% | 25.70 | 0.647 | 106.8 | 0.66 | 30 |

At high frequencies, the self-inductance from the lead lines and electrodes of a MEMS resonator may no longer negligible. Along with the static capacitance, it can introduce a self-resonance that can mask acoustic resonant response. Consequently, the power transmitted through the mechanical coupling between the interdigital electrodes may be significantly reduced.

The self-resonance frequency of a MEMS resonator can depend on a number of parameters, including at least the number of electrodes as well as the electrode length, width, and separation. To predict and increase the self-resonance, the high-frequency EM response from the electrode layout of the acoustic resonator may be studied with a simulation, such as Momentum simulation or the like. Since a target operating frequency of the acoustic filter is approximately 19 GHz, an electrode layout with an electrical self-resonance around 40 GHz can be targeted for mitigating its influence on the filter performance.

In addition to the self-inductance, the parasitic effects and couplings in the layout can also be significant, and should be considered in the filter design. Therefore, the co-design of the filter layout can be done by first performing simulations (such as EM simulations in Momentum) and then adding motional branches derived from acoustic FEA to fully capture effects in layouts and acoustics in Advanced Design System (ADS). The $C_0$ and $R_0$ from EM simulations are consistent with those from COMSOL-based FEA. The design parameters of the filter are listed in Table 7. The physical dimensions ($l_s$ and $w_s$) of $L_{shunt}^S$ are marked in FIG. 22B. In some embodiments, parameters relating to the shunt inductor coupled to the parallel resonators and the shunt inductor coupled to the series resonators are different. For example, a length of the parallel shunt inductor can be dimensioned to be greater than a length of the series shunt inductor. Further, a diameter of the parallel shunt inductor can be the same as a diameter of the series shunt inductor. In other embodiments, however, the diameter of the parallel shunt inductor can be different (e.g., less than or greater than) a diameter of the series shunt inductor.

TABLE 7

| Design Parameter | Dimension |
|---|---|
| Electrode length | 55 μm |
| Electrode width | 3 μm |
| Electrode separation | 3 μm |
| Number of electrodes | 40 |
| Side length of $L_{shunt}^P$ | 337 μm |
| Width of $L_{shunt}^P$ | 20 μm |

TABLE 7-continued

| Design Parameter | Dimension |
| --- | --- |
| Side length of $L_{shunt}^s$ ($l_s$) | 282 μm |
| Width of $L_{shunt}^s$ ($w_s$) | 20 μm |

Figure 21A:
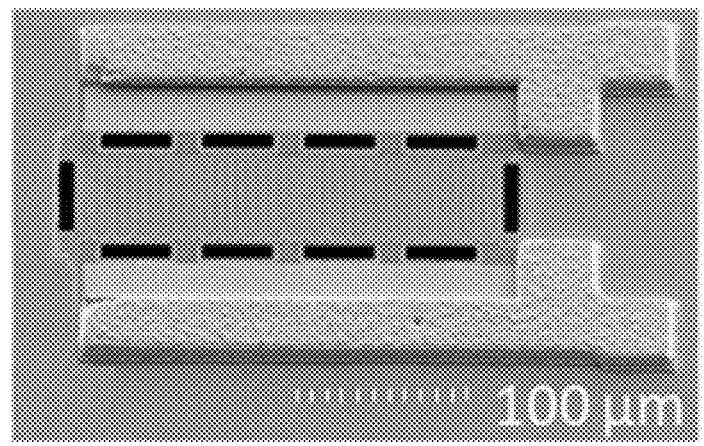
FIG. 21A is an SEM image of a fabricated acoustic resonator, according to one embodiment.

FIG. 21A is an SEM image of a fabricated acoustic resonator, according to one embodiment. The resonators can be fabricated with a standard thin-film LiNbO$_3$ MEMS resonator fabrication process on a 650 nm thick thin film Z-cut LiNbO$_3$ on a high resistivity silicon (Si) wafer. The desired offset between the resonant frequencies of series and parallel resonators can be achieved by regionally thinning the LiNbO$_3$ (or LiTaO$_3$) film where the series resonators are situated. Such a technique can permit shifting the resonant frequency to a higher frequency. The film can be thinned down from 650 nm to 620 nm, creating a resonant frequency offset of 400 MHz. Further, to reduce electric loss, the inductors, lead lines, and probing pads (i.e., regions other the acoustic resonator cavity) can be thickened with an additional step of copper electroplating, as seen in FIG. 21A. In some embodiments, the piezoelectric thin film where the series resonators are located can each be regionally thinned compared to a neighboring resonator, such as a shunt resonator or other resonator that is connected to the series resonator. This can increase the resonant frequency of the series resonator compared to a resonant frequency of a neighboring (e.g., shunt) resonator. In addition, the inductors (as shown in FIG. 21D) can also be suspended to reduce the substrate loss caused by the magnetically induced Eddy current in the Si substrate. For performance diagnosis purposes, structures, such as a stand-alone resonator with and without a shunt inductor, can also be fabricated along with the filter. The measurement results of these structures and the MEMS filter are reported and analyzed below in the descriptions of FIGS. 21A-21E.

Figure 21B:
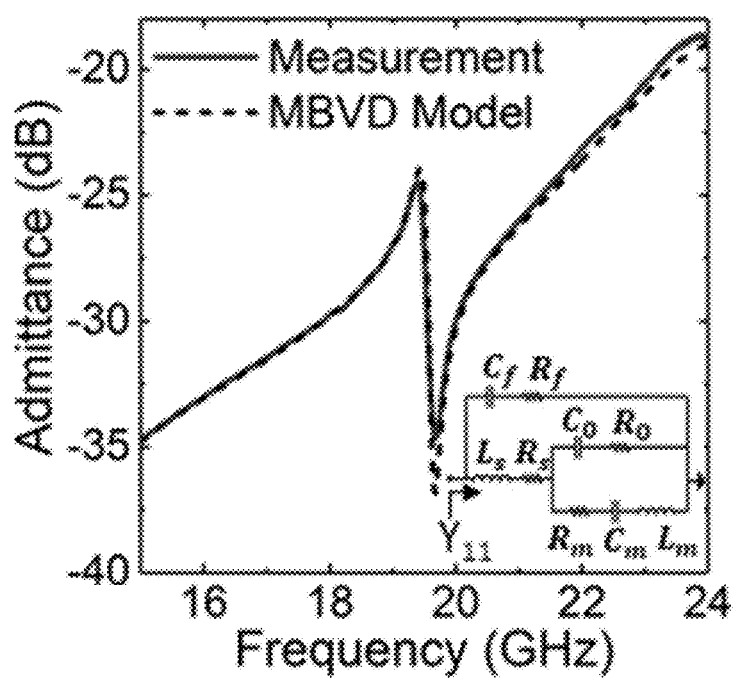
FIG. 21B is a measured response of a fabricated stand-alone resonator according to an embodiment.

FIG. 21B is a measured response of a fabricated stand-alone resonator according to an embodiment. The measured response can be fitted by the MB VD model with additional branches taking the self-inductance ($L_s$) and parasitic capacitance ($C_f$) into account. The parameters extracted from the circuit fitting that quantifies the resonator A7-mode response are: a resonant frequency at 19.6 GHz, resonator Q of 146, $k_t^2$ of 0.7%, $C_0$ of 125 fF, $L_s$ of 0.15 nH, and $C_f$ of 34 fF. The measured $L_s$ is three times larger than the simulated value. As a result, the self-resonance of the resonator occurs at 24 GHz, much lower than the design value 40 GHz. So, by minimizing the self-inductance ($L_s$), the filter performance remain consistent even at high frequencies, e.g., greater than 20 GHz.

Figure 21C:
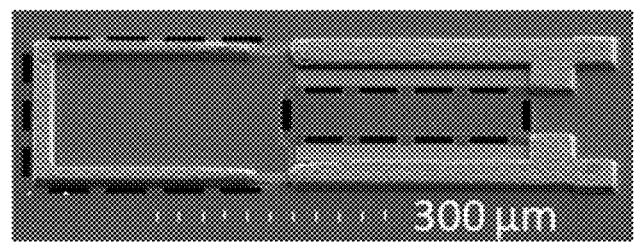
FIG. 21C is an SEM of a fabricated resonator with a shunt inductor according to an embodiment.
Figure 21D:
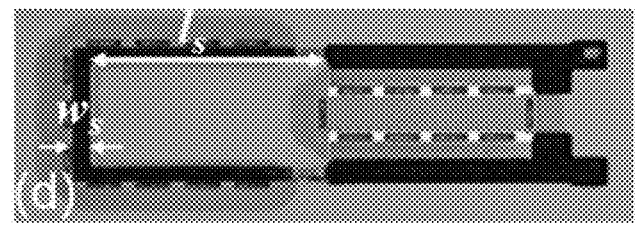
FIG. 21D is an optical microscope image of the fabricated resonator with a shunt inductor according to an embodiment.
Figure 21E:
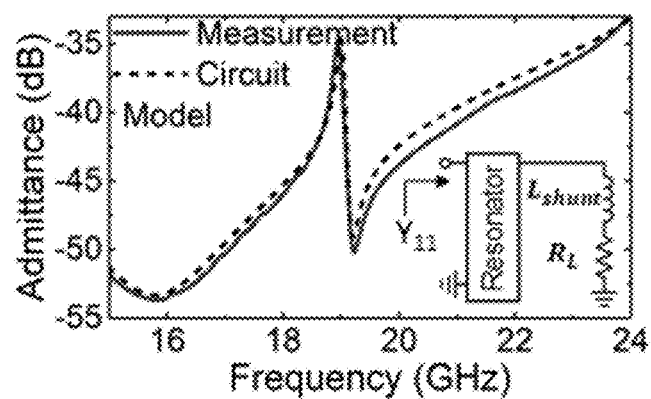
FIG. 21E is a graph illustrating a measured response and a circuit modelled response of the fabricated resonator with a shunt inductor as shown in FIGS. 21C-21D, according to an embodiment.

FIG. 21C is an SEM of a fabricated resonator with a shunt inductor according to an embodiment. FIG. 21D is an optical microscope image of the fabricated resonator with a shunt inductor according to an embodiment. FIG. 21E is a graph illustrating a measured response and a circuit modelled response of the fabricated resonator with a shunt inductor as shown in FIGS. 21C-21D, according to an embodiment. In particular, FIG. 21E shows the measured response fitted with the circuit model in order to extract the inductance and Q of the shunt inductor, $L_{shunt}$, which are 0.61 nH and 8, respectively.

The inductance is close to the design value (0.66 nanohenry (nH)), however, the resistive loss is approximately 3.75 times larger than simulated. The high resistive loss may be caused by two unexpected problems in the fabrication process. Firstly, the aluminum (Al) layer may be partially etched in the step of removing the seed layer for electroplating. Secondly, the electroplated copper may have a lower conductivity due to a non-optimal plating recipe. In general, electroplating can utilize an electrical current in order to reduce a metal in solution at an anode point, which can turn metal ions into a solid metal. Thus, the seed layer, which is conductive, facilitates the metal disposition during electroplating.

Figure 22A:
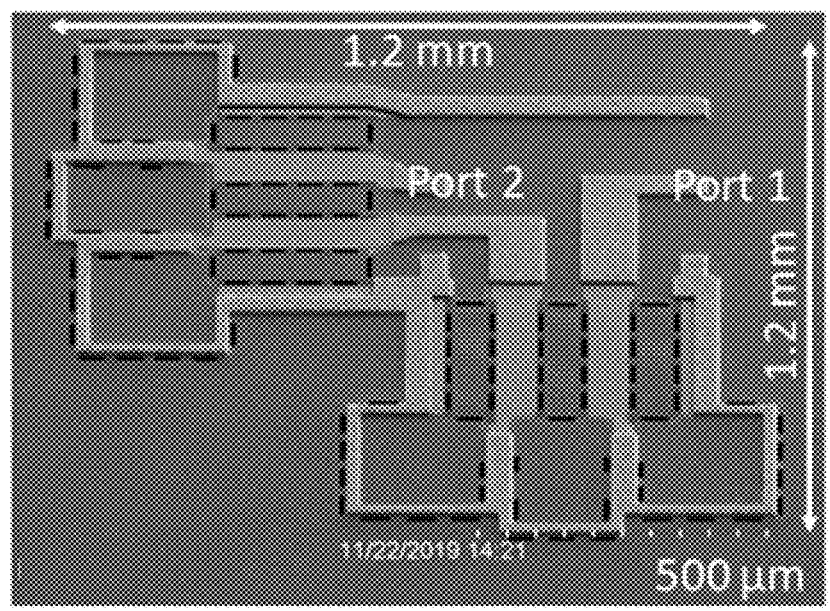
FIG. 22A is an SEM image of a fabricated filter according to an embodiment.
Figure 22B:
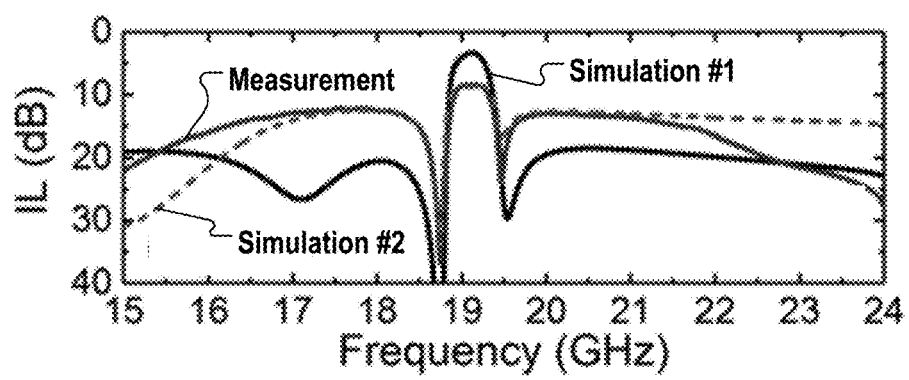
FIG. 22B is a graph illustrating a measured IL and a simulated IL of the fabricated filter of FIG. 22A according to an embodiment.
Figure 22C:
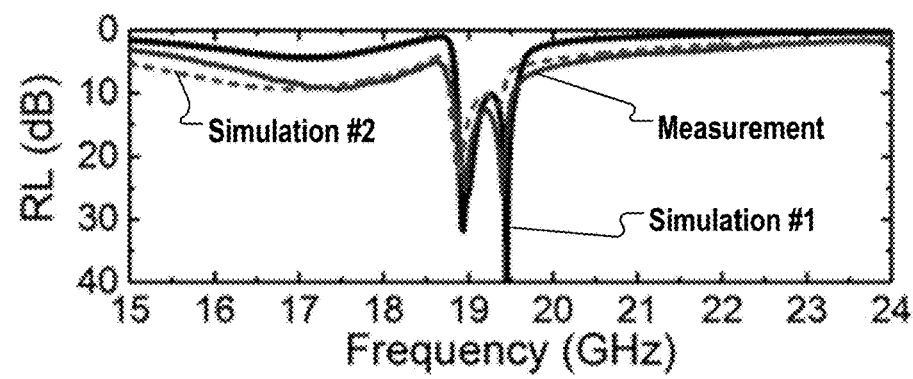
FIG. 22C is a graph illustrating a measured RL and a simulated RL of the fabricated filter of FIG. 22A according to an embodiment.

FIG. 22A is an SEM image of a fabricated filter according to an embodiment. FIG. 22B is a graph illustrating a measured IL and a simulated IL of the fabricated filter of FIG. 22A according to an embodiment. FIG. 22C is a graph illustrating a measured RL and a simulated RL of the fabricated filter of FIG. 22A according to an embodiment.

As labelled in FIG. 22B-22C, the simulation #1 represents a desired response with circuit parameters listed in Table 6. The simulation #2 includes effects of the self-inductance, parasitic capacitance, and resistive loss extracted from the comprising structures, which are larger than the values predicted by EM simulations. The simulation #2 is consistent with the measurement results, while there is a 5 dB difference in the passband IL and a 6 dB difference in the stopband IL between the measurement and simulation #1. The discrepancy in the stopband may mainly be caused by the parasitic capacitances between the lead lines. As seen in FIG. 22A, the lead lines are long and may cause considerable parasitic coupling. The resistive loss is 3.75 times larger than simulation, which may contribute to a 3.7 dB drop in the passband IL. The second cause of the increase in passband IL may be the resonator Q of 146 being lower than the 500 in simulation. This may contribute to the other 1.3 dB difference in passband IL. Other filter designs may reduce $L_s$, $C_f$, and $R_L$, and enhance the fabrication yield in producing resonators of Q around 500 and higher.

A wideband hybrid monolithic acoustic filter in the K-band is designed with co-simulation of the EM and acoustic domains. An FBW exceeding the $k_t^2$ limitation on FBW may be seen in acoustic filters while maintaining a small footprint of 1.4 mm$^2$.

As discussed above, radio bands in sub-6 GHz are increasingly licensed for 5G, and thus the spectrum below 6 GHz becomes increasingly crowded. In addition to millimeter-wave frequencies, systems beyond 5G should also explore higher frequencies where the propagation loss is still low, and beamforming can be avoided. However, one challenge is the lack of miniaturized front-end wideband filters.

The typical commercial solutions for sub-6 GHz miniaturized filters are surface acoustic wave (SAW) filters and bulk acoustic wave (BAW) filters. For SAW filters, the operating frequencies are typically limited to be below 3.5 GHz. Scaling SAW filters over 3.5 GHz requires a sub-200 nm width for interdigital electrodes, which leads to high loss and poor power handling. For BAW devices, efforts have been made to scale them to X-band (8-12 GHz). To this end, AlN thin films are thinned down to be around 175 nm, which introduces very stringent requirements on film quality and thickness uniformity.

The lack of acoustic technologies presents the first challenge for miniature filtering above 6 GHz. Even if conventional filters are scaled up to 6 GHz, secondary challenges still remain in attaining the desired bandwidth and setting the frequency. As acoustic filters commonly employ a ladder topology, the maximum bandwidth is determined by the offset between the resonator series resonance ($f_s$) and anti-resonance ($f_p$), as well as the attainable offset between series and shunt resonators within the ladder topology of the acoustic filters. Thus, attaining a sufficiently large fractional bandwidth (FBW) requires not only large electromechanical coupling ($k_t^2$) but also the capabilities of having different frequency resonators monolithically.

One promising candidate for enabling miniature filters beyond 6 GHz is the recently emerged antisymmetric Lamb wave devices in Lithium niobate ($LiNbO_3$) or lithium tantalate ($LiTaO_3$). The center frequency of these filters can be successfully scaled up to 60 GHz with high quality factors (Qs) by exploiting higher-order Lamb modes. However, despite keeping the piezoelectric film thickness (e.g., of the $LiNbO_3$) unchanged, frequency scaling by increasing the mode order can degrade the electromechanical coupling, $k_t^2$. Consequently, frequency scaling comes at the expense of reduced FBW. Moreover, the resonant frequency of an asymmetric (A) mode is not as susceptible to longitudinal feature sizes as other Lamb wave modes. Thus, two acoustic resonators with frequencies separated by a sufficiently large FBW are not readily attainable. For these two reasons, conventional acoustic-only filters based on the higher-order A-modes can suffer from limited FBW.

Aspects of the present disclosure address these remaining challenges and demonstrate a class of X-band wideband acoustic filters as described below. Aspects of the present disclosure involve first adopting a hybrid filter topology that combines passive elements with acoustic resonators to compensate for the low $k_t^2$ and widen the small FBW. In contrast to previous works using this principle, the current solution does not use large external inductors but rather takes advantage of the self-inductance of the on-chip electrodes and bus lines. Then, a fine-controlled regional thinning technique is used to produce frequency offset matching the BW attained via the above-mentioned bandwidth widening technique.

In order to demonstrate the acoustic filters described herein, four different prototypes are fabricated to validate the bandwidth widening technique and show the trade-off among FBW, IL, out-of-band rejection, and physical footprint. Among them, three designs demonstrate a footprint of 0.56 mm² with spurious-free responses and group delay variations of 5 ns. The 3 dB bandwidth of these designs ranges from 190 MHz (FBW=2.4%) to 380 MHz (FBW=4.4%), and minimum IL ranges from 1.5 dB to 2.8 dB. A fourth design is demonstrated in a compact footprint of 1 mm² with a 3 dB BW of 170 MHz (FBW=2%), a minimum IL of 2.5 dB, and an enhanced out-of-band rejection of 28 dB. The FBWs of these prototypes surpassed the FBW limit (1.8%) set by $k_t^2$ (3.6%) for an acoustic-only filter.

Considerations and solutions to address the first three challenges are described below. To achieve a center frequency higher 6 GHz, a third-order asymmetric (A3) Lamb wave mode resonator in a 650 nm thick Z-cut $LiNbO_3$ thin film can be used. Regional thinning of $LiNbO_3$ can be used to achieve a wide monolithic frequency-setting range. To circumvent the limitations set by $k_t^2$, inductors can be integrated with acoustic resonators.

FIG. 23A illustrates a displacement mode shape of a third-order asymmetric (A3) Lamb wave mode according to an embodiment. In particular, FIG. 23A shows an Eigen displacement mode shape of the A3 Lamb wave mode. Its resonant frequency can be determined by:

$$f_{A3} = \frac{v_L}{2t}\sqrt{(3a)^2 + \left(2\frac{t}{\lambda_L}\right)^2} \quad (8)$$

where $v_L$ is the longitudinal acoustic velocity, t is the thickness of the $LiNbO_3$ thin film, a is the ratio between the velocities along with the vertical and longitudinal directions, and $\lambda L$ is the longitudinal wavelength. Since the $C_{15}$ (3.69 C/m²) (e.g., an element of) the coupling matrix of the Z-cut $LiNbO_3$ shows the largest value, the longitudinal electric field generated by the top-only interdigital transducers (IDTs) can efficiently excite the A3 mode.

FIG. 23B is a schematic diagram showing a cross-sectional view of a $LiNbO_3$ acoustic resonator with a single pair of IDTs and the corresponding simulated displacement mode shape according to some embodiments. Due to the significant acoustic impedance mismatching, acoustic energy is predominantly confined between adjacent electrodes (separated by a gap, G, measured in a longitudinal direction along a length of the acoustic resonator), thus the longitudinal wavelength of A3 mode is determined by the electrode separation ($G \approx \lambda_L/2$). Therefore, a Z-cut $LiNbO_3$ (or $LiTaO_3$) thin film of 650 nm in thickness can support an A3 mode in the X-band. It should be noted that although the following simulations and fabrication are based on such configuration, other configurations employing $LiTaO_3$ and other thin films, other cuts (such as Y cut and X cut), as well as other asymmetric modes can be envisioned to achieve an X-band miniature acoustic filter.

FIG. 23C is a schematic diagram illustrating a cross-sectional view of an A3 Z-cut $LiNbO_3$ acoustic resonator with multiple pairs of IDTs, according to some embodiments. In filtering applications, either resonator arrays based on multiple small resonators or single resonators with multiple pairs of IDTs can be used to match the system impedance of 50Ω. In the following, both approaches are described.

Figure 24A:
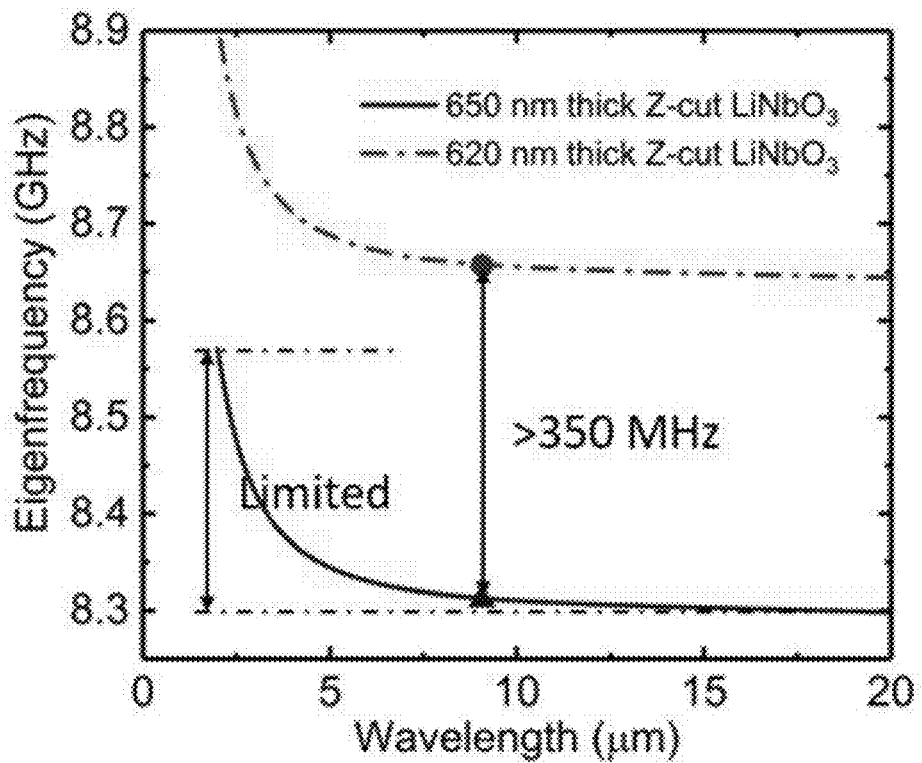
FIG. 24A is a graph illustrating dispersion curves of the A3 mode in a 650 nm-thick Z-cut $LiNbO_3$ thin film, according to some embodiments.

FIG. 24A is a graph illustrating dispersion curves of the A3 mode in a 650 nm-thick Z-cut $LiNbO_3$ thin film, according to some embodiments. The frequency offset between series resonators and shunt resonators in the constructed filter largely determines the bandwidth. According to Eq. 8, the frequency offset can be achieved by using different $\lambda L$ and longitudinal feature sizes (e.g., the gap length G). For ease of lithography-based fabrication process, G can be made to be larger than 1 μm for purposes of experimental validation. Based on Eq. 8, a is much larger than $t/\lambda_L$. Consequently, the frequency offset achieved through tuning the longitudinal feature size is limited, as shown in FIG. 24A.

Figure 24B:
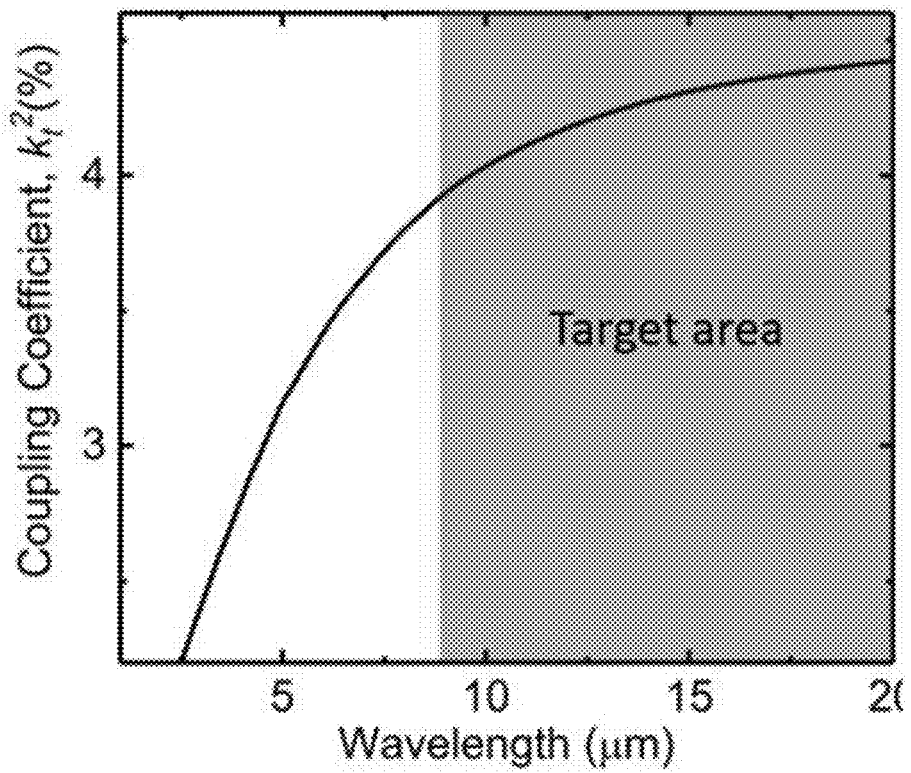
FIG. 24B is a graph illustrating the electromechanical coupling coefficient of the A3 mode as a function of the wavelength ($\lambda_L$) according to some embodiments.

FIG. 24B is a graph illustrating the electromechanical coupling coefficient of the A3 mode as a function of the wavelength ($\lambda_L$) according to some embodiments. The longitudinal feature size also affects $k_t^2$. $k_t^2$ is a function of $\lambda_L$, can be analyzed using Comsol-based finite element analysis (FEA). As shown in FIG. 24B, a larger $\lambda_L$ leads to a larger $k_t^2$ when $\lambda_L$ is less than 8 μm, beyond which $k_t^2$ tends to be substantially constant. Thus, $\lambda_L$ should be over 8 μm in order to maximize $k_t^2$. However, the large value of $\lambda_L$, in turn, further can limit the frequency offset as shown in FIG. 24A, which can lead to a larger footprint.

One method to achieve a large frequency offset and maximum $k_t^2$ simultaneously is to adjust the thickness (t) of the $LiNbO_3$ thin film to set the resonant frequency. As shown in FIG. 24A, a 30 nm thickness difference could lead to a frequency offset of over 350 MHz. In the following descriptions, both series resonators and shunt resonators have a $\lambda_L$ of 8 μm but have different $LiNbO_3$ thicknesses to balance the demand for a large $k_t^2$ and a small footprint. The required thickness for the series and shunt resonators will be further discussed below in reference to the filter implementation. The regional thinning process will be subsequently described.

Figure 25:
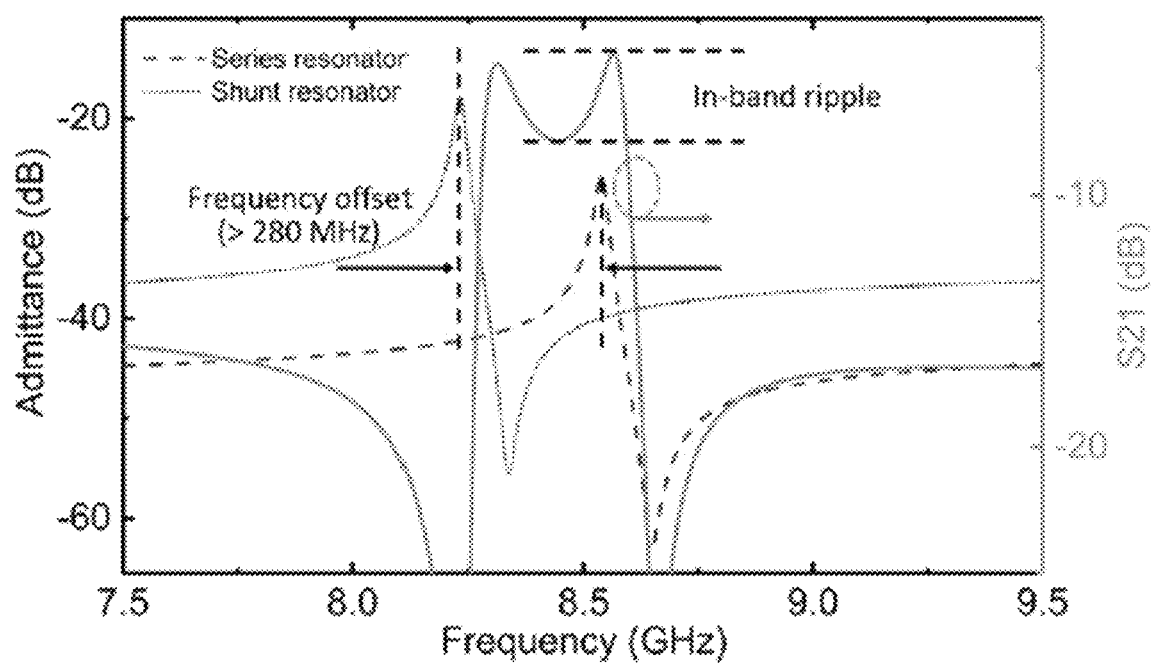
FIG. 25 is a graph illustrating a simulated admittance of the series resonators, the shunt resonators, and S21 of the filters constructed with the series and shunt resonators according to an embodiment.

FIG. 25 is a graph illustrating a simulated admittance of the series resonators, the shunt resonators, and S21 of the filters constructed with the series and shunt resonators according to an embodiment. S21 is a matrix element of an S-parameter matrix, which refers to an input-output relationship between various ports of an electrical system. More specifically, the S21 matrix element refers to a forward voltage gain. In addition to the frequency offset, compensation of $k_t^2$ should be considered as it can increase the maximum FBW. To achieve a flat in-band response, the resonant frequency of the series resonators should be close to the anti-resonance of the shunt resonators. However, the $k_t^2$ of the A3 mode excited in Z-cut $LiNbO_3$ is approximately 3.6%, which leads to a maximum allowed frequency offset of less than 140 MHz and a maximum filter FBW of less than 1.8%. As shown in FIG. 25, the frequency offset between series and shunt resonator is over two times the maximum allowed value leading to a large ripple in the filter passband.

One approach to circumvent the limitation set by $k_t^2$ is to integrate inductors in parallel to the resonators to shift a first frequency (e.g., an anti-resonant frequency) of the shunt resonator closer to a second frequency (e.g., the resonant frequency of the series resonator). Another approach is to integrate inductors in series to the resonators to shift the second frequency (e.g., the resonant frequency of the series resonator) closer to the first frequency (e.g., the anti-resonance of the shunt resonator). To maximize the bandwidth, the first frequency and the second frequency should be substantially equal. The results of both approaches are described by FIGS. 26A-26B.

Figures 26A, 26B:
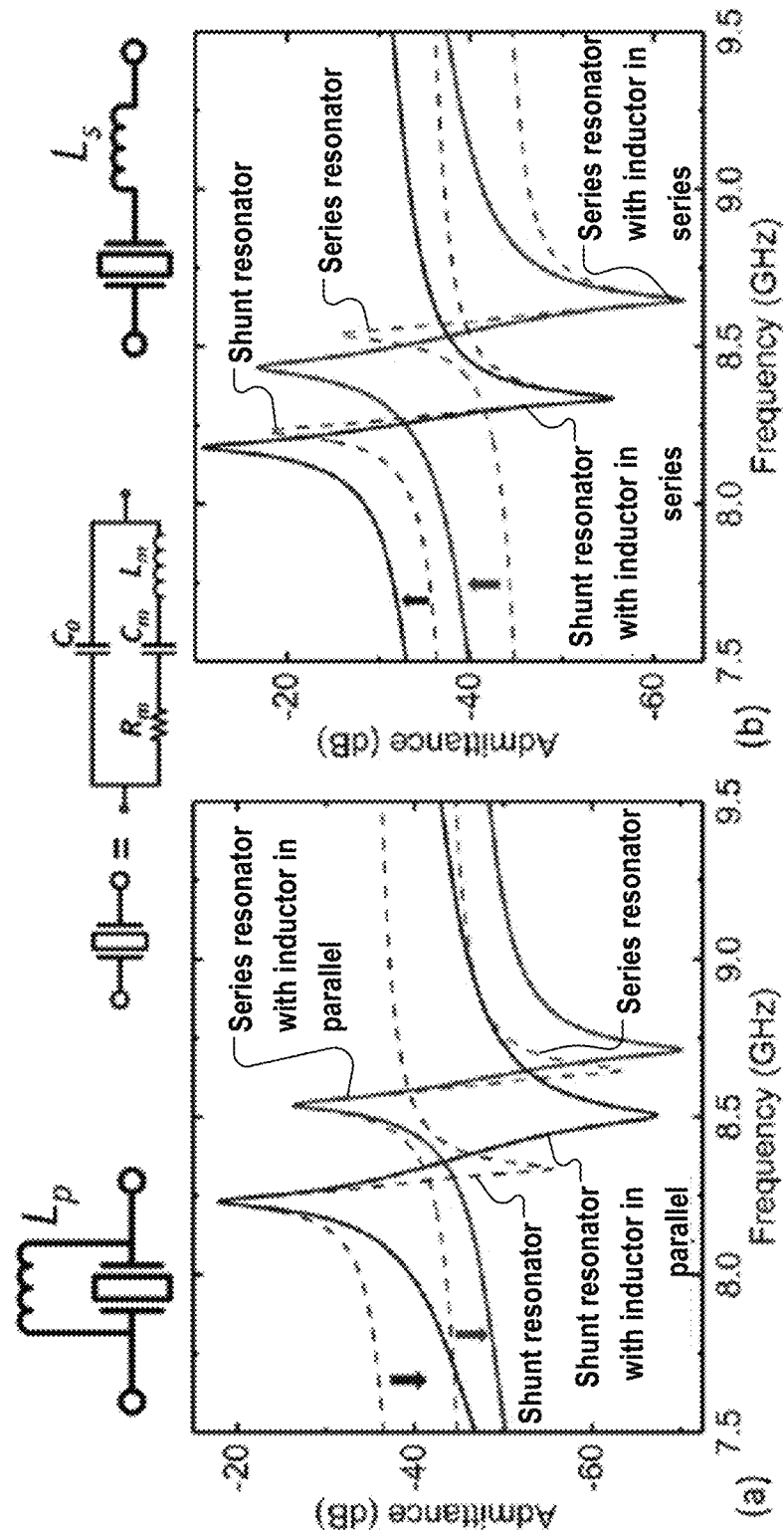
FIG. 26A is a graph illustrating simulated admittance responses of the series resonator and the shunt resonator with inductors coupled in parallel according to an embodiment.
FIG. 26B is a graph illustrating simulated admittance responses of the series resonator and the shunt resonator with inductors coupled in series according to an embodiment.

FIG. 26A is a graph illustrating simulated admittance responses of the series resonator and the shunt resonator with inductors coupled in parallel according to an embodiment. The dashed lines indicate the simulated admittance responses of the stand-alone resonators (e.g., without inductors) and the solid lines indicated the simulated admittance response of the resonators with inductors coupled in parallel. It can be seen that with coupled inductors, the anti-resonant frequency of the shunt resonator is shifted closer to the resonant frequency of the series resonator.

FIG. 26B is a graph illustrating simulated admittance responses of the series resonator and the shunt resonator with inductors coupled in series according to an embodiment. As in FIG. 26A, the dashed lines indicate the simulated admittance responses of the stand-alone resonators (e.g., without inductors) and the solid lines indicated the simulated admittance response of the resonators with inductors coupled in series. It can be seen that with coupled inductors, the resonant frequency of the series resonator is shifted closer to the anti-resonant frequency of the shunt resonator.

The equivalent circuit model (named MBVD model) of the resonator, in which the static capacitance is captured by $C_0$, is shown in the inset of FIG. 26A and FIG. 26B. As indicated by directions of arrows shown in FIG. 26A and FIG. 26B, the paralleled inductor case (e.g., FIG. 26A) leads to a smaller equivalent static capacitance, while the inductor in series (e.g., FIG. 26B) helps increase the static capacitance. In other words, the including inductors in series contributes to a higher static capacitance density leading to a smaller footprint. Thus, the remainder of the discussion with respect to FIGS. 27-39 will relate to the case in which inductors are coupled to the series resonators and the shunt resonators in series. The amount of footprint reduction will be discussed in the following.

A3-mode filter designs are discussed below. To achieve better integration between series inductors and acoustic resonators, the self-inductance of the top interdigital transducers (IDTs) and bus lines can be used as integrated inductors that are effectively in series with the respective acoustic resonators. Thus, by using the self-inductance of the IDTs and bus lines, the resonant frequency and anti-resonant frequency of the filters can be moved further apart, leading to a widening of the BW of the filters. As an illustrative example, four different designs of A3-mode filters will be compared for the implementation of X-band wideband filters.

Figure 27A:
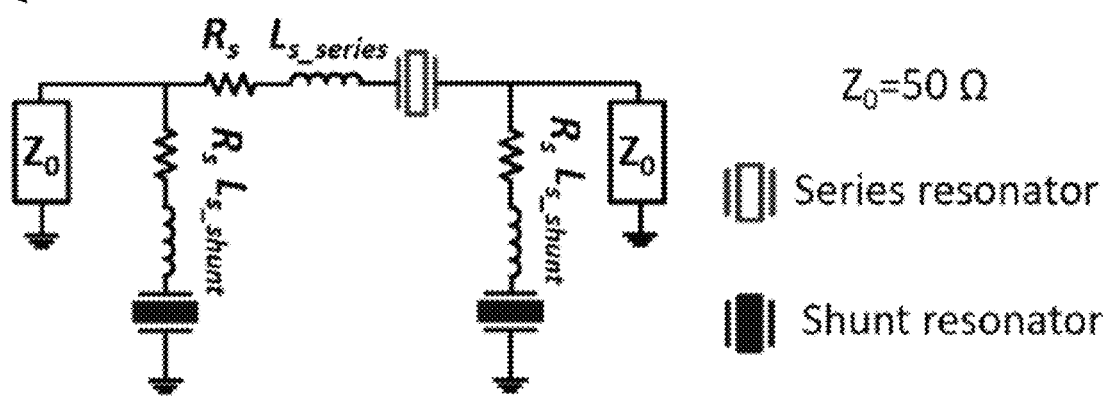
FIGS. 27A-27B are schematic diagrams of equivalent circuit models of two different ladder filter topologies, respectively according to some embodiments.
Figure 27B:
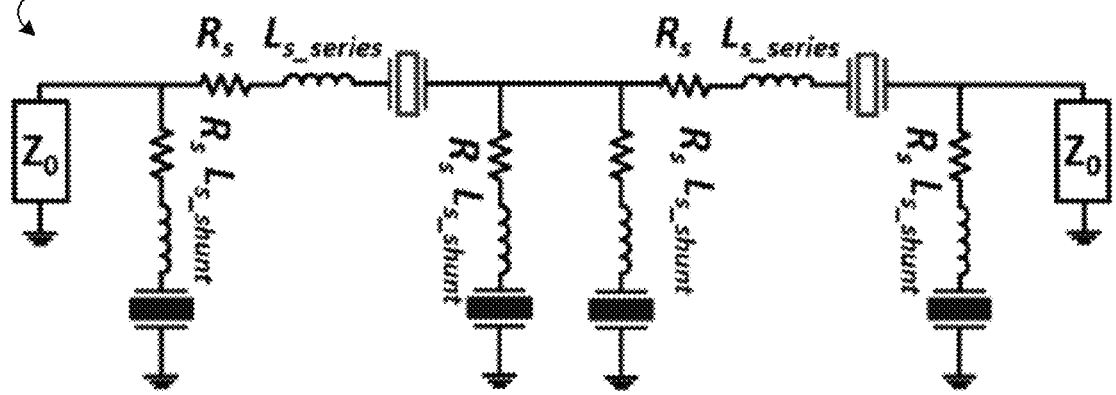

FIGS. 27A-27B are schematic diagrams of equivalent circuit models of two different ladder filter topologies, 2700 and 2710, respectively according to some embodiments. The equivalent circuit models account for EM effects. The ladder filter topology 2700 of FIG. 27A includes one series resonator branch and two shunt resonator branches. The ladder filter topology 2710 of FIG. 2B includes two series resonator branches and four shunt resonator branches. Both ladder filter topologies 2700 and 2710 are based on identical series and shunt resonator branches, but with different filter orders. The inductances $L_{s\_series}$ and $L_{s\_shunt}$ represent the inductors in series with the series and shunt resonators, respectively. The surface resistance of the IDTs and bus lines of the resonators are captured by including $R_s$ in series. Both ladder filter topologies 2700 and 2710 are expected to show a trade-off among IL, out-of-band rejection, and footprint (e.g, physical size). To match the system impedance of 50Ω at the target frequency, the required static capacitance of the series ($C_{series}$) and shunt ($C_{shunt}$) resonator branches (including the series inductors) are around 230 fF and 450 fF, respectively. To achieve a small footprint and sufficient $k_t^2$ compensation, the relationships among the static capacitance of filter branches ($C_0$ of resonators), the frequency shift of the resonant frequency (Δf), and the series inductance are calculated separately for the series and shunt branches.

FIG. 28A is a graph illustrating the relationship among the static capacitance $C_0$, the frequency shift Δf of the filter, and the series inductance for the shunt branches according to an embodiment. FIG. 28B is a graph illustrating the relationship among the static capacitance $C_0$, the frequency shift Δf of the filter, and the series inductance for the series branches according to an embodiment.

As indicated by FIG. 28A, in order to halve the footprint of the shunt resonators in the shunt branches, $L_{s\_shunt}$ is chosen to be 0.7 nH. Based on the above-mentioned analysis, the inductor ($L_{s\_series}$) in series with the series resonator should be large enough to make the resonant frequency of the series resonator closer to the anti-resonant frequency of the shunt resonator. Thus, according to FIG. 28B, $L_{s\_series}$ should be approximately 1.6 nH to give a Δf of 100 MHz and still have a reasonably small footprint. Additionally, the required $C_0$ of the series resonator is decreased from 230 fF to 120 fF.

The static capacitance and series inductance of the series and shunt resonator branches, as discussed above, can be fixed to subsequently study and illustrate four different filters (Designs A, B, C, and D in Table 8 below) based on different frequency offsets (via different thicknesses of the lithium niobate thin film) compared to a conventional design. The four different filters are designed to illustrate the trade-off among BW, IL, out-of-band rejection, in-band ripples, and footprint.

TABLE 8

Design Parameters of the A3 Mode Filters

| Design | Branch | t (nm) | $W_e$ (μm) | G (μm) | L (μm) | $t_e$ (nm) | $t_L$ (nm) | No. of branches | $C_0$ (fF) | $L_s$ (nH) |
|---|---|---|---|---|---|---|---|---|---|---|
| Design A | Series | 620 | 6 | 4 | 110 | 200 | 400 | 1 | 120 | 1.6 nH |
|  | Shunt | 650 | 6 | 4 | 110 |  |  | 2 | 240 | 0.7 nH |
| Design B | Series | 630 | 3 | 4 | 34 |  |  | 1 | 120 | 1.6 nH |
|  | Shunt | 650 | 3 | 4 | 34 |  |  | 2 | 240 | 0.7 nH |
| Design C | Series | 612 | 3 | 4 | 34 |  |  | 1 | 120 | 1.6 nH |
|  | Shunt | 650 | 3 | 4 | 34 |  |  | 2 | 240 | 0.7 nH |
| Design D | Series | 630 | 3 | 4 | 34 |  |  | 2 | 120 | 1.6 nH |
|  | Shunt | 650 | 3 | 4 | 34 |  |  | 4 | 240 | 0.7 nH |
| Conventional | Series | 650 | 6 | 3 | 110 |  |  | 1 | 120 | — |
|  | Shunt | 650 | 6 | 8 | 110 |  |  | 2 | 240 | — |

Table 8 lists the design parameters of the four filter designs and a conventional filter design, where t, $W_e$, G, and $t_e$ are marked and defined in FIGS. 23B-23C. L is the length of the resonator cavity, and $t_L$ is the thickness of the bus lines. Designs A, B, and C use the ladder filter topology 2700 of FIG. 27A, and Design D uses the ladder filter topology 2710 of FIG. 28B to enhance the out-of-band rejections. In Design A, each filter branch has multiple small resonators to attain a sufficient $C_0$. In Design B and C, a single resonator with multiple-pair IDTs is used in each filter-branch. Design B and C resort to the same filter layout with different frequency offset between series and shunt resonators to verify the value of the designed series inductors. Additionally, as a comparison to the regional thinning, a conventional design which relies on varying the distance between interdigital electrodes (G) to achieve the frequency offset is also added in Table 8. An additional step to fabricate Design A, B, C, and D, an additional step is to integrate inductors and acoustic resonators efficiently in a compact footprint.

In some embodiments, a width of the bus lines is between approximately 20 μm and 50 μm, a length of the resonator cavity is between approximately 100 μm and 300 μm, and a thickness of the electrodes is between approximately 0.1 μm and 1 μm.

The filters described herein rely on the IDTs and bus lines, which are typically considered electrically negligent and non-reactive at low frequencies, to produce self-inductances. The inductances can then be used to achieve significant a frequency shift and a bandwidth widening effect without additional auxiliary components. In some cases, the electromagnetic (EM) effects associated with IDTs and bus lines in the filter topologies can be significant beyond 6 GHz. They can be controlled by tuning the dimensions of IDTs and bus lines, including width, length, and metal thickness.

A hybrid simulation method can be utilized to couple the effects in the electromagnetic (EM) and acoustic domains. The acoustic performance can be simulated with a COMSOL-based FEA and captured by motional elements ($R_m$, $L_m$, and $C_m$) in the MBVD model (FIG. 26). The EM performance of each of the designs can be simulated in high-frequency structure simulator (HFSS) to attain sufficient self-inductances. Internal ports can be assigned in HFSS simulations for representing the EM effect in the hybrid simulation for each design. To simplify the demonstration, in each design, the series and shunt resonators employ the same or similar IDT structures with different $LiNbO_3$ thicknesses. Based on the parameters listed in Table 8, the bus lines are designed to satisfy the required self-inductance ($L_{s\_series}$ and $L_{s\_shunt}$) and shift the resonant frequencies. The filter layouts in EM simulation for Designs A, B, and C are shown in FIGS. 29A-29B.

FIG. 29A is an illustration of an HFSS EM model of the filter layout for Design A according to one embodiment. Design A and the conventional design use similar filter layouts with different resonators. The parameters of Design A and the conventional design are listed in Table 8.

FIG. 29B is an illustration of an HFSS EM Model of the filter layout for Design B and C use the same filter layout with thinner thicknesses in the $LiNbO_3$ for series resonators. Designs B and C according to one embodiment. The parameters of Designs B and C are listed in Table 8. In FIGS. 29A-29B, the series resonator is illustrated by a dash-dot-dot line, and the shunt resonators are illustrated by dashed lines. The bus lines are indicated by solid lines. The resonators and the bus lines are suspended above a $LiNbO_3$ thin film. It can be seen in FIGS. 29A-29B that the resonators (e.g., series and shunt) are patterned with IDTs, which will be discussed and shown in further detail with respect to FIGS. 32-33.

FIG. 30A is a graph illustrating a hybrid simulation result (S12) of a Design A filter and a conventional filter design according to one embodiment. As shown, the simulated response of Design A has an approximately 4 times larger BW than the conventional design, which results from Design A exploiting the self-inductance of the filter layout.

FIG. 30B is a graph illustrating a hybrid simulation result (S12) of a Design B filter and a design C filter according to one embodiment. As shown in FIG. 30B, the Design C filter has a greater BW than the Design B filter, which results from the larger frequency offset between the series and shunt resonators of the Design C filter. However, a ripple appears in the simulated passband of the Design C filter as the $L_{s\_series}$ is not sufficient to shift the resonant frequency of the series resonators close to the anti-resonant frequency of the shunt resonators. The simulations verify that the filter layout with the designed self-inductance can increase the bandwidth and achieve a flat in-band response. Because the simulation process of Design D is similar, its details are discussed later along with its measured responses.

It is worth noting that the self-inductance does not introduce any extra electric losses ($R_s$) since IDTs and bus lines are necessities in acoustic filters. In other words, the widening of the bandwidth of filters does not degrade IL or roll-off, nor requires a larger footprint. Details of the filter layouts are shown in the microscope and SEM images of the fabricated devices below.

Figure 31:
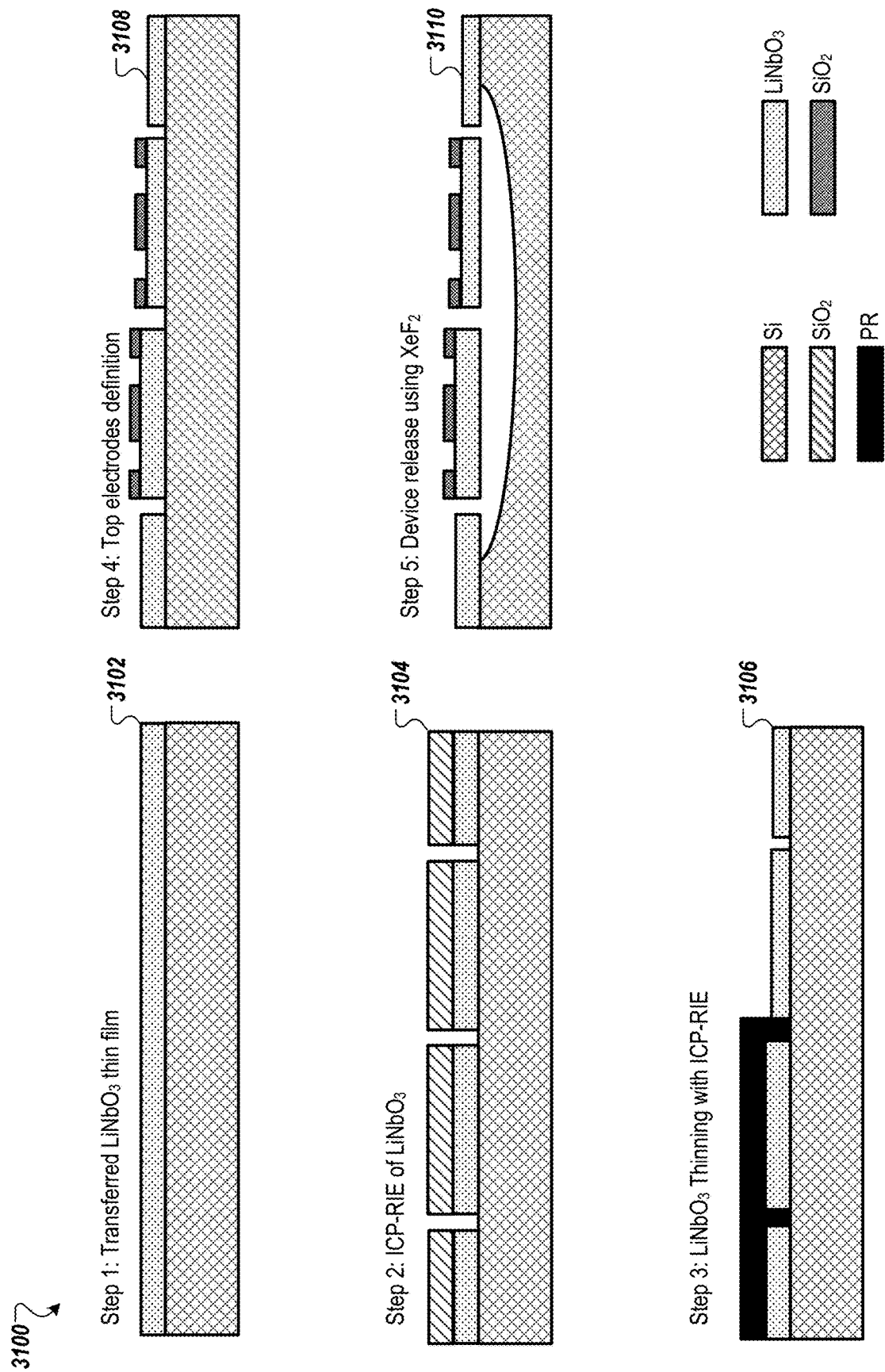
FIG. 31 is a set of cross-sectional images of a resonator illustrating a process for fabrication of the resonator according to an embodiment.

FIG. 31 is a set of cross-sectional images of a resonator illustrating a process 3100 for fabrication of the resonator according to an embodiment. Although described here generically as a $LiNbO_3$ thin film, the piezoelectric thin film can be composed of Z-cut LiNbO$_3$, which was the focus of study, or other cuts of LiNbO$_3$ or LiTaO$_3$ can be envisioned, including an X cut or a Y cut of these materials. The Y cut can, for example, be a more specific-angled Y cut, to include 128° Y or 36° Y.

With reference to FIG. 31, at operation 3102, the fabrication process 3100 includes transferring piezoelectric thin film (e.g., a 650 nm-thick Z-cut LiNbO$_3$ thin film) onto a high-resistivity wafer (e.g., a high-resistivity silicon (Si) wafer). At operation 3104, release windows are defined by etching through the piezoelectric thin film. At operation 3106, the piezoelectric thin film is regionally thinned with Inductively Coupled Plasma-Reactive Ion Etching (ICP-RIE). The regional thinning is done to one or more portions of the piezoelectric thin film where the series resonator(s) are located. This allows the series and shunt resonators to be fabricated on a single piezoelectric thin film (e.g., monolithically). Thus, a first thickness of the piezoelectric thin film where the shunt resonators are located is larger than a second thickness of the piezoelectric thin film where the series resonators are located. In some embodiments, a ratio of the second thickness to the first thickness is between 0.9 and 0.98. At operation 3108, top electrodes can be deposited and defined. For example, in one embodiment, 200 nm-thick aluminum (Al) can be deposited to define the IDTs and bus lines. Finally, at operation 3110, XeF$_2$-based dry etching is used to remove the Si below the resonators and suspend the resonators in the filter structure.

The process described above in reference to FIG. 31 can be used to fabricate a filter on a 650 nm-thick Z-cut LiNbO$_3$ thin film. After a 650 nm thick Z-cut LiNbO$_3$ thin film is transferred onto a high resistivity Si wafer, release windows are defined by etching through LiNbO$_3$.

FIGS. 32A-32D are optical microscope images of a Design A filter according to one embodiment. In particular, FIG. 32A is an optical microscope image of region of a filter for a shunt resonator according to embodiments, and FIG. 32B is an optical microscope image of a region of a filter for a series resonator according to embodiments. The region depicted in FIG. 32B (for a series resonator) is thinned compared to the region depicted in FIG. 31A (for shunt resonators). The LiNbO$_3$ thinning outcome is depicted in the optical microscope images. The boundary between the thinned and intact (e.g., non-thinned) regions is visible since regions of different thicknesses present different colors under the optical microscope.

FIG. 32C is an optical microscope image of the fabricated filter based on Design A according to one embodiment. In the depicted embodiment, the area outlined by the dash-dot-dot line is a series resonator where the piezoelectric film has been thinned down (e.g., from 650 nm down to 620 nm). In other embodiments, the area of the piezoelectric thin film can be thinned from a first value to a second value that is less than the first value. The areas outlined by a dashed line are shunt inductors. The overall footprint of the fabricated Design A is 0.56 mm$^2$.

FIG. 32D is a zoomed-in optical microscope image of a resonator array according to an embodiment. The electrode separation (G), IDT width (W e), and resonator cavity length (L) are labeled. In some embodiments, the electrode separation is 4 µm, the electrode width is 6 µm, and the resonator cavity length is 110 µm.

Figure 33A:
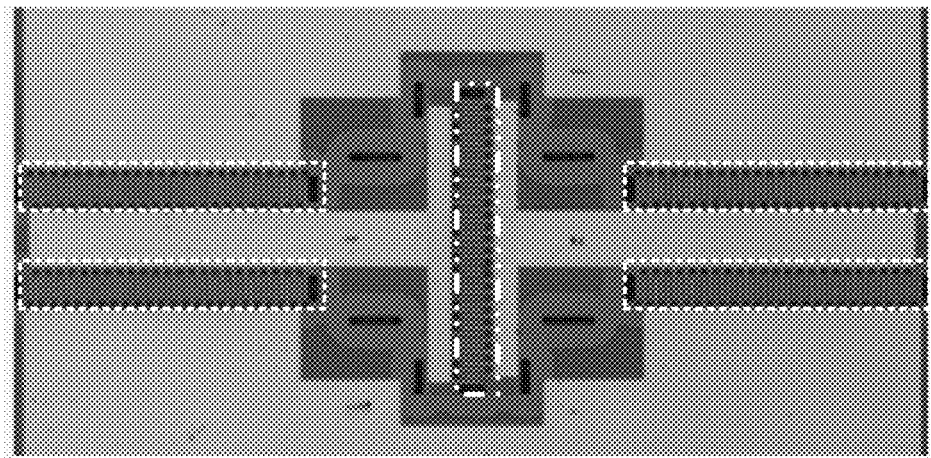
FIG. 33A is an optical microscope image of a Design B and C filter according to some embodiments.
Figure 33B:
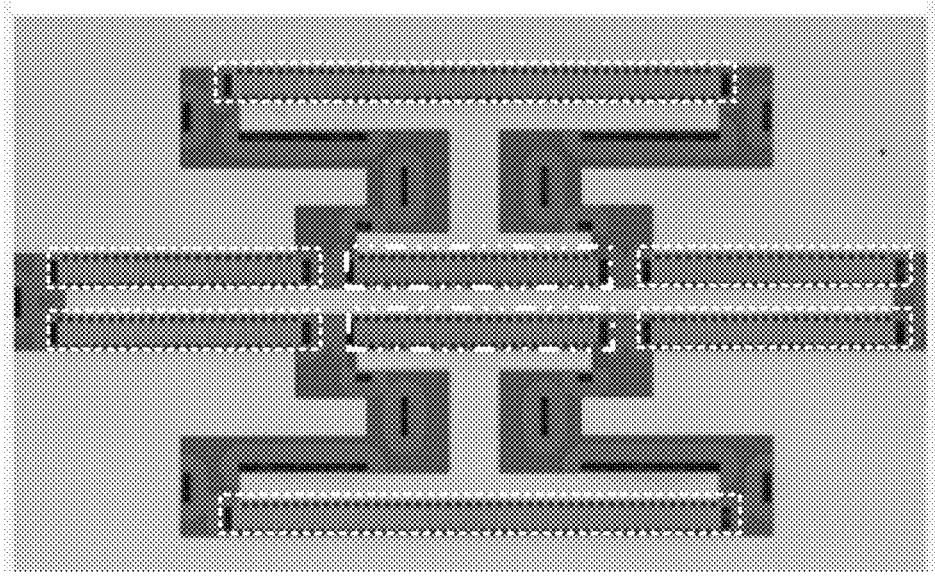
FIG. 33B is an optical microscope image of the Design D filter according to some embodiments.

FIG. 33A is an optical microscope image of a Design B and C filter according to some embodiments. The series resonators are outlined by dash-dot-dot lines, and the shunt resonators are outlined by dashed lines. FIG. 33B is an optical microscope image of the Design D filter according to some embodiments.

Figure 33C:
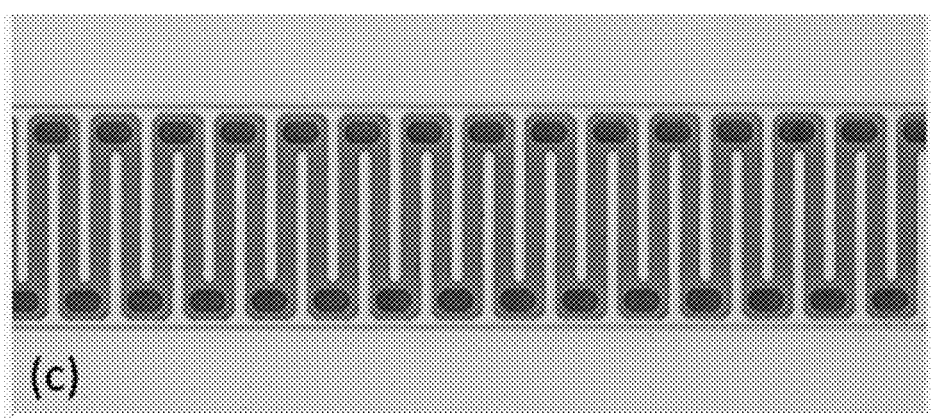
FIG. 33C is a zoomed-in optical microscope image of a series resonator according to an embodiment.

FIG. 33C is a zoomed-in optical microscope image of a series resonator according to an embodiment. For example, in some embodiments, the series resonator of FIG. 33C is the same or similar to the series resonators of FIGS. 33A-33B and/or the dash-dot-dot regions of FIGS. 32B and 32C. In particular, FIG. 33C shows zoomed-in view of the IDT structure of filters with Designs B, C, and D. Different from Design A, release windows are added at the transverse ends of the resonator body, which can act as the free boundaries to suppress the transverse spurious modes and achieve better acoustic energy confinement. Additionally, extra release windows are added between bus lines to generate air gaps which can lead to reduced parasitic capacitances. These fabricated filters and standalone resonators can be measured with a probe station and a Keysight N5249A PNA. The reference planes were fixed at probing pads using a SLOT chip-scale calibration kit.

Figure 34B:
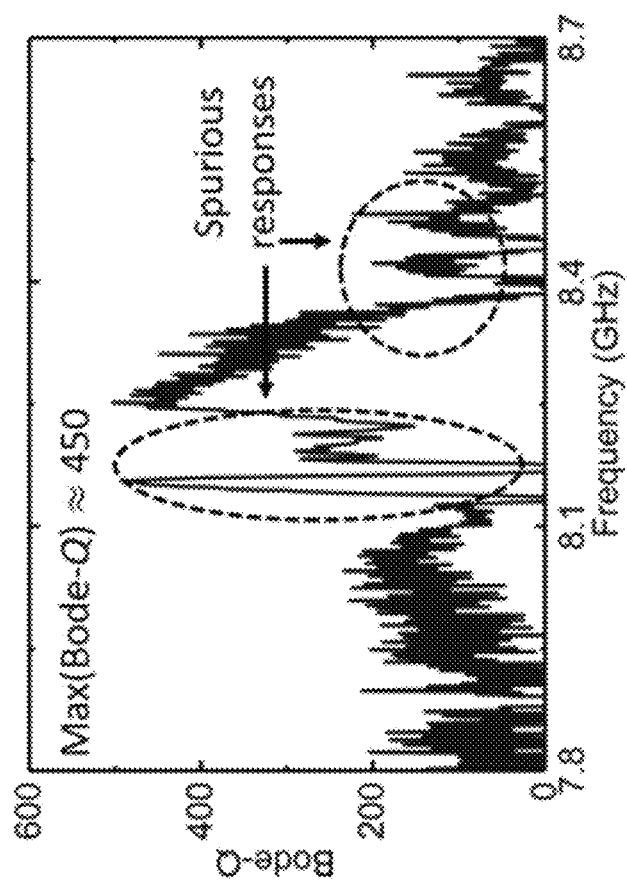
FIG. 34B is a graph illustrating a measured Bode-Q response of the A3-mode LiNbO$_3$ filter according to an embodiment.
Figure 34A:
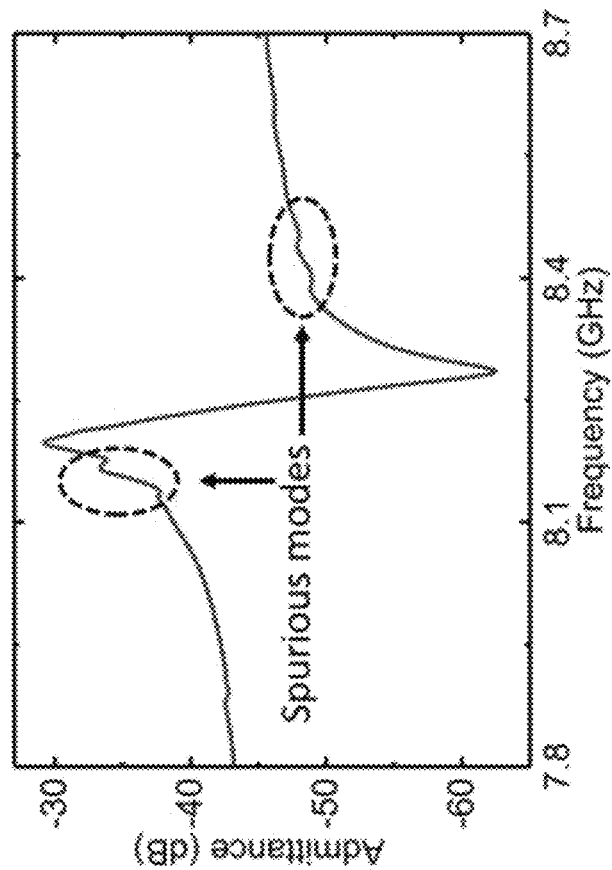
FIG. 34A is a graph illustrating a measured admittance response of the A3-mode LiNbO$_3$ filter according to an embodiment.

FIG. 34A is a graph illustrating a measured admittance response of the A3-mode LiNbO$_3$ filter according to an embodiment. FIG. 34B is a graph illustrating a measured Bode-Q response of the A3-mode LiNbO$_3$ filter according to an embodiment. The fabricated standalone A3 LiNbO$_3$ resonator is first measured. Consistent with theoretical analyses, the admittance response shown in FIG. 34A exhibits a resonant frequency around 8.2 GHz with a $k_t^2$ of 3.6%. As seen in FIG. 33B, the measured Bode-Q of the A3 LiNbO$_3$ resonator has a max value over 450. Several minor spurious modes exist near the resonant frequency and anti-resonant frequency. However, these spurious modes have small figures of merit (FoM=Q·$k_t^2$) and do not generate significant ripples.

FIG. 35A is an optical microscope image of the fabricated A3 LiNbO$_3$ filter without regional thinning according to an embodiment. The conventional design relies on varying G, and hence λ, to achieve the frequency offset fabricated as a baseline comparison to Design A, B, C, and D. In the conventional design, G for the series and shunt resonators can be chosen as 3 µm and 8 µm respectively. As the dispersion curve shown in FIG. 24A the frequency offset between the series and shunt resonators is less than 80 MHz, leading to an FBW of less than 1%. Additionally, as the impedance matching network is required to match to a narrower bandwidth, the designed static capacitances of series and shunt resonators are insufficient to match 50Ω. Thus, the conventional design is measured with a system impedance of 150Ω.

Figure 35D:
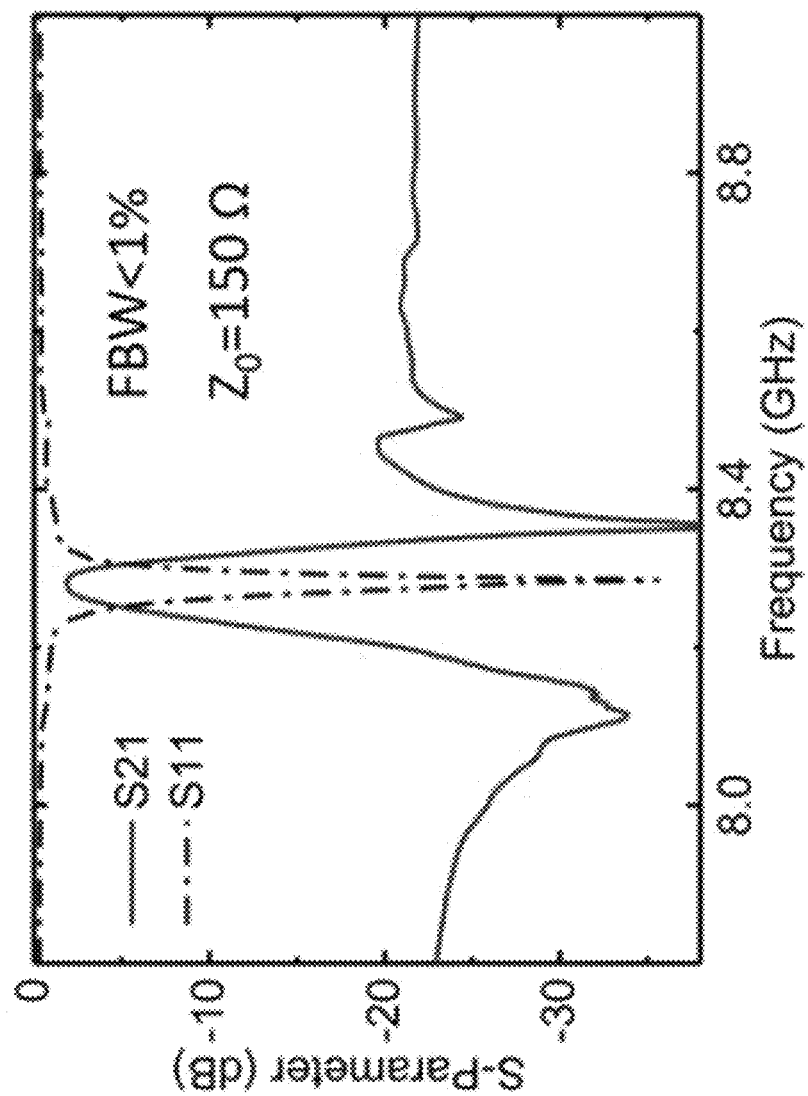
FIG. 35D is a graph of a measured performance of the fabricated filter with limited bandwidth, illustrating zoomed-in passband curves (S11 and S21) according to an embodiment.

FIG. 35B is an optical microscope image of a shunt resonator according to some embodiments. In one embodiment, an electrode spacing (e.g., gap) G, is 8 µm. FIG. 35C is an optical microscope image of a series resonator according to some embodiments. In one embodiment, an electrode spacing (e.g., gap) G, is 3 µm. An insertion loss (IL) of 2.7 dB, and an out-of-band rejection of 15 dB, as shown in FIG. 36A below. FIG. 35D is a graph of a measured performance of the fabricated filter with limited bandwidth, illustrating zoomed-in passband curves (S11 and S21) according to an embodiment.

FIG. 36A is a graph illustrating a measured performance (S-parameter) of a Design A filter according to an embodiment. Design A is fabricated in a similar filter layout as the conventional design. As mentioned above, the 30 nm thickness difference of LiNbO$_3$ thin film between series and shunt resonators leads to around 350 MHz frequency offset, which is four times greater than the conventional design. Due to the wide passband and the static capacitance compensation from self-inductance, Design A can match to 50Ω in a compact footprint of 0.56 mm². The fabricated Design A shows a center frequency of 8.4 GHz, a 3 dB FBW of 3.45% (BW=290 MHz), a minimum IL of 2.7 dB, and an out-of-band rejection of 15 dB. FIG. 36B is a graph illustrating a zoomed-in passband (S21) of the Design A filter according to an embodiment. FIG. 36C is a graph illustrating an in-band group delay of a Design A filter according to an embodiment.

FIG. 37A is a graph illustrating a measured performance (S-parameter) of a Design B filter according to an embodiment. Design B is fabricated with a similar footprint size as Design A. The main difference between Design A and B is the structures of resonators and the frequency offset. Release windows are added in the transverse directions of the resonator body for better energy confinement and transverse spurious mode suppression. The 20 nm regional thinning makes Design B feature a 3 dB FBW of 2.4%, a minimum IL of 1.5 dB, and an out-of-band rejection of 11 dB as seen in FIGS. 37B-37C below. FIG. 37B is a graph illustrating a zoomed-in passband (S21) of the Design B filter according to an embodiment. FIG. 37C is a graph illustrating an in-band group delay of a Design B filter according to an embodiment.

FIG. 38A is a graph illustrating a measured performance (S-parameter) of a Design C filter according to an embodiment. Design C has the same filter layout and resonator structure as Design B. The only difference between B and C is that the thickness difference of the LiNbO₃ thin film between series and shunt resonators is increased to 38 nm to achieve a large frequency offset of over 400 MHz. Due to the large frequency offset, Design C shows a 3 dB FBW of 4.42% with a minimum IL of 2.8 dB, as seen in FIGS. 38B=38C below. Consistent with the above analyses, the self-inductances of the filter layout are insufficient to compensate for the lack of $k_t^2$ for such a wide passband, leading to a 1 dB ripple in the passband. FIG. 38B is a graph illustrating a zoomed-in passband (S21) of the Design C filter according to an embodiment. FIG. 38C is a graph illustrating an in-band group delay of a Design C filter according to an embodiment.

FIG. 39A is a graph illustrating a measured performance (S-parameter) of a Design D filter according to an embodiment. FIG. 39B is a graph illustrating a zoomed-in passband (S21) of the Design D filter according to an embodiment. FIG. 39C is a graph illustrating an in-band group delay of a Design D filter according to an embodiment. Design D is designed with a higher-order topology than other designs. To include the additional resonators, the footprint of Design D is increased to 1 mm². As shown in FIGS. 39A-39C, the fabricated Design D shows a 3 dB FBW of 2% (BW=170 MHz), a minimum IL of 2.5 dB, and an enhanced out-of-band rejection of 28 dB.

Although the responses of all designs are smooth, the minor spurious responses still can be identified in the zoomed-in in-band responses (S21 and group delay) of Design A. In contrast, other designs have clean responses. The in-band ripples are caused by the transverse spurious modes of the resonators. The different ripple responses are from the different resonator structures in designs. It validates that the release windows in the transverse directions can mitigate the transverse spurious modes. Additionally, Designs B and D feature lower IL than Design A, which validates the better energy confinement introduced by the extra release windows. The group delay variations over the passband of all these devices are less than 5 ns (e.g., see FIG. 36C, FIG. 37C, FIG. 38C, and FIG. 39C), which is sufficiently small to avoid RF signal distortion. The measured parameters of the fabricated filters are listed in Table 9.

TABLE 9

Comparison to State-of-the-Art X-band Filters

| Ref. | IL (dB) | OoB Rejection (dB) | FBW | Roll-off dB/MHz) | Footprint (mm²) |
|---|---|---|---|---|---|
| [6] | 1.7 | 21 | 3.1% | ~0.23 | ~0.1 |
| [7] | 8.5 | 17 | 1.8% | ~0.3 | ~0.1 |
| [25] | 3.8 | 25 | 4% | 0.062 | 1680 |
| [26] | 0.6 | 26 | 10% | ~0.2 | >3400 |
| Design A | 2.7 | 15 | 3.45% | 0.39 | 0.56 |
| Design B | 1.5 | 11 | 2.4% | 0.46 | 0.56 |
| Design C | 2.8 | 11 | 4.42% | 0.35 | 0.56 |
| Design D | 2.5 | 28 | 2% | 0.74 | 1 |

Table 9 compares both the state-of-the-art (SOA) acoustic and EM filters to four designs (Design A, B, C, and D) described herein. The conventional X-band acoustic filters are all based on BAW. Conventional SoA EM filters resort to cavities with low loss dielectric materials to achieve wide bandwidth and low IL. However, due to the orders of magnitude higher velocity of EM waves, the SoA EM filters feature a footprint of several thousand times larger. Additionally, the four designs feature sharper roll-off than SoA due to the high-Q of A3 LiNbO₃ resonators. The current demonstrations offer a combination of enhancements over SoA, particularly for handheld applications where size and performance are can be important.

The words "example" or "exemplary" are used herein to mean serving as an example, instance, or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims may generally be construed to mean "one or more" unless specified otherwise or clear from context to be directed to a singular form. Moreover, use of the term "an implementation" or "one implementation" or "an embodiment" or "one embodiment" or the like throughout is not intended to mean the same implementation or implementation unless described as such. One or more implementations or embodiments described herein may be combined in a particular implementation or embodiment. The terms "first," "second," "third," "fourth," etc. as used herein are meant as labels to distinguish among different elements and may not necessarily have an ordinal meaning according to their numerical designation.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. An apparatus comprising:
   a piezoelectric thin film suspended above a carrier substrate, wherein the piezoelectric thin film is adapted to propagate an acoustic wave in a Lamb mode excited by a component of an electric field that is oriented in a longitudinal direction along a length of the piezoelectric thin film;
   a first signal electrode disposed on the piezoelectric thin film and oriented in a transverse direction perpendicular to the longitudinal direction, the first signal electrode having a proximal end and a distal end;
   a first ground electrode disposed on the piezoelectric thin film and oriented in the transverse direction, the first ground electrode having a proximal end and a distal end;
   wherein the piezoelectric thin film comprises:
      a first release window located at a first end of the piezoelectric thin film;
      a second release window located at a second end of the piezoelectric thin film;
      a first intermittent release window located beyond and adjacent to the distal end of the first signal electrode, wherein the first intermittent release window is also adjacent to the proximal end of the first ground electrode; and
      a second intermittent release window located beyond and adjacent to the distal end of the first ground electrode, wherein the second intermittent release window is also adjacent to the proximal end of the first signal electrode.

2. The apparatus of claim 1, further comprising a plurality of signal electrodes, including the first signal electrode, alternated with a plurality of ground electrodes, including the first ground electrode, and wherein the piezoelectric thin film further comprises:
   a plurality of first intermittent release windows, including the first intermittent release window, located beyond and adjacent to the distal end of respective ones of the plurality of signal electrodes, wherein each first intermittent release window is also adjacent to the proximal end of at least one of the plurality of ground electrodes; and
   a plurality of second intermittent release windows, including the second intermittent release window, located beyond and adjacent to a distal end of respective ones of the plurality of ground electrodes, wherein each second intermittent release window is also adjacent to at least one of the plurality of signal electrodes.

3. The apparatus of claim 1, wherein the piezoelectric thin film comprises one of a Y-cut lithium niobate ($LiNbO_3$) thin film or a Y-cut lithium tantalate ($LiTaO_3$) thin film.

4. The apparatus of claim 3, wherein the Lamb mode is a first-order asymmetric (A1) mode.

5. The apparatus of claim 1, wherein the piezoelectric thin film comprises one of a Z-cut lithium niobate ($LiNbO_3$) thin film or a Z-cut lithium tantalate ($LiTaO_3$) thin film.

6. The apparatus of claim 5, wherein the Lamb mode comprises one of a first-order asymmetric (A1) mode, a third-order asymmetric (A3) mode, or a seventh-order asymmetric (A7) mode.

7. The apparatus of claim 1, wherein the first ground electrode is separated from the first signal electrode by a gap comprising a longitudinal distance and in which the acoustic wave resonates, and wherein the longitudinal distance is between approximately 1 microns (μm) and 30 μm.

8. The apparatus of claim 7, wherein the first signal electrode and the first ground electrode have a width, and a ratio of the width to the longitudinal distance is between approximately 0.25 and 7.5.

9. The apparatus of claim 7, wherein the apparatus is a series resonator and the longitudinal distance is less than a second longitudinal distance between a second signal electrode and a second ground electrode of a neighboring shunt resonator, to increase a resonant frequency of the series resonator compared to a resonant frequency of the neighboring shunt resonator.

10. The apparatus of claim 9, wherein the resonant frequency of the series resonator and an anti-resonant frequency of the neighboring shunt resonator are substantially equal.

11. An acoustic filter comprising:
    a first series resonator coupled with a ground potential;
    a first shunt resonator coupled in parallel with the first series resonator and to the ground potential; and
    a second shunt resonator coupled in parallel with the first series resonator and with the ground potential, wherein each of the first series resonator, the first shunt resonator, and the second shunt resonator comprises:
       a piezoelectric thin film suspended above a carrier substrate, wherein the piezoelectric thin film is adapted to propagate an acoustic wave in a Lamb mode excited by a component of an electric field that is oriented in a longitudinal direction along a length of the piezoelectric thin film;
       a first signal electrode disposed on the piezoelectric thin film and oriented in a transverse direction perpendicular to the longitudinal direction, the first signal electrode having a proximal end and a distal end;
       a first ground electrode disposed on the piezoelectric thin film and oriented in the transverse direction, the first ground electrode having a proximal end and a distal end;
       wherein the piezoelectric thin film comprises:
          a first release window located at a first end of the piezoelectric thin film;
          a second release window located at a second end of the piezoelectric thin film;
          a first intermittent release window located beyond and adjacent to the distal end of the first signal electrode, wherein the first intermittent release window is also adjacent to the proximal end of the first ground electrode; and
          a second intermittent release window located beyond and adjacent to the distal end of the first ground electrode, wherein the second intermittent release window is also adjacent to the proximal end of the first signal electrode.

12. The acoustic filter of claim 11, further comprising:
    a third shunt resonator coupled in parallel with the first series resonator, the first shunt resonator, and the ground potential; and
    a fourth shunt resonator coupled in parallel with the first series resonator, the second shunt resonator, and the ground potential.

13. The acoustic filter of claim 11, further comprising:
    a first inductor coupled in parallel with the first shunt resonator; and
    a second inductor coupled in parallel with the second shunt resonator.

14. The acoustic filter of claim 13, further comprising a third inductor coupled in parallel with the first series resonator.

15. The acoustic filter of claim 14, where the first inductor and the second inductor have a first diameter and a first length, and the third inductor has a second diameter and a second length, and wherein the first length is greater than the second length and the first diameter is substantially equal to the second diameter.

16. The acoustic filter of claim 11, wherein each of the first series resonator, the first shunt resonator, and the second shunt resonator comprises a plurality of signal electrodes, including the first signal electrode, alternated with a plurality of ground electrodes, including the first ground electrode, and wherein the piezoelectric thin film further comprises:
a plurality of first intermittent release windows, including the first intermittent release window, located beyond and adjacent to the distal end of respective ones of the plurality of signal electrodes, wherein each first intermittent release window is also adjacent to the proximal end of at least one of the plurality of ground electrodes; and
a plurality of second intermittent release windows, including the second intermittent release window, located beyond and adjacent to a distal end of respective ones of the plurality of ground electrodes, wherein each second intermittent release window is also adjacent to at least one of the plurality of signal electrodes.

17. The acoustic filter of claim 11, wherein the piezoelectric thin film is one of a Y-cut lithium niobate (LiNbO$_3$) thin film or a Y-cut lithium tantalate (LiTaO$_3$) thin film.

18. The acoustic filter of claim 17, wherein the Lamb mode is a first-order asymmetric (A1) mode.

19. The acoustic filter of claim 11, wherein the piezoelectric thin film is one of a Z-cut lithium niobate (LiNbO$_3$) thin film or a Z-cut lithium tantalate (LiTaO$_3$) thin film.

20. The acoustic filter of claim 19, wherein the Lamb mode is one of a first-order asymmetric (A1) mode, a third-order asymmetric (A3) mode, or a seventh-order asymmetric (A7) mode.

21. The acoustic filter of claim 11, wherein the first ground electrode is separated from the first signal electrode by a gap comprising a longitudinal distance and in which the acoustic wave resonates, and wherein the longitudinal distance is between approximately 1 microns (μm) and 30 μm.

22. The acoustic filter of claim 21, wherein the first signal electrode and the first ground electrode have a width, and a ratio of the width to the longitudinal distance is between approximately 0.25 and 7.5.

23. The acoustic filter of claim 21, wherein the longitudinal distance of the series resonator is less than a second longitudinal distance between the first signal electrode and the first ground electrode of one of the first shunt resonator or the second shunt resonator, to increase a resonant frequency of the series resonator compared to a resonant frequency of the one of the first shunt resonator or the second shunt resonator.

24. The acoustic filter of claim 23, wherein the resonant frequency of the series resonator is substantially equal to an anti-resonant frequency of the one of the first shunt resonator or the second shunt resonator.

* * * * *